United States Patent [19]
Ooishi

[11] Patent Number: 6,084,818
[45] Date of Patent: Jul. 4, 2000

[54] SEMICONDUCTOR MEMORY DEVICE CAPABLE OF EFFICIENT MEMORY CELL SELECT OPERATION WITH REDUCED ELEMENT COUNT

[75] Inventor: Tsukasa Ooishi, Hyogo, Japan

[73] Assignee: Mitsubishi Denki Kabushiki Kaisha, Tokyo, Japan

[21] Appl. No.: 09/283,247

[22] Filed: Apr. 1, 1999

[30] Foreign Application Priority Data

Oct. 30, 1998 [JP] Japan .................................. 10-311199

[51] Int. Cl.[7] ................................ G11C 8/00; G11C 7/00
[52] U.S. Cl. ................................. 365/230.03; 365/230.06; 365/203
[58] Field of Search ........................ 365/230.03, 230.06, 365/203

[56] References Cited

U.S. PATENT DOCUMENTS

| | | | |
|---|---|---|---|
| 4,984,204 | 1/1991 | Sato et al. ................................. | 365/203 |
| 5,386,387 | 1/1995 | Tanizaki ................................. | 365/200 |
| 5,652,731 | 7/1997 | Saeki ................................. | 365/230.06 |
| 5,946,243 | 8/1999 | Sim ................................. | 365/230.06 |

FOREIGN PATENT DOCUMENTS

| | | |
|---|---|---|
| 5-282894 | 10/1993 | Japan . |
| 6-076596 | 3/1994 | Japan . |

*Primary Examiner*—Trong Phan
*Attorney, Agent, or Firm*—McDermott, Will & Emery

[57] ABSTRACT

Four subordinate word lines are driven for a single main word line. In a subordinate word driver circuit, a bank select line activated allows a potential level of a main word line to be transmitted to an internal node via a first transistor. Simultaneously, a select line is also active and a potential level of the internal node is transmitted to a subordinate word line via a second transistor. A bank select line is inactivated and the select line is then further boosted to a boosted potential so that it is driven to a boosted potential of a potential level of the subordinate word line.

9 Claims, 44 Drawing Sheets

CDD COLUMN DECODE DRIVER

CSD CDD

SEMICONDUCTOR MEMORY DEVICE CAPABLE OF EFFICIENT MEMORY CELL SELECT OPERATION WITH REDUCED ELEMENT COUNT

BACKGROUND OF THE INVENTION

1. Field of the Invention

The present invention relates to semiconductor memory devices and particular to configurations of a memory cell select circuit and those of a redundant circuit thereof.

2. Description of the Background Art

In recent years, as microprocessors (MPUs) are improved in operating speed, there has been used synchronous DRAM (SDRAM) operating in synchronization with a clock signal to achieve rapid access e.g. of a dynamic random access memory (DRAM) used as a main memory device.

Internal operation of such an SDRAM and the like is divided into row- and column-related operations for control.

The SDRAM and the like also employ a bank configuration, the memory cell array divided into banks each capable of independent operation, to achieve further rapid operation. More specifically, for each bank, the operation is controlled independently with respect to the row- and column-related operations.

Typically, a word line is hierarchically configured by main and subordinate word lines to reduce the load to be driven by a drive circuit to provide for rapid operation in the operation of selecting a row of the memory cell array or a word line in the row-related operation.

In semiconductor memory devices such as an SDRAM and the like having a conventional multibank configuration, however, the hierarchical configuration described above disadvantageously results in an increased number of the elements required for selecting a subordinate word line.

Furthermore, in recent years a memory circuit and a logic circuit are integrated on a single chip to provide e.g. chips on which a DRAM and a logic circuit are mounted mixedly for the purpose of achieving multifunction, improving data processing speed and the like. For this type of chips, the data bus width for communicating data between a storage device such as a DRAM and a logic circuit that are integrated on a single chip, i.e., the number of bits of data communicated at one time, tends to be increased to provide rapid process.

Furthermore, an input/output line (an I/O line pair) transmitting data read from a memory cell to an interface circuit is often configured hierarchically in view of enhancement of operating speed and the like. To transmit data from a memory cell via the hierarchical I/O line pair, a gate circuit is provided therebetween for selectively connecting a bit line pair connected to the memory cell selected in a read operation and the I/O line pair communicating the data. For multibank, memory cell arrays, such a gate circuit also tends to be increased in the number of elements used therefor. Particularly, inputting and outputting data on a bus with such a large bus width as described above requires an increased number of independently operable I/O line pairs. This also increases the number of the gate circuits described above and hence the number of elements configuring the gate circuits.

SUMMARY OF THE INVENTION

An object of the present invention is to provide a semiconductor memory device with a memory cell array capable of efficient select operation with reduced number of the elements of a circuit for selecting a memory cell in the memory cell array.

Another object of the present invention is to provide a semiconductor memory device with a memory cell array configuration capable of reducing the number of elements used for a data communication path for reading data.

The present invention is a semiconductor memory device including a memory cell array, a plurality of main word lines, a plurality of subordinate word lines, a main row select circuit, a subordinate row select circuit, a block select circuit, a plurality of block select lines, and a plurality of drive circuits.

The memory cell array has a plurality of memory cells arranged in rows and columns. The memory cell array is divided into a plurality of memory cell blocks in rows and columns.

The plurality of main word lines are arranged in the direction of the rows of the memory cell array, shared by a plurality of memory cell blocks arranged in the direction of the rows of the memory cell array. The plurality of subordinate word lines correspond to respective rows of memory cells in the memory cell blocks such that a first plurality of the plurality of subordinate word lines are provided for each main word line. The main row select circuit is provided for the memory cell array and selectively activates a main word line in response to an address signal. The subordinate row select circuit is provided for the memory cell array, indicating which subordinate word line is activated out of the first plurality of subordinate word lines in response to an address signal. The block select circuit responds to an address signal to indicate which memory cell block has been selected. The plurality of block select lines are activated in response to an indication of block selection from the block select circuit.

The plurality of drive circuits are each provided for a subordinate word line, driving a potential of the associated subordinate word line in response to an indication from the subordinate row select circuit and activation of the associated block select line and activation of the associated main word line.

Each drive circuit includes a first switch circuit transmitting a potential level from a main word line in response to activation of a block select line, and a hold circuit activated in response to an output level of the switch circuit and an indication from the subordinate row select circuit to hold selection-indicating information for an associated subordinate word line and drive a potential of the associated subordinate word line.

The main row select circuit and the block select circuit reset a level of a main word line and a level of a block select line after the selection indicating information is completely transmitted to the hold circuit.

In another aspect of the present invention, a semiconductor memory device includes a memory cell array, a row select circuit, a block select circuit, a plurality of redundant memory cell blocks, and a redundancy determination circuit.

The memory cell array has a plurality of memory cells arranged in rows and columns. The memory cell array is divided into a plurality of memory cell blocks in rows and columns.

The row select circuit is provided for the memory cell array, selecting a row of memory cells in response to an address signal. The block select circuit responds to an address signal to indicate which memory cell block has been selected.

The plurality of redundant memory cell blocks are provided independently of the memory cell blocks. The redundancy determination circuit previously stores a memory cell block and address at which a defective memory cell is located and the redundancy determination circuit selects a redundant memory cell within a redundant memory cell block when a memory cell designated according to an address signal corresponds to the defective memory cell.

In accordance with the present invention, the memory cell array can be advantageously divided and thus operated to reduce electricity consumption. Furthermore, the divided memory cell blocks arranged in rows and columns can enhance the degree of freedom in circuit configuration when multibit data are communicated concurrently.

Still advantageously, in accordance with the present invention a redundant memory cell in the redundant memory cell blocks provided independently of the memory cell array can be substituted for a defective memory cell to enhance the efficiency with which the redundant memory cell is substituted for the defective memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
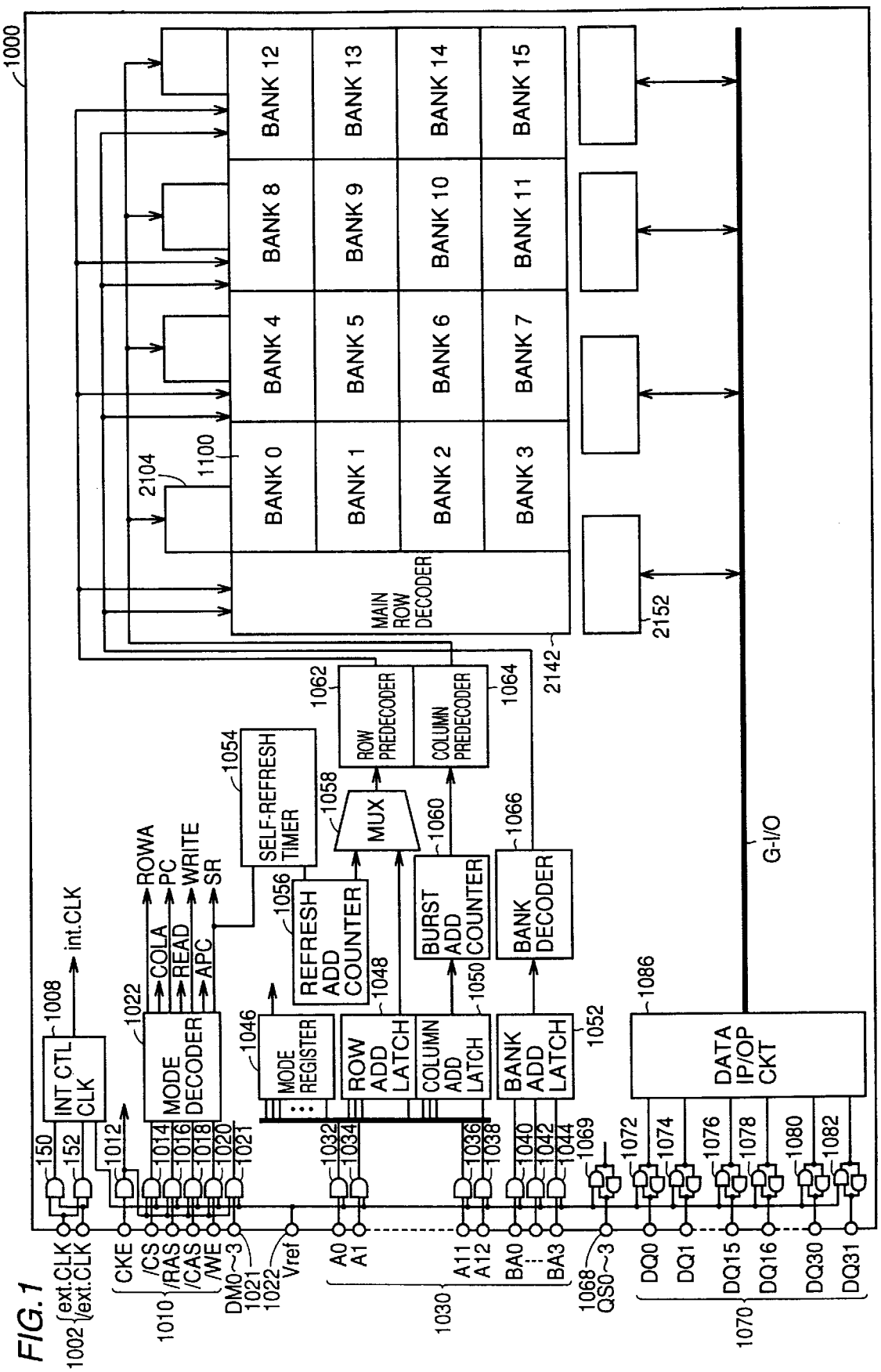
FIG. 1 is a schematic block diagram showing a configuration of a semiconductor memory device 1000 according to a first embodiment of the present invention.

FIG. 1 is a schematic block diagram showing a configuration of a synchronous semiconductor memory device 1000 according to a first embodiment of the present invention. It should be noted that, as will be described below, the present invention is not limited to such a synchronous semiconductor memory device and is applicable to general configuration of semiconductor memory device memory cell array.

Referring to FIG. 1, an SDRAM 1000 includes an external clock signal input terminal 1002 receiving externally applied, complementary clock signals EXT.CLK and EXT.CLK, clock input buffers 150, 152 buffering the clock signals input to external clock terminal 1002, an internal control clock signal generation circuit 1008 receiving outputs from clock buffers 150, 152 to generate an internal clock signal INT.CLK, and a mode decoder 1022 receiving an external control signal from an external control signal input terminal 1010 via input buffers 1012 to 1020 operating in response to internal clock signal INT.CLK.

Internal control signal input terminal 1010 receives a signal CKE, a chip select signal /CS, a row address strobe signal /RAS, a column address strobe signal /CAS, a write control signal /WE, and data mask signals DM0 to DM3.

Signal CKE is a signal for indicating that inputting a control signal to a chip is enabled. When the signal is inactive, inputting a control signal is not permitted and SDRAM 1000 does not operate.

Signal /CS is a signal for determining whether a command signal has been input. With this signal active (low), at a rising edge of a clock signal a command is determined depending on a combination of levels of other control signals.

Signal /RAS is a signal indicative of operation of a row-related circuit and signal /CAS instructs that operation of a column-related circuit be activated. Signal /WE is a signal for distinguishing between write and read operations.

Signals DM0 to DM3 are signals indicative of operation masking data communication with respect to data input/output terminals DQ0–DQ7, DQ8–DQ15, DQ16–DQ23, DQ24–DQ31, respectively.

Mode decoder 1022 responds to the external control signals to output an internal control signal for controlling operation of an internal circuit of SDRAM 1000. Mode decoder 1022 outputs e.g. signals ROWA, COLA, ACD, PC, READ, WRITE, APC, SR, as internal control signals. Signal ROWA indicates that row-related access is performed. Signal COLA indicates that column-related access is performed. Signal ACT indicates that a word line is activated.

Signal PC instructs precharge operation to indicate that operation of the row-related circuit is completed. Signal READ instructs the column related circuit to perform read operation. Signal WRITE instructs the column-related circuit to perform write operation.

Signal APC indicates auto-precharge operation. When auto-precharge operation is designated, simultaneously with completion of a burst cycle a precharge operation is started automatically. Signal SR indicates self-refresh operation. When self-refresh operation is started a self-refresh timer operates, and when a predetermined period of time has elapsed since the initiation of the timer operation a word line is activated to start refresh operation.

SDRAM 1000 also includes a self-refresh timer 1054. Timer 1054 starts to operate when signal SR designates a self-refresh mode. When a predetermined period of time has elapsed since the initiation of the timer operation, timer 1054 instructs that a word line be activated or refresh operation be started. SDRAM 1000 also includes a refresh counter 1056 for generating an address for performing a refresh operation according to an indication from self-refresh timer 1054.

SDRAM 1000 also includes a reference potential input terminal 1022 receiving a signal VREF serving as a reference for determining whether an input signal is a high level signal or a low level signal, a mode register 1046 responsive to an address signal applied via address signal input terminal 1030 and a combination of the above-described external control signals for holding information on a predetermined mode of operation, such as information on data for burst length, information on which one of single and double data rate operations has been designated, a row address latch 1048 receiving an address signal via address signal input buffers 1032–1038 operating in response to internal clock signal INT.CLK and holding an input row address at row-address input timing, a column address latch 1050 receiving address signals A0–A12 and holding a column address at a timing at which the column address is input, a multiplexer 1058 receiving an output from refresh address counter 1056 and an output from row address latch 1048 and selectively outputting the output from row address latch 1048 in normal operation and the output from refresh address counter 1056 in self-refresh operation, a row predecoder 1062 receiving an output from multiplexer 1058 to predecode a row address, a burst address counter 1060 referring to a column address held in column address latch 1050 to generate an internal column address depending on burst-length data from mode register 1046, a column predecoder 1064 receiving an output from burst address counter 1060 to predecode a corresponding column address, a bank address latch 1052 receiving bank addresses BA0–BA3 from an address input terminal via input buffers 1040–1044 operating in response to internal clock signal INT.CLK, and holding a bank address value designated, and a bank decoder 1066 receiving an output from bank address latch 1052 to decode a bank address.

Bank address signals BA0–BA3 indicate an accessed bank in each of row-related access and column-related access. More specifically, in each of row- and column-related accesses, bank address signals BA0–BA3 input to address signal input terminal 1030 are initially taken into bank address latch 1052 and then decoded by bank decoder 1066 before they are transmitted to each memory array block (or bank).

SDRAM 1000 also includes a memory cell array 1100 including memory array blocks operating as banks 0 to 15 each as a unit capable of read/write operation independently, a main row decoder 2142 responsive to an output from bank decoder 1066 and an output from row predecoder 1062 for selecting a row (or word line) in a corresponding bank, a main column decoder 2104 responsive to an output from column predecoder 1064 for selecting a column (or bit line pair) in a corresponding bank, an I/O port 2152 supplying data read from a selected memory cell of a selected bank to a global I/O bus G-I/O in read operation and supplying write data transmitted from bus G-I/O to a corresponding bank in write operation, a data input/output circuit 1086 holding externally applied write data and supplying the write data to bus G-I/O in write operation and holding read data transmitted from bus G-I/O in read operation, and bidirectional input/output buffers 1072–1082 for communicating input/output data DQ0–DQ31 between data input/output circuit 1086 and data input/output terminal 1070.

In memory cell array 1100, banks 0 to 15 are arranged in four rows and four columns. It should be noted that the arrangement of the banks is not limited as described above and more banks may be arranged. More specifically, banks may be arranged in a matrix of the mxn, wherein m and n each represent a natural number.

Figure 2:
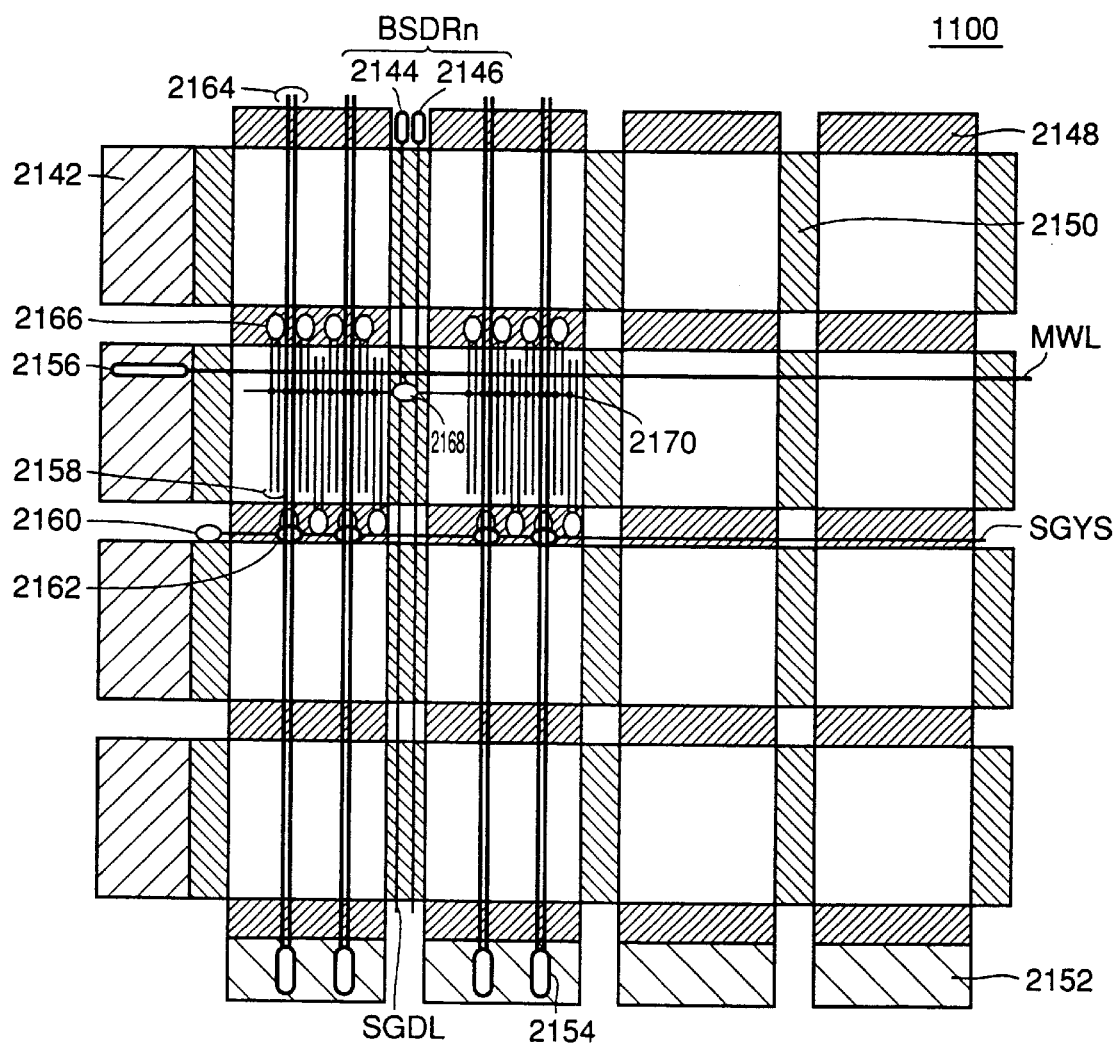
FIG. 2 is a schematic block diagram showing a configuration of a memory cell array.

FIG. 2 is a schematic block diagram for illustrating in detail a configuration of the FIG. 1 memory cell array 1100.

Referring to FIG. 2, memory cell array 1100 is divided into memory cell array units (or banks) surrounded by sense amplifier band and subordinate word line driver band. Memory cell array 1100 is activated for each memory cell array unit.

A main word line MWL is provided across memory cell array units, activating a subordinate word driver SWD required to be activated. When subordinate word driver SWD is activated, the associated subordinate word line SWL is responsively activated. Sense amplifiers are alternately arranged such that they sandwich memory cell array units.

Also, a sense amplifier is activated which belongs to a region at which a select line for a region (or bank) to be activated and a sense select line cross.

Along the direction of word lines of memory cell array units, a segment YS line traverses a sense amplifier band.

In reading data from a memory cell array unit, segment YS line SGYS activated allows activation of a region (or a bank) at which segment YS line SGYS and a bank select line activated cross. From the activated region (or bank), one data is read e.g. for four sense amplifiers.

The read data is transmitted to a read/write amplifier (referred to as an R/W amplifier hereinafter) 2154 via a data line pair running on the memory cell array in a direction orthogonal to word lines.

Then via a peripheral circuit, a data bus region and the like, the read data is transmitted to a data output portion. For a chip on which memory and logic are mounted mixedly, data is transmitted to a logic portion via a data bus region.

More specifically, memory cell array 1100 has memory mats (or banks) arranged in four rows and four columns. For each row is provided a group of main word drivers included in a main row decoder 2142, and for each column is provided an I/O selector 2152. Each memory mat (or bank) is provided with a sense amplifier band 2148 and a subordinate word driver band 2150.

Row-related select operation will first be described. In response to a row address signal, a main word driver 2156 selectively activates main word line MWL. Also an SD driver 2144 activates a segment decode line SGDL (including a bank select line BSL and a select line SL, and a reset line RSL). By main word line MWL and segment decode line SGDL an associated subordinate word driver 2168 is activated and responsively a subordinate word line 2170 is activated and an access transistor connected to a selected memory cell is turned on. It should be noted that select line SL corresponds to four select lines SL0–SL3 collectively.

It should also be noted that reset line RSL corresponds to four reset lines RSL0–RSL3 collectively.

Responsively, data is output on a bit line pair 2158 provided for a selected column of memory cells.

Select operation in the column direction will now be described. A segment YS driver 2160 activates segment YS line SGYS. It should be noted that segment YS lines SGYS includes four read source lines RGL0–RGL3 and four write activation lines WRL0–WRL3. The activated SGYS line allows a selectively associated I/O gate 2162 to be activated so that one of the signals output from four sense amplifiers is thus output externally via an I/O line 2164.

It should be noted read source lines RGL0–RGL3 are collectively referred to as a read source line RGL and write activation lines WRL0–WRL3 are collectively referred to as a write activation line WRL.

Figure 3:
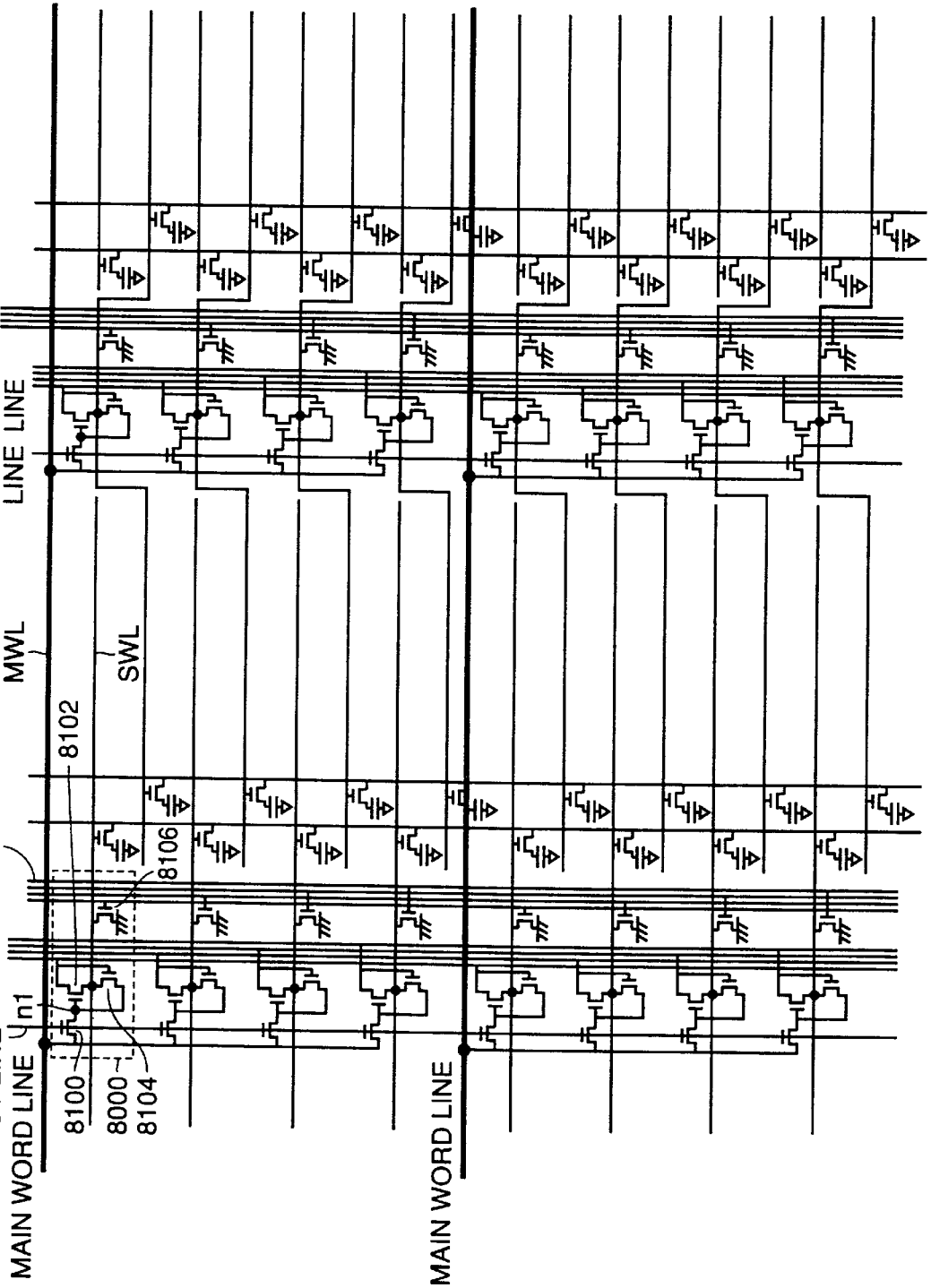
FIG. 3 is a circuit diagram for illustrating a detailed configuration of a subordinate word driver band BSDRn.

FIG. 3 is a diagram for showing a detailed configuration of the FIG. 2 subordinate word driver band BSDRn.

A driver circuit 8000 includes a select transistor 8100 having its gate controlled by bank select line BSL and provided between a main word line and an internal node N1, a transistor 8102 having its gate connected to node n1 and connected between one select line SL0 of select line SL and subordinate word line SWL, and a transistor 8104 having its gate potential controlled by the same select line SL0 as transistor 8102 and connected between subordinate word line SWL and node n1. A driver circuit 8000 also includes a transistor 8106 having its gate potential controlled by reset line RSL0 and provided between a subordinate word line and ground potential.

Other main and subordinate word lines are configured similarly.

With this configuration, main word line MWL activated and bank select line BSL activated and any of select lines SL activated allow word line SWL to be activated (or attain high potential) and reset line RSL selectively activated allows associated subordinate word line SWL to be discharged to ground potential.

In the FIG. 3 example, a single main word line MWL controls four subordinate word lines SWL in each bank and which one of subordinate word lines SWL is selected is designated depending on the activation of one of select lines SL.

Bank select line BSL attains the level of a boosted potential Vpp when it is activated, and transitions to the level of a ground potential Vss when subordinate word line SWL is activated, while a latch circuit configured by transistors 8102 and 8104 holds the active state of bank select line BSL. The potential level of select line SL and that of reset line RSL are controlled to be complementary to each other.

For standby operation, bank select line BSL is held at the ground potential (GND) level, select line SL at the ground potential (GND) level, and reset line RSL at the power supply potential (Vcc) level.

For activation operation, an associated reset line is initially set to ground potential (GND) and bank select line BSL corresponding to subordinate word line SWL to be activated is activated so that the potential level is equal to the boosted potential Vpp level.

Main word line MWL is then activated to the power supply potential (Vcc) level. Almost simultaneously with the activation of main word line MWL, one of select lines SL attains the power supply potential (Vcc) level and subordinate word line SWL attains a level of Vcc minus Vth. Bank select line BSL then transitions to the ground potential (GND) level and electrical charge is thus confined in a latch circuit in a driver circuit 8000.

With the electrical charge confined by transistors 8102 and 8104, when the potential level of the selected one of select lines SL is boosted to the boosted potential (Vpp) level the level of subordinate word line SWL can change until it reaches the boosted potential (Vpp) level.

For reset operation, the potential level of the bank select line is increased to the power supply potential (Vcc) level and select line SL is set to the ground potential (GND) level. Also, a reset line is set to the power supply potential (Vcc) level to discharge the electrical charge stored in subordinate word line SWL.

With this configuration, subordinate word line driver 8000 can be configured only by four n-channel MOS transistors and thus reduced in the number of the elements configuring the same.

As will be described hereinafter, activation of a main word line is provided as a one-shot pulse signal. More specifically, once transistors 8102 and 8104 in subordinate word driver 8000 associated with a selected subordinate word line hold an active state of a main word line, the potential level of the main word line is reset. With this configuration, if a plurality of banks are arranged in the direction of the main word line, as shown in FIG. 2, the potential level of the main word line does not affect subordinate word driver 8000, as long as bank select line BSL is not activated. Thus, two banks adjacent to each other in the row direction as shown in FIG. 2 can be operated independently.

Figure 4:
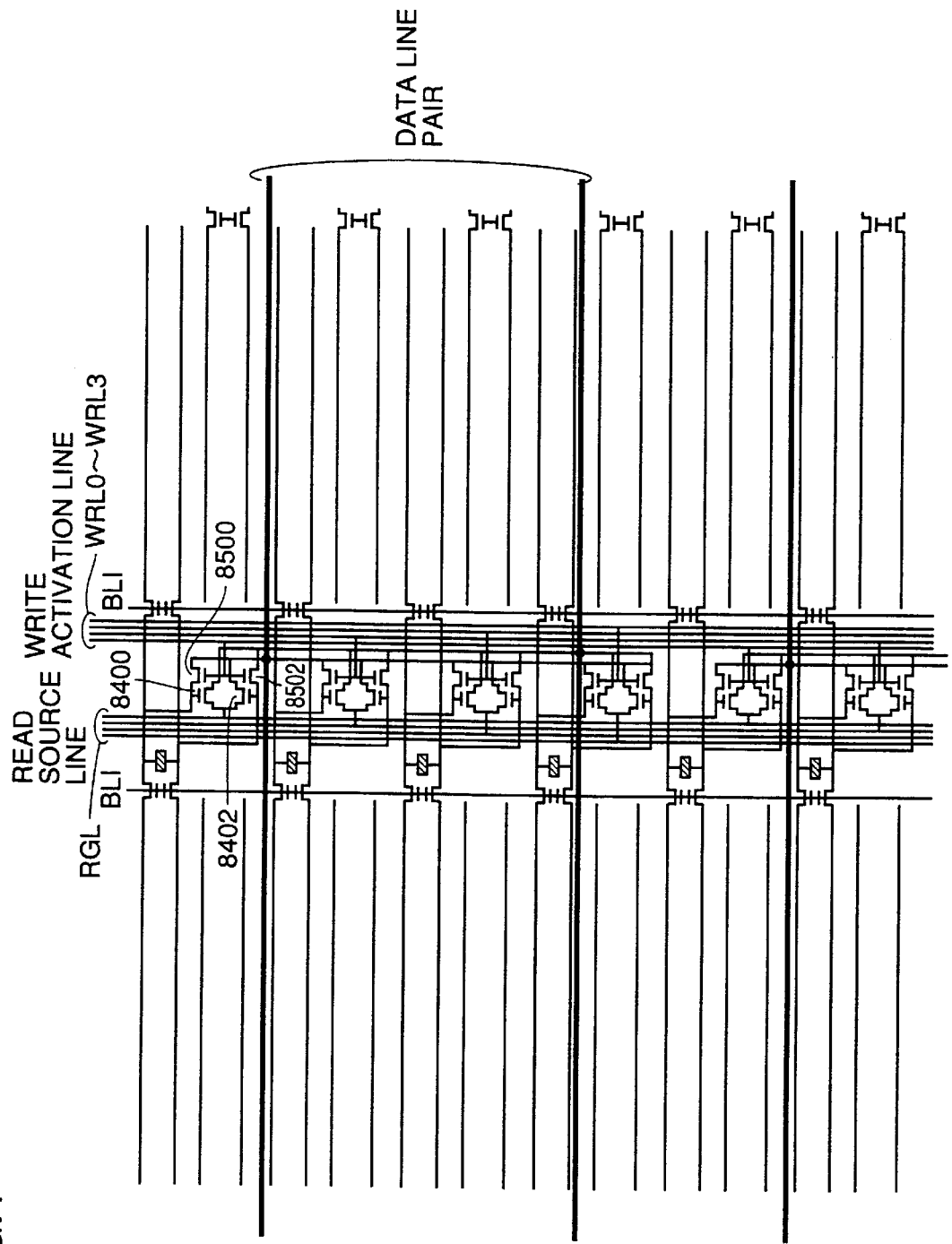
FIG. 4 is circuit diagram showing a configuration connecting a sense amplifier portion and a data line portion together.

FIG. 4 is a circuit diagram showing a configuration providing a connection between a sense amplifier portion and a data line portion.

An input/output node of a sense amplifier is such configured that a data signal is transmitted via gate-receiving transistors 8400 and 8402 and a pair of data lines DL and /DL.

More specifically, transistors 8400 and 8402 have their respective sources set by read source line RGL to a ground potential selectively, their respective gates each connected to a respective sense amplifiers S/A at a respective input/output node, and the respective drains each connected to a respective pair of data lines DL and /DL.

According to the FIG. 4 configuration, four sense amplifiers share a single pair of data lines DL and /DL.

The pair of data lines DL and /DL in write operation are selectively connected by transistors 8500 and 8502 respectively connected between an associated bit line BL and data line DL and between bit line /BL and an associated data line /DL.

More specifically, the input/output nodes of sense amplifiers S/A0 to S/A3 respectively associated with pairs of bit lines BL0 and /BL0 to BL3 and /BL3 are selectively connected to the pair of data lines DL and /DL by transistors 8500 and 8502 having gate potential controlled by the respective write activation line WRL0 to WRL3.

The FIG. 2 segment YS includes read source line RGL (referring to read source lines RGL0–RGL3 collectively), write activation line WRL (referring to write activation lines WRL0–WRL3 collectively), and the like, as has been described above.

With the configurations described above, in data read operation the pair of data lines DL and /DL and an input/output node of an associated sense amplifier are not connected together directly and the transistors 8400 and 8402 gates driven depending on a potential level of the input/output node of the sense amplifier allow the level of data line pair DL and /DL to be changed. Thus, if selecting a memory cell column in response to a column address signal, i.e., an operation of selecting any of read source lines RGL0–RGL3 and an amplification operation by a sense amplifier overlap or the select operation anticipates the amplification operation, read operation can be performed without data destruction.

This means that read operation can rapidly be performed as described above. Furthermore, sense amplifier activation is only required for each limited region. Thus, the peak value of operating current can be reduced to obtain such effects as reduction in power consumption, noise reduction and the like.

Figure 5:
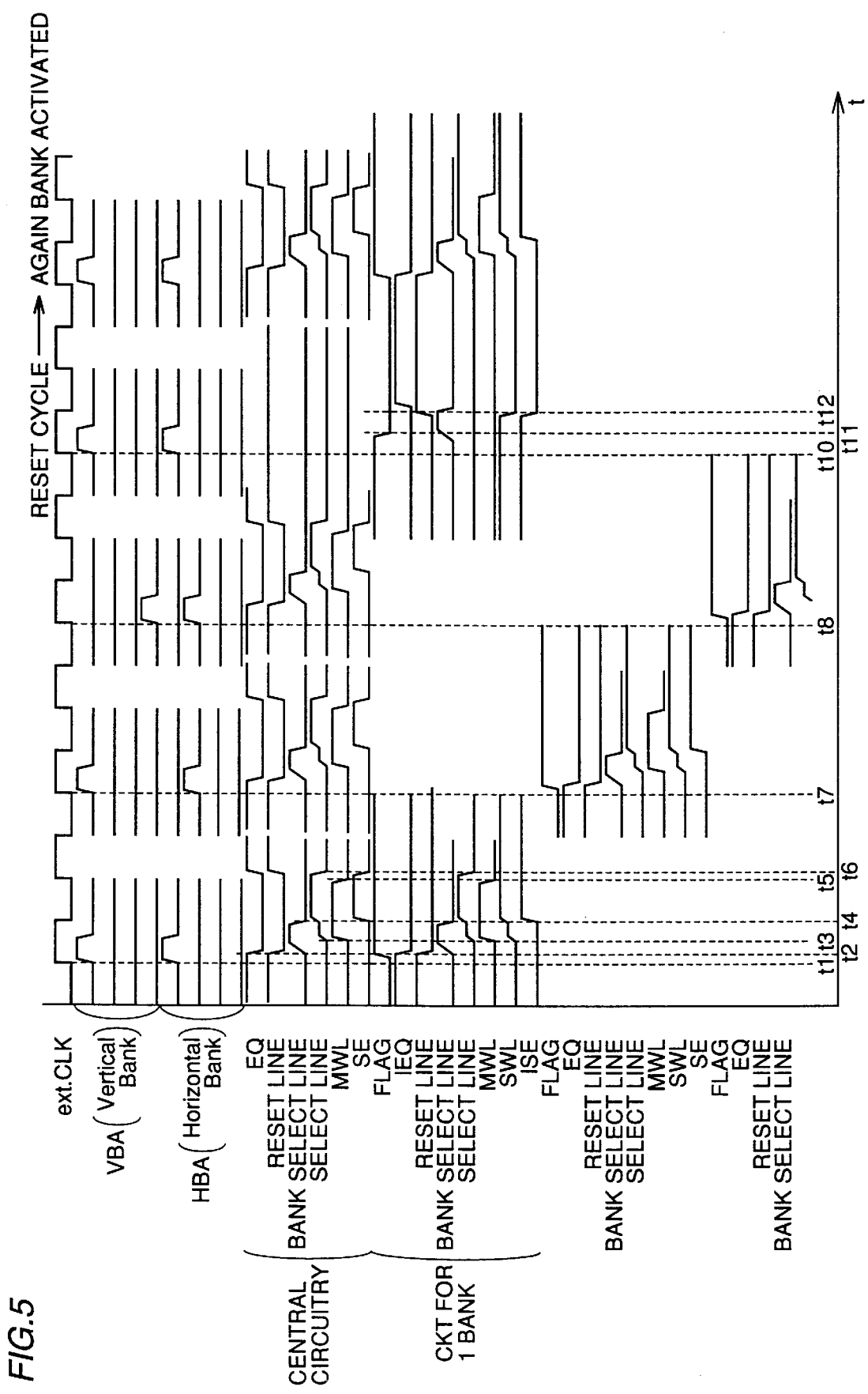
FIG. 5 is a timing diagram for illustrating an operation of the semiconductor memory device according to the first embodiment.

FIG. 5 is a timing diagram for representing an operation of the SDRAM 1000 described above.

Referring to FIG. 5, at the activation edge of external clock signal EXT.CLK at time t1 are provided address signals VBA and HBA in vertical and horizontal directions, respectively, of the banks arranged in four by four as shown in FIG. 2.

Responsively, at time t2, bank select line BSL is activated as a one-shot signal in response to bank address signal HBA in the horizontal direction and segment YS line SGYS is activated in response to bank address VBA in the vertical direction, and a signal FLAG is activated in a local control circuit provided for each bank, indicating that a selected bank is activated. When bank select line BSL is activated, transistor 8110 is responsively turned on.

Furthermore at time t2 an equalization signal EQ indicative of operation equalizing paired bit lines, paired I/O lines and the like, and reset signal RSL for resetting the level of a subordinate word line are inactivated low.

At time t3, in response to a row address signal, main word line MWL is selectively activated to power supply voltage Vcc, and almost simultaneously one of select lines SL is selectively activated to the Vcc level.

At time t4, bank select line BSL attains an inactive level (a GND level) while select line SL is driven to the boosted potential Vpp level. Responsively, selected subordinate word line SWL is also driven to the boosted-potential level.

At time t4, sense amplifier activation signal SE is also activated to amplify data read from a memory cell connected to selected subordinate word line SWL.

At time t5 main word line MWL is inactivated and at time t6 select line SL is inactivated, while selected subordinate word line SWL is maintained at the active level (the Vpp level).

While sense amplifier activation signal SE from the outside of cell array 1100 is inactivated at time t6, sense amplifier activation signal lSE remains active in a selected bank.

At the activation edge of external clock signal EXT.CLK at time t7 are applied vertical and horizontal address signals VBA and HBA of the banks arranged 4 by 4 that are different from those applied at time t1. Thereafter for the selected bank a series of operations similar to those performed from times t1 to t6 are performed to provide read operation.

Furthermore, at the activation edge of external clock signal EXT.CLK at time t8 are applied vertical and horizontal address signals VBA and HBA of the bank arranged in 4 by 4 that are different from those applied at times t1 and t7. Thereafter for the selected bank a series of operations similar to those performed from times t1 to t6 are provided to perform read operation.

At time t10, vertical and horizontal address signals VBA and HBA are applied to designate a bank subjected to a reset operation. Responsively, bank select line BSL selected is activated at time t11 and flag signal FLAG indicative of bank activation is also inactivated.

Then, when reset line RSL attains an active level at time t12, subordinate word line SWL responsively attains an inactive level. Meanwhile, the sense amplifier activation signal is inactivated and equalization signal EQ is then activated to complete the reset operation.

Thereafter, again in response to an external bank address signal a bank is selected and activated.

The configuration as described above can reduce the number of transistors configuring a subordinate word driver, with a memory cell array divided into memory cell array units arranged in row and column directions and operating as banks and with word lines operating hierarchically.

Second Embodiment

Figure 6:
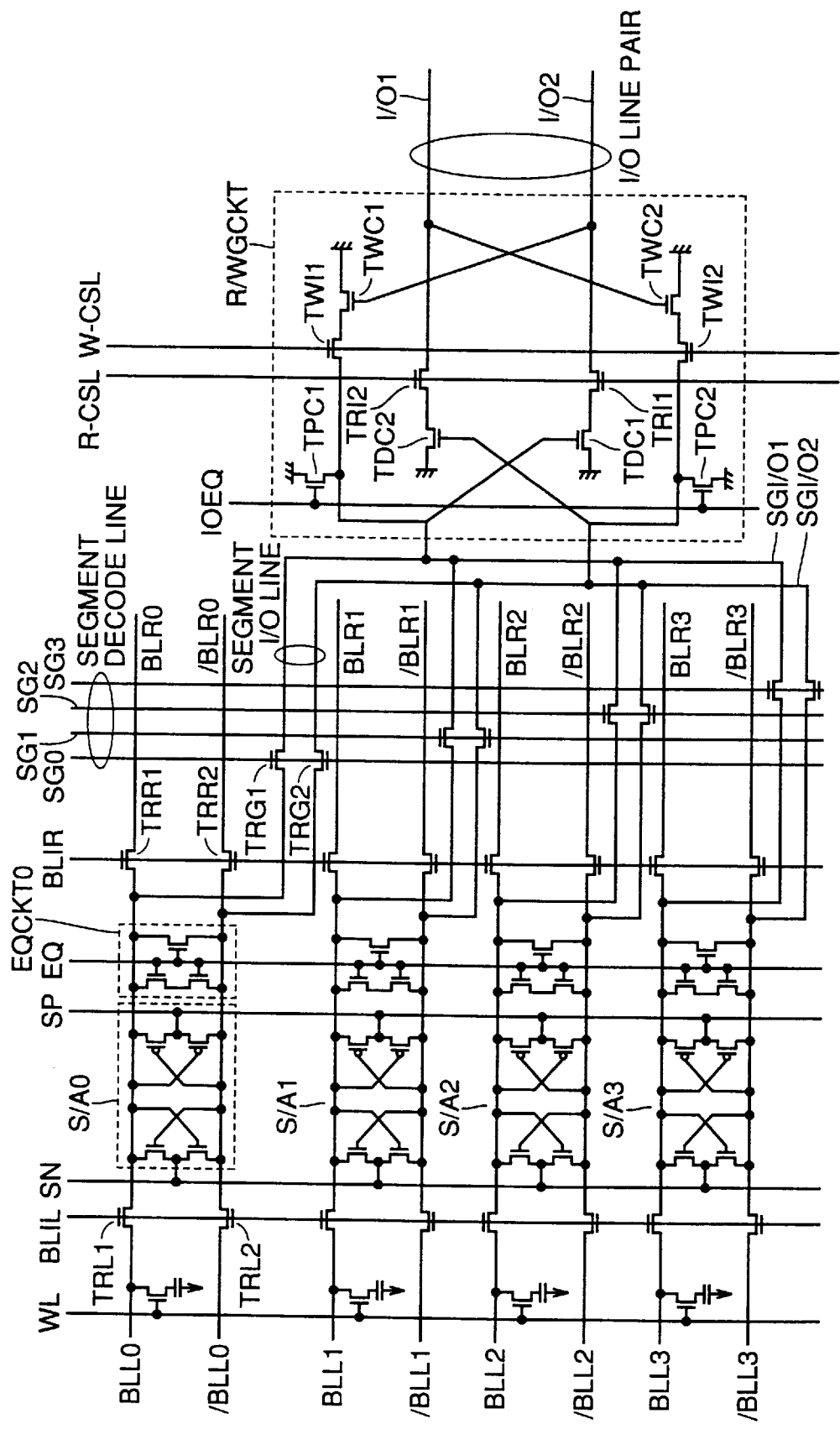
FIG. 6 is a circuit diagram showing a configuration connecting together a sense amplifier portion and data line portion of a semiconductor memory device according to a second embodiment.

FIG. 6 is a circuit diagram showing a configuration connecting together a sense amplifier portion and data line portion of a semiconductor memory device according to a second embodiment of the present invention, compared with the first embodiment of FIG. 4.

In FIG. 6, eight pairs of bit lines BLL0 and /BLL0 to BLL3 and /BLL3 and BLR0 and /BLR0 to BLR3 and /BLR3 share a single I/O line pair, although the present invention is not limited to this configuration and more bit line pairs may share a single I/O line pair.

In FIG. 6, a sense amplifier S/A0 and an equalization circuit EQCKT0 are shared by a pair of bit lines BLL0 and /BLL0 on the left side and a pair of bit lines BLR0 and /BLR0 on the right side. Sense amplifier S/A0 and equalization circuit EQCKT0 are selectively coupled with the pair of bit lines BLL0 and /BLL0 via transistors TRL10 and TRL20 controlled by a signal BLIL, and sense amplifier S/A0 and equalization circuit EQCKT0 are selectively coupled with the pair of bit lines BLR0 and /BLR0 via transistors TRR10 and TRR20 controlled by a signal BLIR.

A sense node of sense amplifier S/A0 is coupled with a segment I/O line pair SGI/O via transistors TRG1 and TRG2 each controlled by segment decode line SG0.

Data on segment I/O line pair SGI/O is selectively transmitted to an I/O line pair via a read/write gate R/WCKT.

Read/write gate R/WCKT includes a transistor TDC1 having its gate connected to one segment I/O line SGI/O1 of the segment I/O line pair and having its source coupled with a ground potential GND, a transistor TDC2 having its gate connected to the other segment I/O line SGI/O2 of segment I/O line pair SGI/O and having its source coupled with ground potential GND, a transistor TRI1 provided between the transistor TDC1 drain and one I/O line I/O2 of the I/O line pair and having a gate potential controlled by a signal R-CSL, a transistor TRI2 provided between the transistor TDC2 drain and the other I/O line I/O1 of the I/O line pair and having a gate potential controlled by signal R-CSL, a transistor TWC2 having its gate connected to one I/O line I/O1 of the I/O line pair and having its source coupled with ground potential GND, a transistor TWC1 having its gate connected to the other I/O line I/O2 of I/O line pair I/O and having its gate coupled with ground potential GND, a transistor TWI1 provided between the transistor TWC1 drain and segment I/O line SGI/O line I/O1 and having a gate potential controlled by a signal W-CSL, a transistor TWI2 provided between the transistor TWC2 drain and segment I/O line SGI/O2 and having a gate potential controlled by signal W-CSL, a transistor TPC1 provided between segment I/O line SGI/O1 and ground potential GND and having a gate potential controlled by an equalization signal IOEQ, and a transistor TPC2 provided between segment I/O line SGI/O2 and ground potential GND and having a gate potential controlled by equalization signal IOEQ.

Other pairs of bit lines BLL1 and /BLL1 and BLR1 and /BLR1 to BLL3 and IBLL3 and BLR3 and /BLR3 are provided with respective sense amplifiers, equalization circuits, gate transistors and the like similar to those for the pair of bit lines BLL0 and /BLL0.

Figure 7:
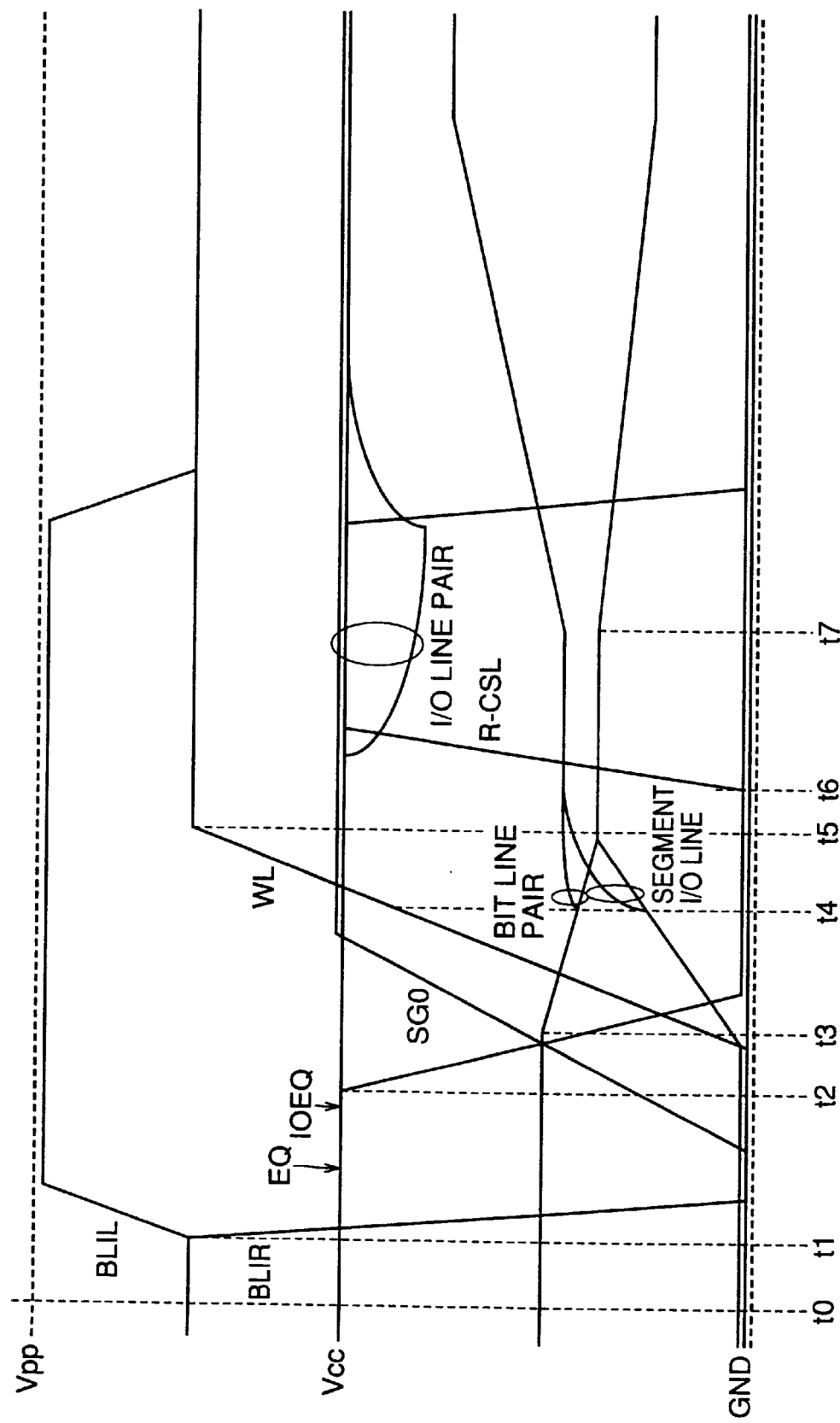
FIG. 7 is a timing diagram for illustrating a read operation of the FIG. 6 circuit.

FIG. 7 is a timing diagram for illustrating an operation of a circuit providing a connection of the sense amplifier portion and data portion represented in FIG. 6.

Referring to FIG. 6, in the standby state at time t0 a bit line pair is precharged to a level of 1/2 Vcc while segment I/O line pair SGI/O is precharged to the GND level in response to signal IOEQ activated high. Segment decode lines SG0–SG3 are all held at ground potential GND and transistors TRG1 and TRG2 for all bit line pairs are disconnected.

Signals BLIL and BLIR for opening and closing the connection between a bit line pair and sense amplifier S/A configuring a so-called shared sense amplifier are held at an intermediate potential (a potential intermediate between power supply potential Vcc and boosted potential Vpp).

The bit line equalization signal is active high and the I/O line pair is precharged to power supply potential Vcc.

It should be noted that signals BLIL and BLIR are held at the intermediate potential so as to reduce a potential applied to the gates of transistors TRL1, TRL2, TRR1 and TRR2 controlled by signals BLIL and BLIR. It should be noted, however, that they are set at an intermediate potential no less than power supply potential Vcc, since the potentials of the bit line pair are required to be equalized.

At time t1, signal BLIL transitions to boosted potential level Vpp and signal BLIR to ground potential GND to select left-side bit line pairs BLL0 and /BLL0 to BLL3 and /BLL3.

At time t2, equalization signals EQ and IOEQ start to transition toward ground potential GND. When at time t3 the level of segment decode line SG0 exceeds a threshold value of transistor TRG1, TRG2, the pair of bit lines BLL0 and /BLL0 and the pair of segment I/O lines SGI/O1 and SGIO/O2 are connected together so that potential level of the bit line pair drops below the precharge level of 1/2 Vcc while that of the segment I/O line pair starts to rise exceeding the precharge level or potential GND.

At time t4, when the difference between the potential level of the bit line pair and that of word line WL exceeds a threshold value of access transistor TA, a difference is caused between the potential level of bit line BLL0 and that of complementary bit line /BLL0, depending on the data held in memory cell capacitor MC. Similarly, a potential difference is caused in segment I/O line pair SGI/O. At time t5, the potential level of the word line increases to the intermediate potential. It should be noted that the potential level of the word line is not required to be increased to boosted potential Vpp, since the potential level of the bit line pair immediately before data is read from the memory cell capacitor is smaller than 1/2 Vcc. In other words, data is read out on a bit line pair with a word line lower in potential level than when data is read with the potential level of the bit line pair started from 1/2 Vcc. This can increase data reading speed.

At time t6, when signal R-CSL is activated the potential level of the I/O line pair, at the precharge level is driven and thus changed by transistors TDC1 and TDC2 depending on the potential level of the segment I/O line pair. Thus data is read onto the I/O line pair.

It should be noted that signal R-CSL may be activated at a timing much earlier than time t6. This is because segment I/O line pair SGI/O and the I/O line pair are not connected together directly and even in such a case as described above the data held in a memory cell is not destroyed due to the potential level of the I/O line pair.

The potential difference of the bit line pair is also amplified e.g. at time t7 by an activated sense amplifier and data is thus restored in a memory cell. As has been described above, it is not necessary to use data amplified by a sense amplifier in reading data onto an I/O line pair. Thus, if the sense amplifier operates slowly, it does not affect data reading speed. Accordingly, the size of the sense amplifier is only required to be that sufficient to ensure that data can be restored and the sense amplifier can thus be reduced in layout area. It should be noted that when the amplitude of the amplification potential of the sense amplifier after time t7 is set at a potential intermediate between power supply potential Vcc and ground potential GND rather than adapted to fully swing to power supply potential Vcc, the electrical charge held in other non-selected memory cells connected to the bit line pair is not lost due to noise caused in the bit line pair.

Data write operation and precharge operation will now be described.

Figure 8:
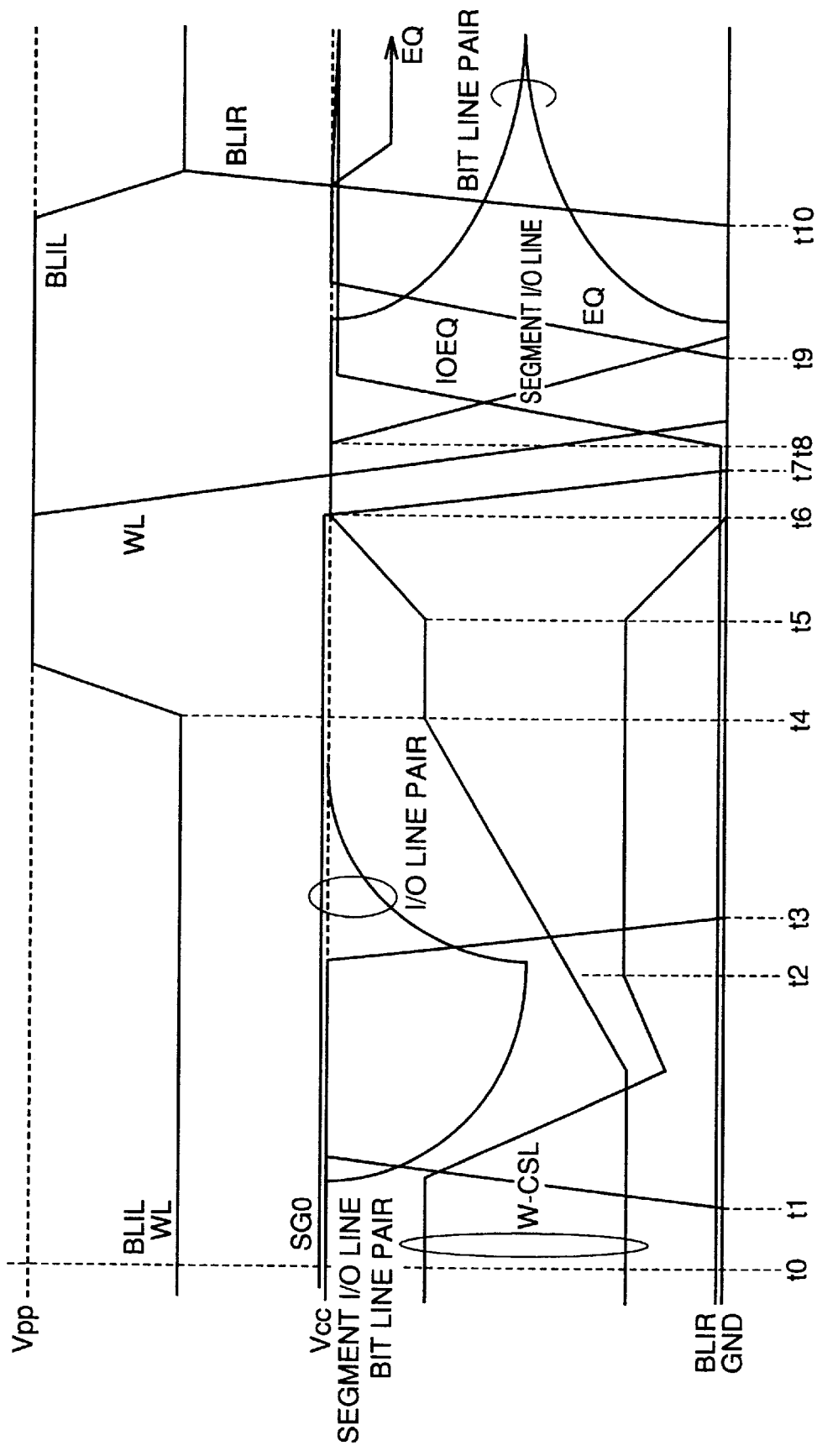
FIG. 8 is a timing diagram for illustrating write and precharge operations of the FIG. 6 circuit.

FIG. 8 is a timing diagram for representing an operation of a circuit which provides the FIG. 6 connection between a sense amplifier portion and a data line portion in the write and precharge operations.

Referring to FIG. 8, at time t0, segment decode line SG0 active high and sense amplifier S/A activated cause a potential difference in a bit line pair and segment I/O line pair SGI/O depending on the data stored in a memory cell selected.

At time t1, signal W-CSL activated turns on transistors TWI1 and TWI2 so that the write data transmitted from the I/O line pair is transmitted to segment I/O line pair SGI/O. It should be noted that the potential of the I/O line pair is not transmitted because the I/O line pair is connected to segment I/O line pair SGIO/O directly but the potential of the I/O line pair drives the transistors TWC1 and TWC2 potentials.

Thus, if the potentials of the paired I/O lines are not fully swung, each at its complementary level, they can be transmitted to segment I/O line pair SGI/O. Thus, the time required for precharging the I/O line pair can be reduced after the transmission of data to segment I/O line pair SGI/O, to allow for rapid operation.

From time t2, a sense amplifier which has received the write data at its sense node starts to amplify the write data.

At time t3, signal W-CSL is inactivated to shut down the data communication from the I/O line pair to the segment I/O line pair. Responsively the I/O line pair is precharged to the power supply potential Vcc level.

At time t4, the potential level of a word line and the level of signal BLIL are both driven to boosted potential Vpp. Responsively the sense node of the sense amplifier is coupled with a selected memory cell. At time t5, of sense amplifier driving signals, a p-channel MOS transistor driving signal SP further increases in level and an n-channel MOS transistor driving signal SN further decreases in level to allow the potential level of the bit line pair to provide full swing. Since the potential level of the word line has been increased to the boosted level, either high-level data or low-level data can be written in the memory cell with sufficient margin.

At time t6, the level of segment decode line SG0 starts to transition to an inactive state and the segment I/O line pair is disconnected from the bit line pair. Then the word line is also inactivated.

At time t8, signal IOEQ transitions to an active state and segment I/O line pair SGI/O is precharged to ground potential GND.

At time t9, equalization signal EQ transition to an active state and the potential level of the bit line pair is precharged e.g. to the 1/2 Vcc level. At time t10, the signals BLIL and BLIR levels are set to the intermediate potential.

It should be noted that in the standby state after time t10 the equalization signal EQ level may be a predetermined potential no more than power supply potential Vcc. As a result, reducing the current supplying capability of a transistor of equalization circuit EQCKT0 or the like in the standby can decrease any current leakage flowing from the power supply of the 1/2 Vcc potential via a bit line when the bit line and some interconnect short-circuit, to decrease the power consumption of the memory cell array.

Figure 9:
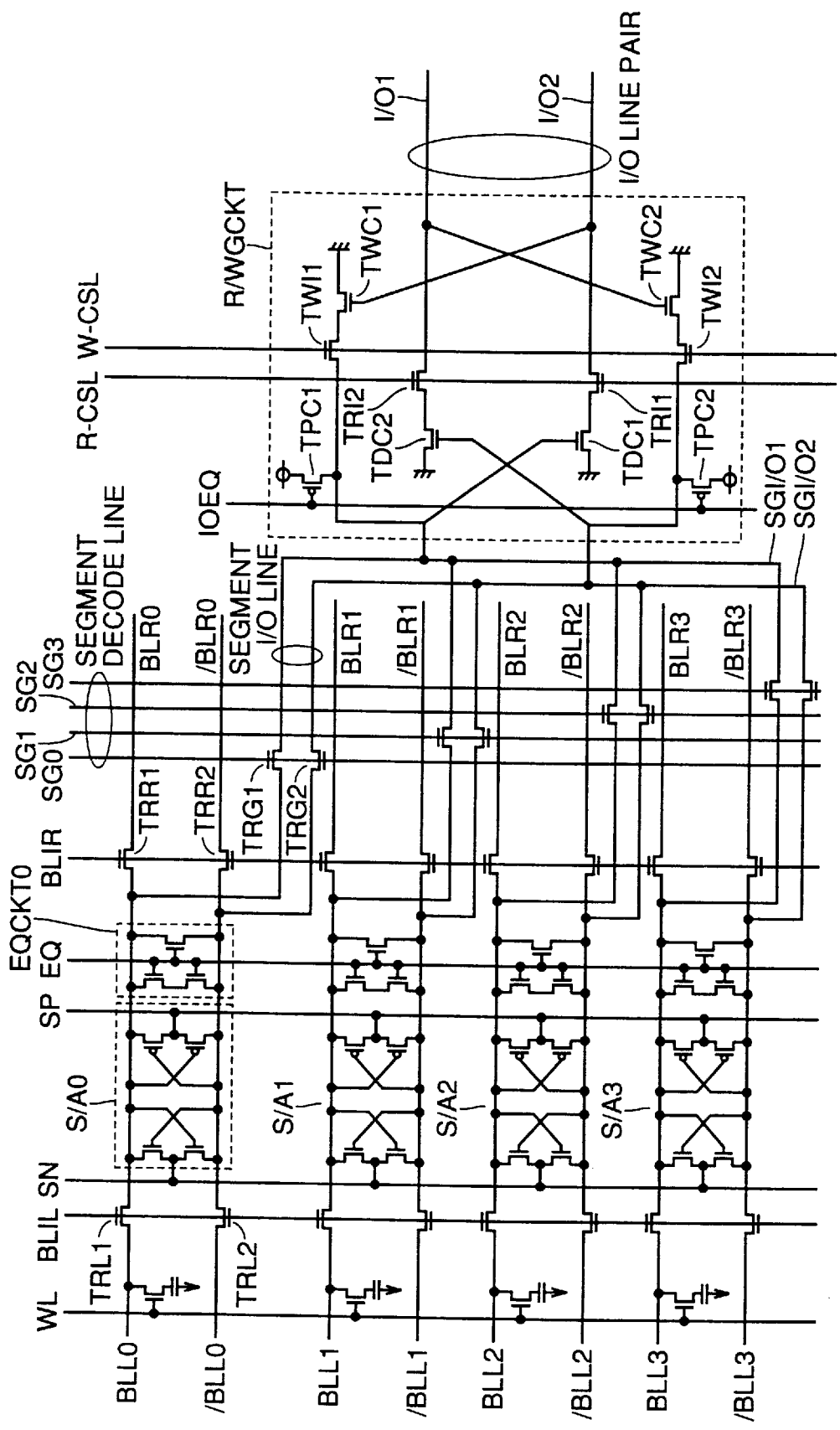
FIG. 9 is a circuit diagram showing a configuration connecting together a sense amplifier portion and data line portion of a modification of the second embodiment.

Modification of the Second Embodiment FIG. 9 is a circuit diagram showing a configuration connecting a sense amplifier portion and data line portion of a semiconductor memory device as a modification of the second embodiment.

The FIG. 9 configuration differs from the FIG. 6 configuration in that transistors TPC1' and TPC2' for precharging a segment I/O line pair are both p-channel transistors and that the precharged potential level of segment I/O line SGI/O is power supply potential Vcc.

The remaining configuration shown in FIG. 9 is similar to the corresponding portion shown in FIG. 6 and the identical portions are denoted by the same reference characters and the description thereof will not be repeated.

Figure 10:
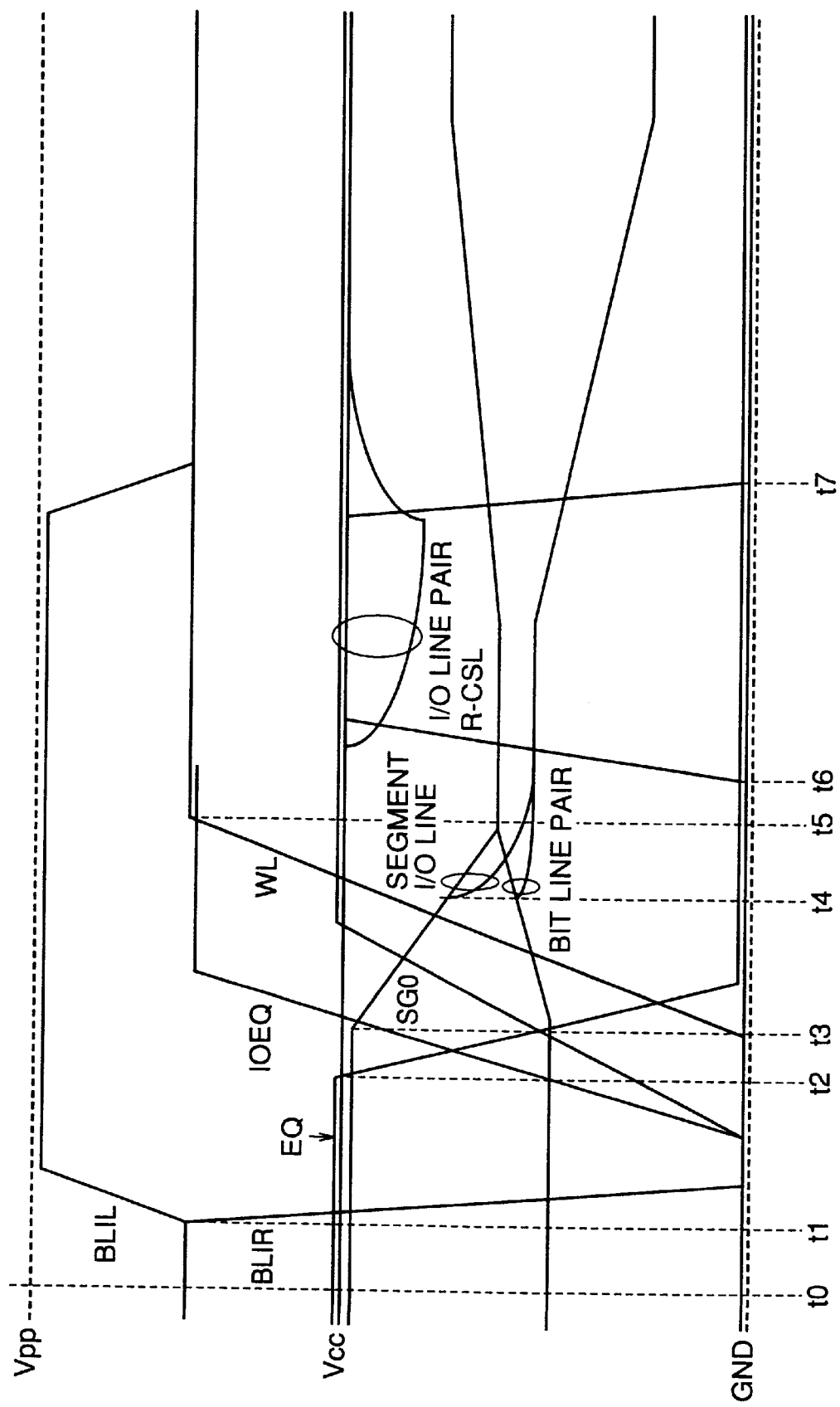
FIG. 10 is a timing diagram for illustrating a read operation of the FIG. 9 circuit.

FIG. 10 is a timing diagram for illustrating an operation of the FIG. 9 circuit connecting a sense amplifier portion and a data line portion in read operation.

The FIG. 10 operation differs from the FIG. 7 operation in that initially at time t0, segment I/O line pair SGI/O is precharged to power supply potential Vcc.

Thus, when segment decode signal SG0 is activated, the potential level of the bit line pair and that of the segment I/O line pair are higher than the precharged-level potential of the bit line pair, i.e. 1/2 Vcc. Thus, while the FIG. 10 system does not reduce the time required from the point when the potential level of the word line starts to change to the point when data is read, the FIG. 10 system can advantageously drive a sense amplifier faster than e.g. when the sense amplifier is supplied with a ground potential via a transistor and the parasitic resistance of the sense amplifier cannot be neglected on the source side.

Figure 11:
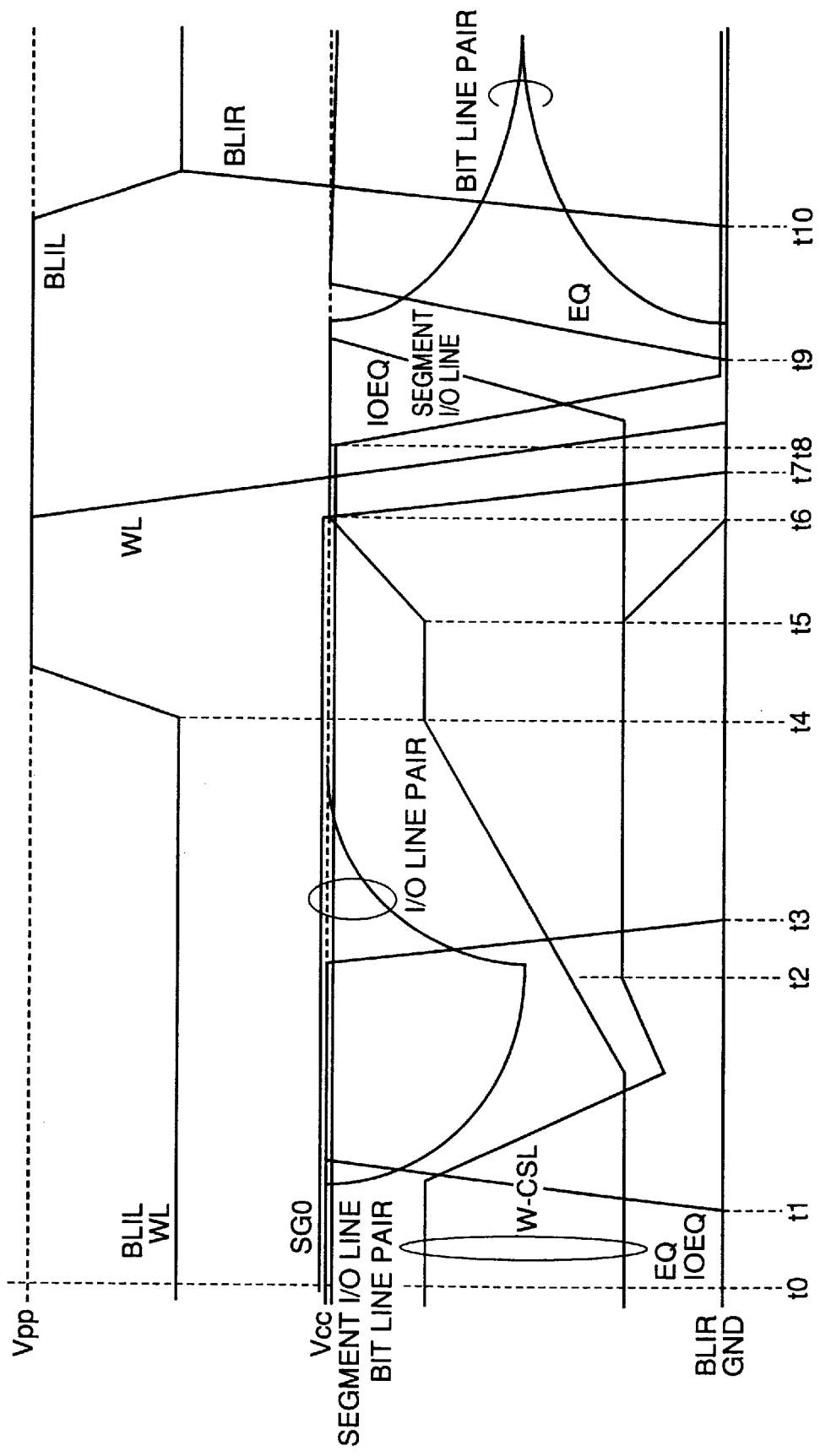
FIG. 11 is a timing diagram for illustrating write and precharge operations of the FIG. 9 circuit.

FIG. 11 is a timing diagram for representing an operation of the FIG. 9 circuit connecting a sense amplifier portion and data line portion in write operation and precharge operation.

The FIG. 11 operation is basically similar to the FIG. 8 operation, except that the precharge level of segment I/O line pair SGI/O is power supply potential Vcc.

Third Embodiment

Figure 12:
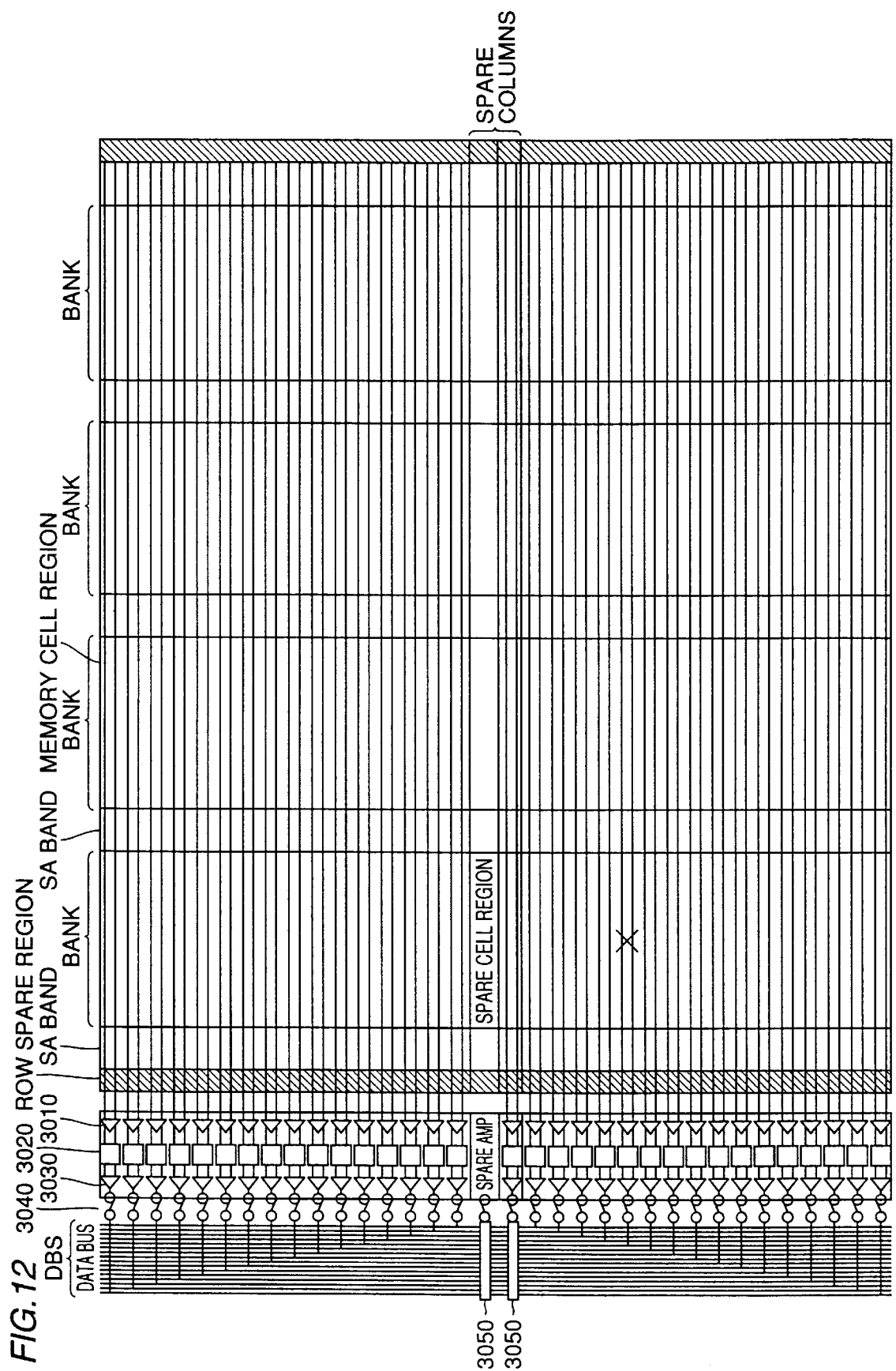
FIG. 12 is a schematic block diagram for illustrating a configuration of a redundant circuit according to a third embodiment of the present invention.

FIG. 12 is a schematic block diagram showing a configuration of a redundant circuit for substituting for a defective memory cell in the memory cell array in the semiconductor memory device configured as shown in FIGS. 1 and 2.

Referring to FIG. 12, a row spare region for substituting for a row of memory cells is provided at an outermost periphery of the memory cell array.

A spare cell in the column direction is provided at a boundary between banks of the memory cell array. Data each read on an I/O line pair are amplified by an amplifier 3010 (or a spare amplifier) and held in a latch circuit 3020. The data in latch circuit 3020 is transmitted by a driver circuit 3030 provided for latch circuit 3020 to any data bus DBS selected by a shift switch circuit 3040 (or a shift switch circuit 3040 and a demultiplier 3050).

Figure 13:
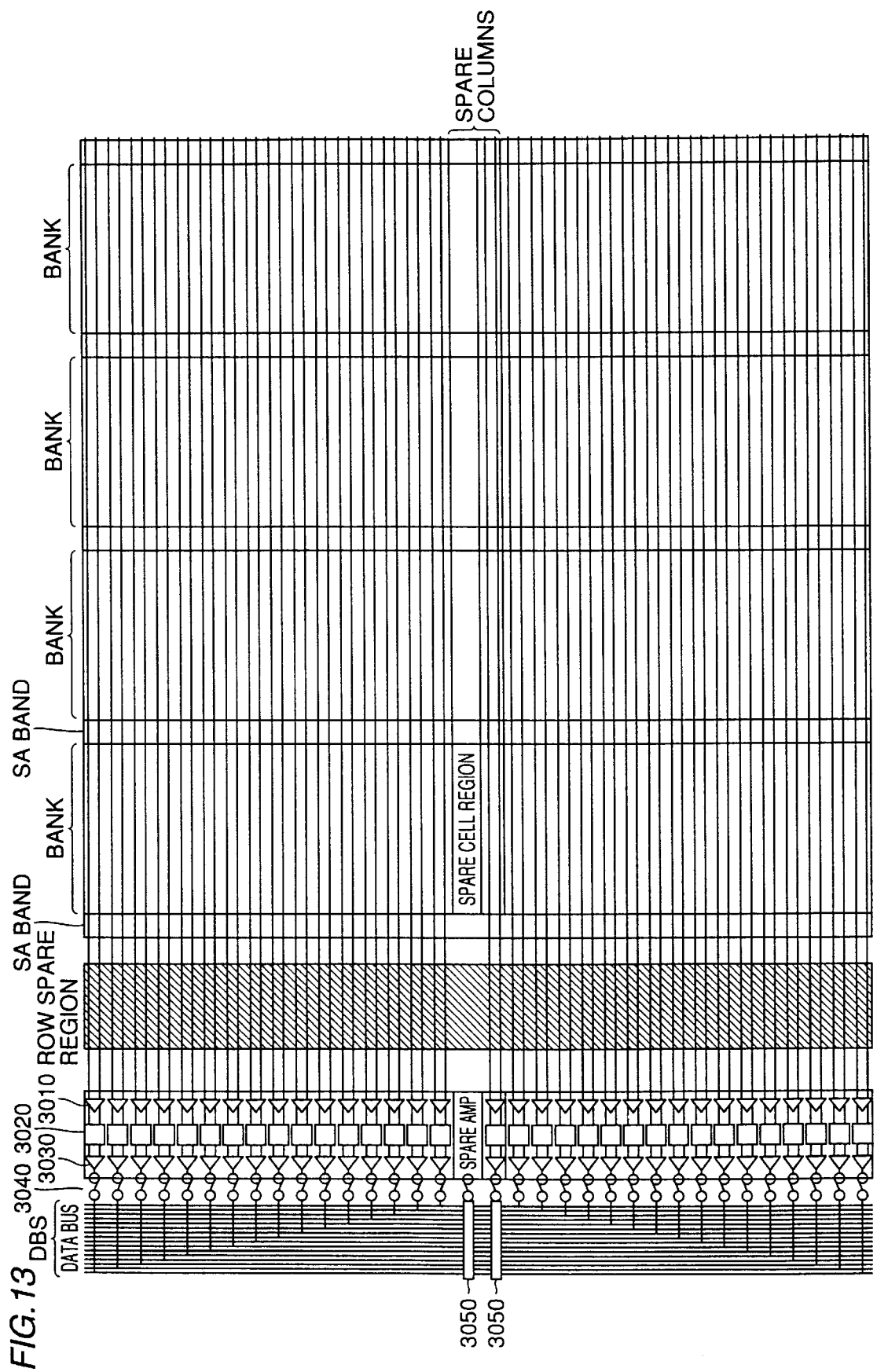
FIG. 13 is a schematic block diagram showing another example of the redundant circuit according to the third embodiment of the present invention.

FIG. 13 is a schematic block diagram showing another configuration of the redundant circuit.

The FIG. 13 configuration differs from the FIG. 12 configuration in that a spare memory cell block for substituting for memory cell rows is provided in a region separate from the memory cell array. The remaining configuration shown in FIG. 13 is similar to the corresponding configuration shown in FIG. 12 and the description thereof will not be repeated.

Configuration of Shift Redundancy

Hereinafter, a configuration and operation for substitution with a redundant column by means of shift switch circuit 3040 will now be described more specifically.

Figure 14:
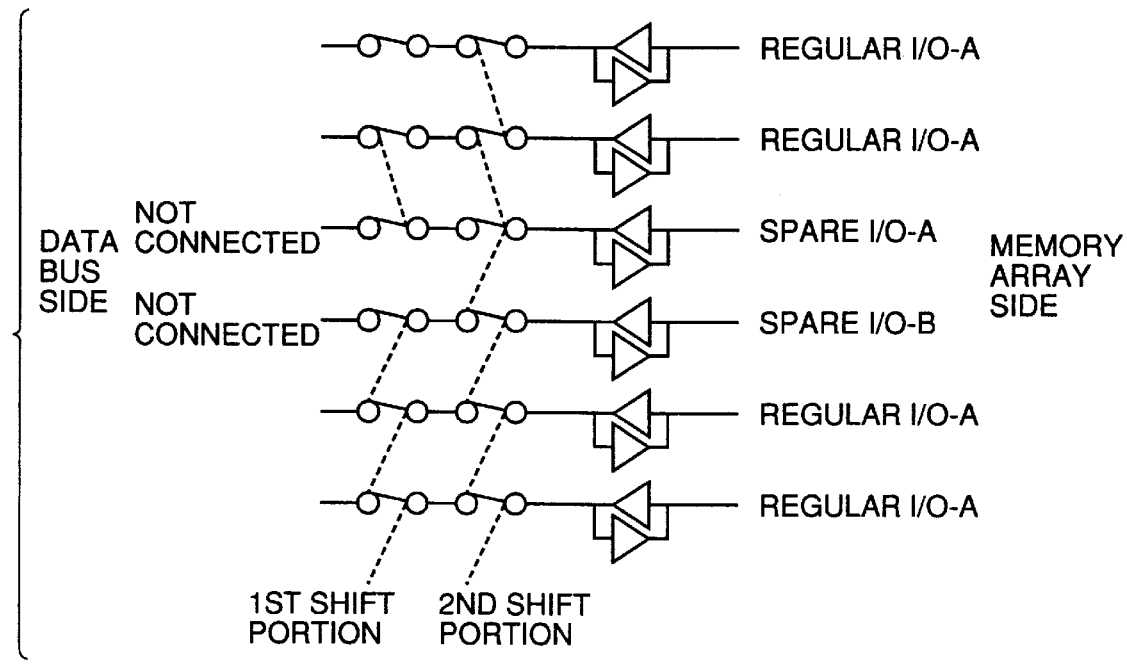
FIGS. 14 to 17 are first to fourth conceptual views for illustrating shift redundancy circuit operation.

FIG. 14 is a schematic block diagram showing a configuration of shift switch circuit 3040 in shift redundancy.

In the FIG. 14 configuration, two spare I/Os are provided at its center portion. The figure shows a configuration of a shift portion existing between the data bus side and the read/write amplifier side, focusing on the spare I/O portion mentioned above.

The centered, two spare I/Os can each substitute for either a memory cell column corresponding to an upper I/O in the figure or a memory cell corresponding to a lower I/O in the figure. Furthermore, if there are two defects in the upper or lower group of I/O lines in the figure, a shift operation performed for two stages can provide substitution for the defects.

In order to do so, there are arranged a first shift portion for initially performing a single-stage shift followed by a second shift portion for performing a single-stage shift.

The first shift portion provides a one-stage shift upward for an upper I/O line in the figure and a one-stage shift downward for a lower I/O line in the figure.

The second shift portion is basically similar in operation to the first shift portion, although the two spare I/Os each shift both upward and downward.

FIG. 14 shows a connection prior to normal substitution. Before substitution is provided or if any substitution is not required, the initial connection is maintained. More specifically, regular and spare I/O lines are each connected to an originally corresponding connection-node located exactly on the left side and the spare I/O is not connected to any data bus.

Figure 15:
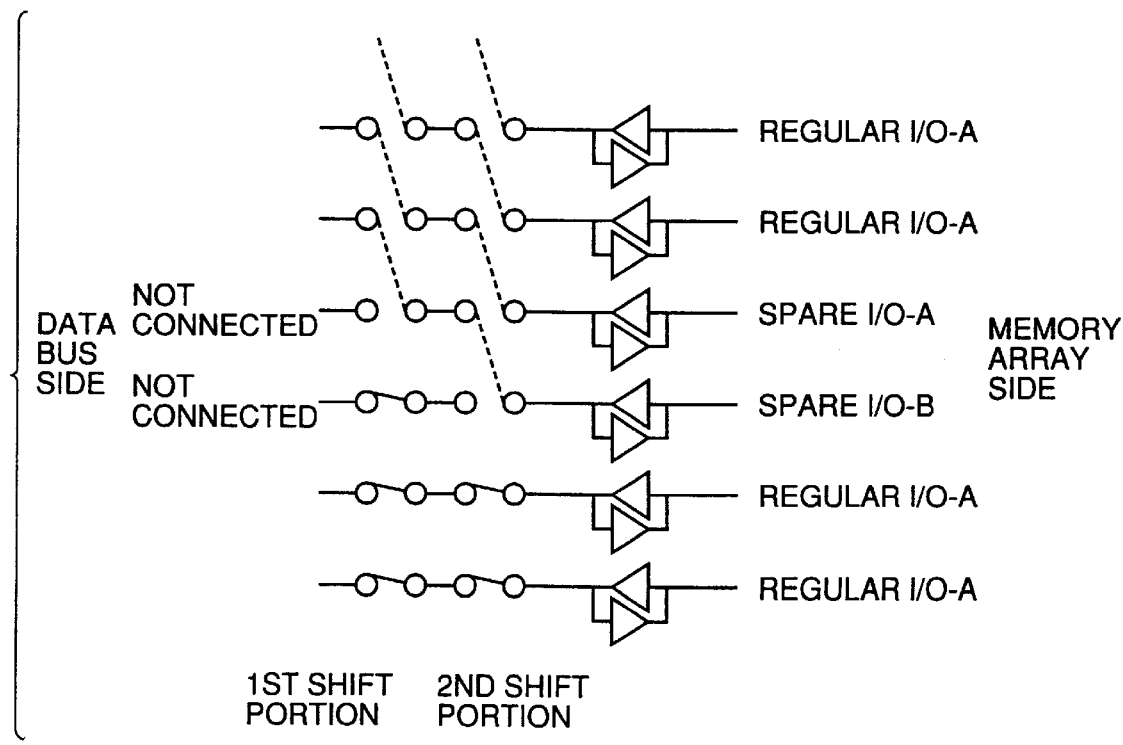

If substitution requires both of the two spare I/Os to be shifted upward, as shown in FIG. 15, both spare I/O-A and spare I/O-B are shifted upward in the second shift portion initially. A similar upward shifting is also provided in the first shift portion to implement such a redundancy substitution as described.

Figure 16:
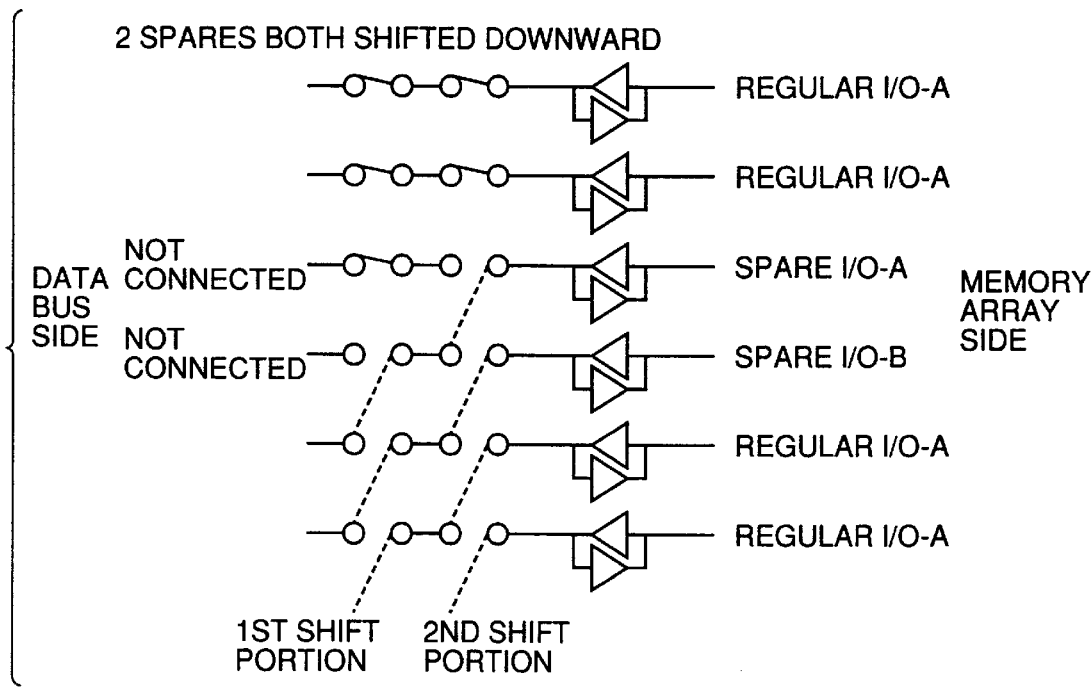

If substitution requires both of the two spare I/Os to be shifted downward, as shown in FIG. 16, both spare I/O-A and spare I/O-B are shifted downward in the second shift portion initially. A similar downward shifting is also provided in the first shift portion to achieve the redundancy substitution as described.

Figure 17:
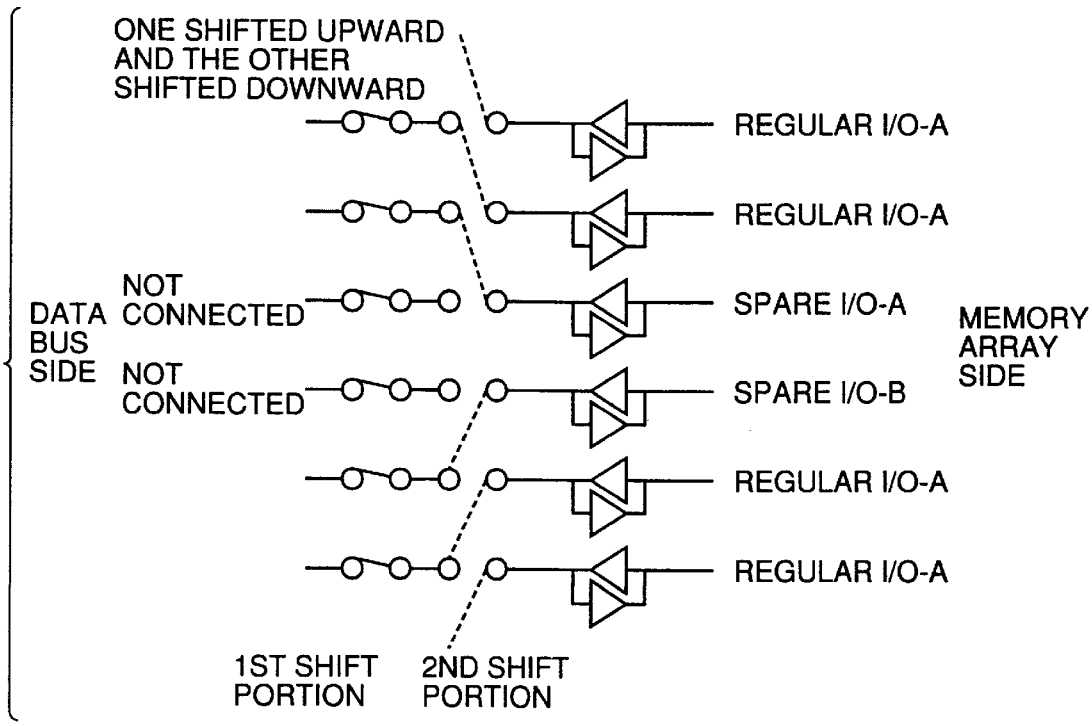

If substitution requires one spare I/O line to be shifted upward and the other downward, as shown in FIG. 17, the first shift portion is not subjected to shift operation while the second shift portion has shifters on the upper side each shifted upward, and shifters on the lower side each shifted downward.

Figure 18:
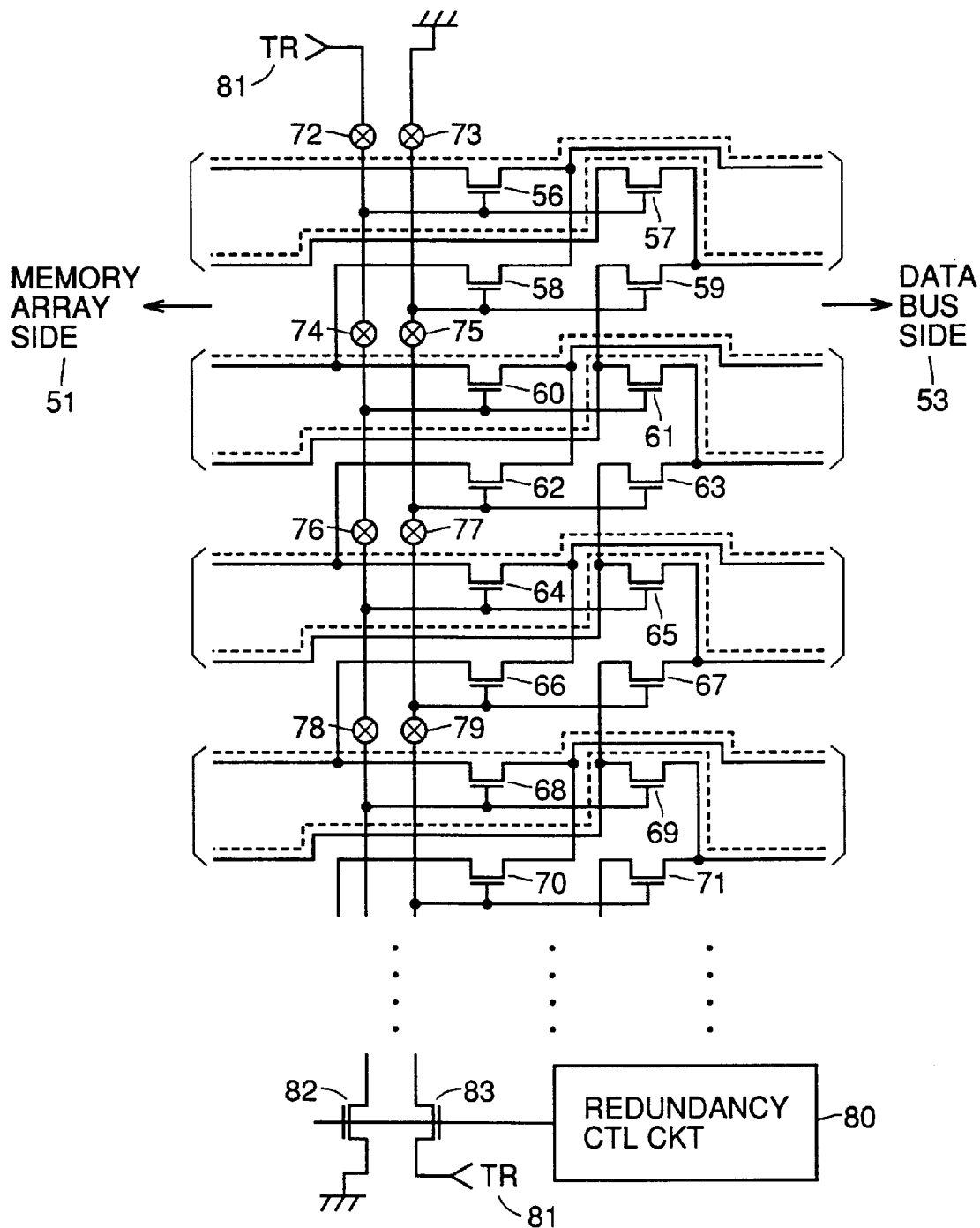
FIGS. 18 to 21 are first to fourth circuit diagrams for illustrating shift redundancy circuit operation.

FIG. 18 is a schematic block diagram more specifically showing the configuration of shift switch circuit 3040.

To simplify the description thereof, focusing on the configuration including the lower spare I/O of the first shift portion, with a transistor for connection implemented with an n-channel MOS transistor, a fuse link arranged in parallel is laser-blown to provide fixed change in connection.

Before substitution is provided or if substitution is not required, the initial connection (the condition that a complementary I/O on the right side and a complementary I/O on the left side are connected together one on one) is maintained. In determination of redundancy connection, signal TR goes high and current is passed via a transistor having current controlled by a redundancy control circuit.

When the fuse link is unblown, a train of fuses 73–79 of the fuse link is set to ground potential GND and a train of fuses 72–78 of the fuse link goes high to maintain the connection described above. It should be noted that the dot line in the figure represents the connection.

In this condition, in the figure the uppermost I/O has transistors 56 and 57 turned on so that connection is made to an immediately left-hand connection node. Transistors 58 and 59 are turned off and the connection to the one stage below is shut off.

Figure 19:
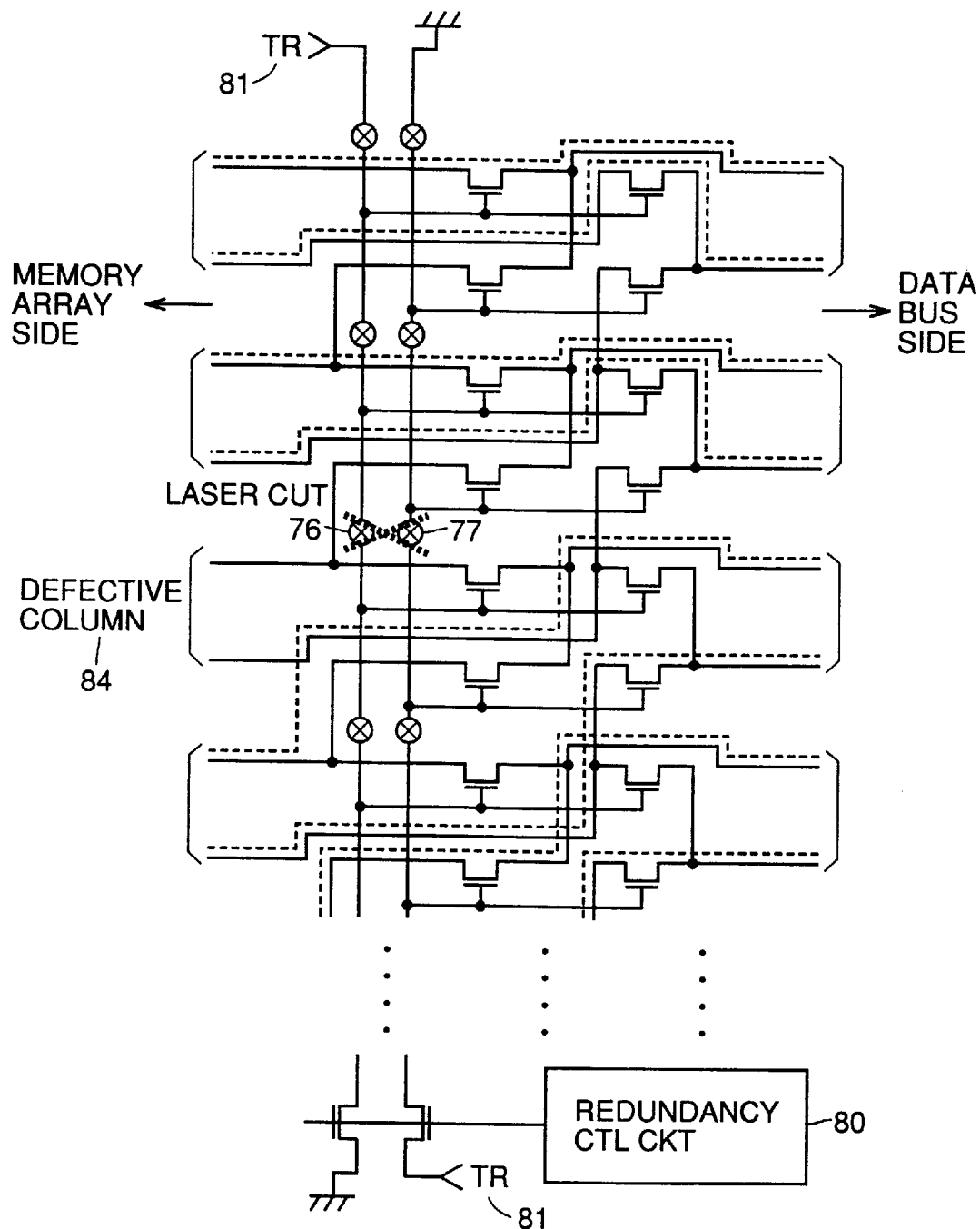

FIG. 19 shows a configuration providing substitution for a defect existing in a memory cell column 84.

When a defect is caused for I/O line pair 84, fuse link portions 76 and 77 corresponding to the defective point are laser-blown to provide the change in configuration of shifting to the one stage below rather than connecting to the defective point. It should be noted that the dot line represents connection.

Figure 20:
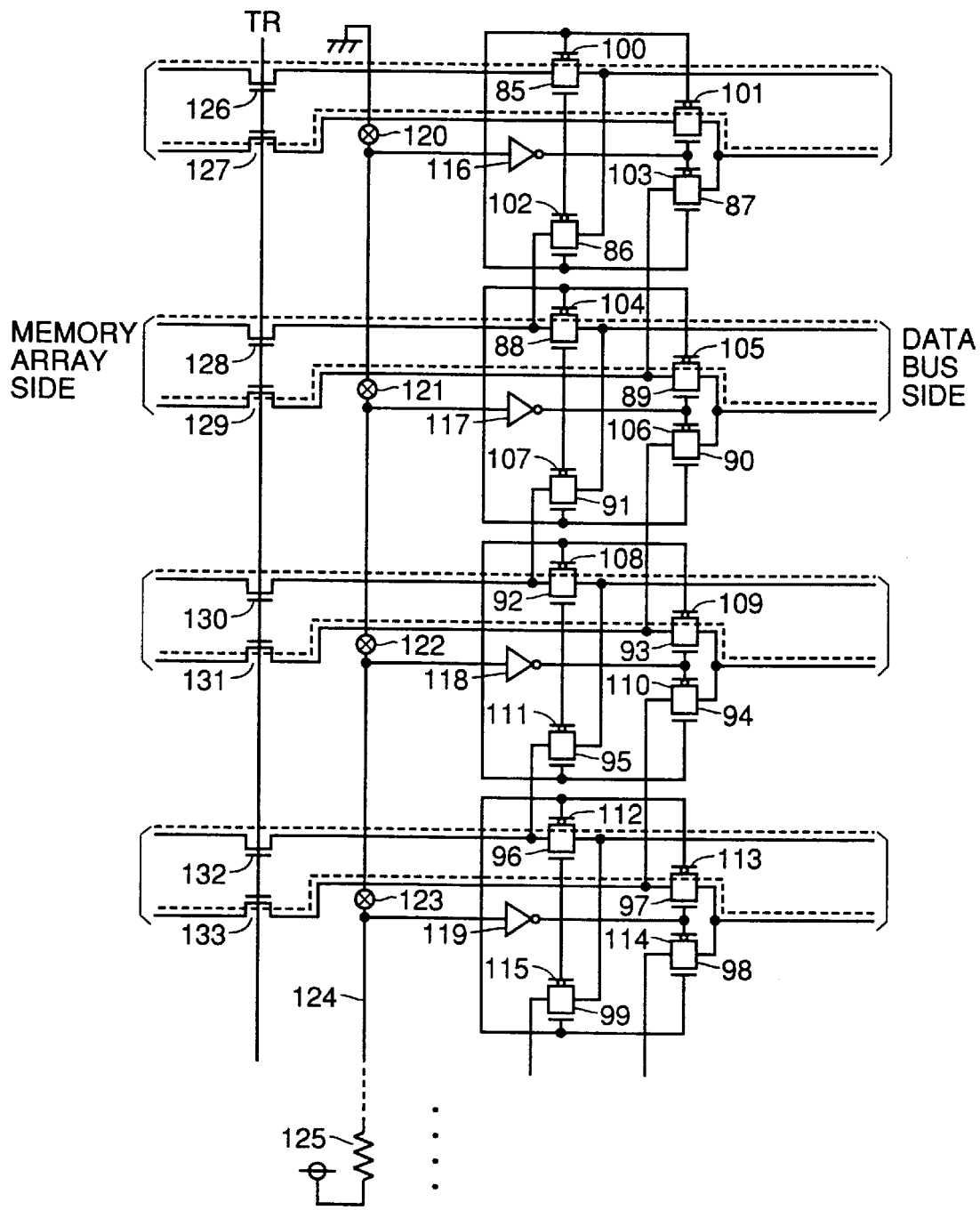
Figure 21:
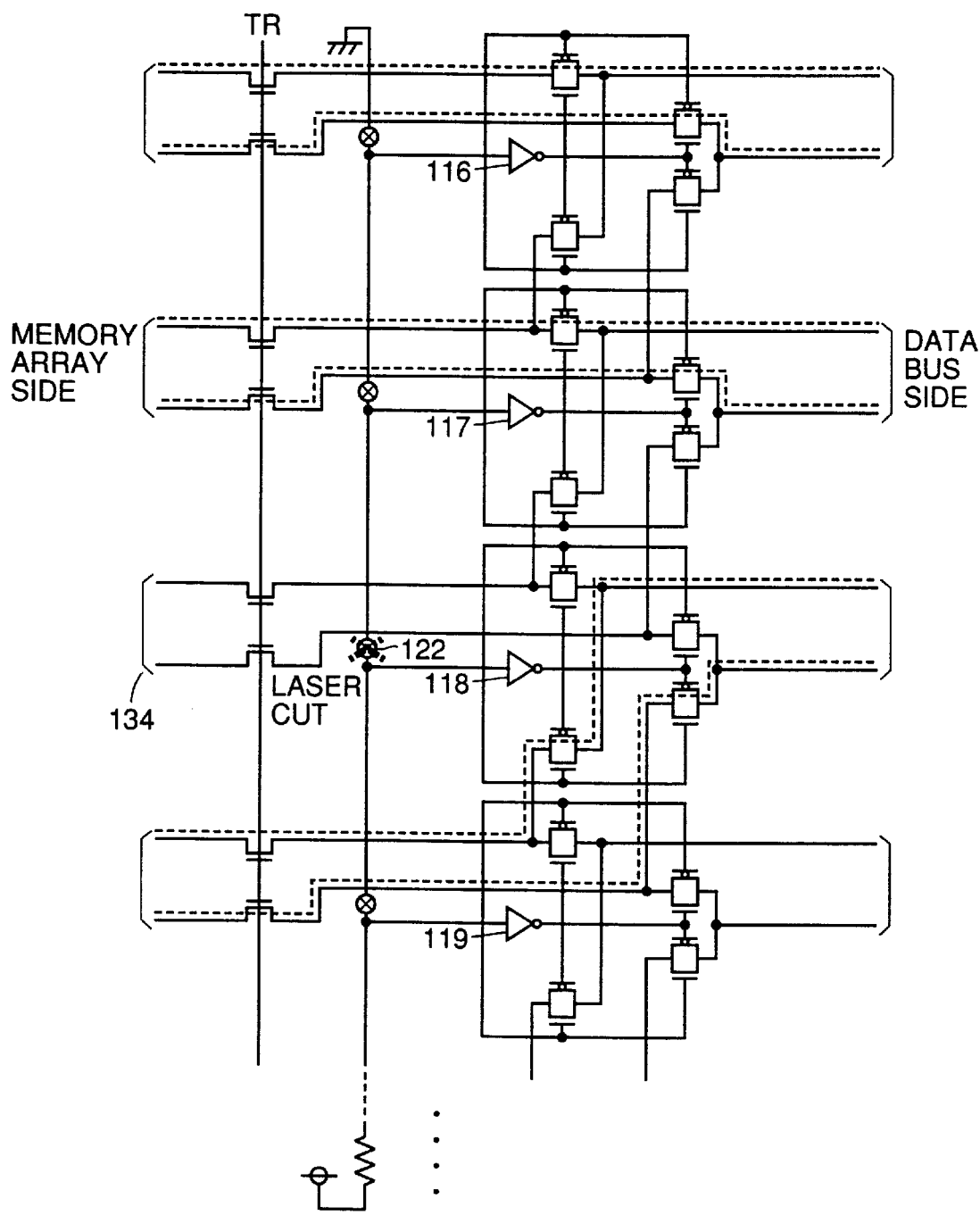

In FIG. 20, an n-channel MOS transistor configured circuit is instead configured of CMOS transistor to provide a fuse link portion in a single train. In place of a redundancy control circuit, a simple resistive element is arranged to limit current. Furthermore, a transfer gate of a connection portion is of CMOS to reduce the resistance of an I/O line. (The dot line represents connection.) FIG. 21 shows that one-stage shift is achieved by laser-blowing a fuse link portion at an unnecessary point.

In the figure, the dot line represents a connection in such an example.

Figure 22:
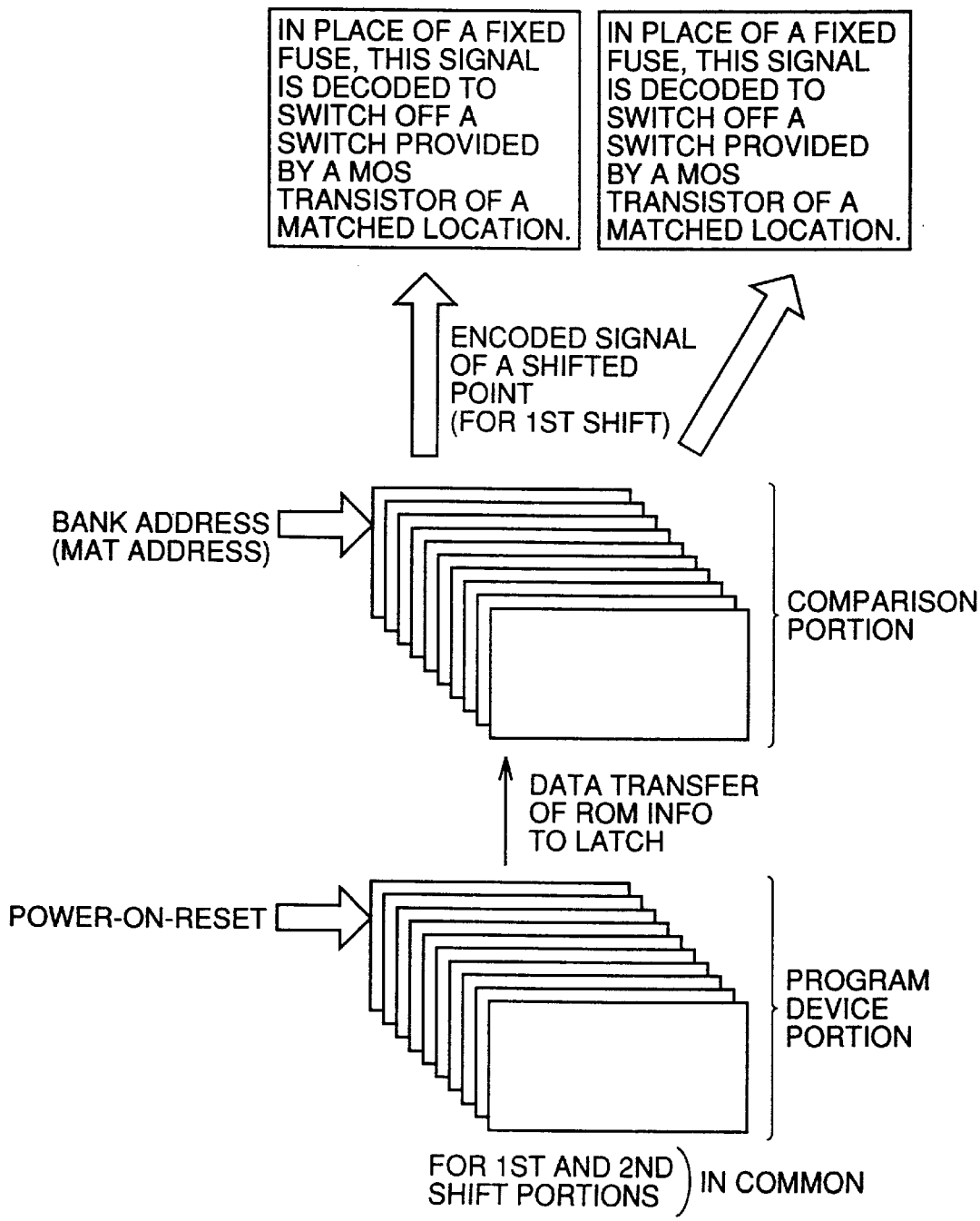
FIGS. 22 and 23 are conceptual views for illustrating shift redundancy circuit operation.

FIG. 22 shows an exemplary configuration capable of dynamic connection change to suit the form of such a fixed change in connection as described above for a multibank configuration.

In the multibank (multimat) configuration, an I/O line is arranged across over other banks (mats). Accordingly, when a different I/O is rescued for each bank (or mat) the form of connection need be changed.

Thus, shift information of the first shift portion and that of the second shift portion are changed according to a bank address (or mat address) input.

First of all, a program device programming a defective address can be a laser-blown or electrically-fused fixed element, a shared general film, a non-volatile RAM configurations e.g. of flash ROM, or the like.

A defective address is held for the first and second shift portions in common.

The above information is transferred to a hatch arranged in a comparison portion when a chip or a bank is activated after power-on. In other words, a defective address is read once after power-on or after the chip is activated. The timing at which the information is transferred is provided between a time point at which a power-on-reset is provided and a time point at which an operation of a column which requires comparing operation is performed. The configuration providing the transfer described above includes parallel-transfer technique, serial transfer using a shift register, and the like.

For the transfer via a shift register, the latch in the comparison portion is also included in the shift register as a portion thereof to facilitate the transfer operation. The transfer clock may be generated internally by a ring oscillator of appropriate period or it may be generated in response to an external clock.

The comparison portion compares a bank address (or mat address) input to information read from a ROM portion and uses the result of match/mismatch to output information on substitution. The substitution information is output as a signal encoding a location to be shifted. This signal is decoded to change a shift condition. It should be noted that the fuse link portion disconnectable by laser beam in the shifted configuration described above is formed from a MOS transistor and the decode signal controls the turning on/off of a MOS transistor functioning as a switch.

Figure 23:
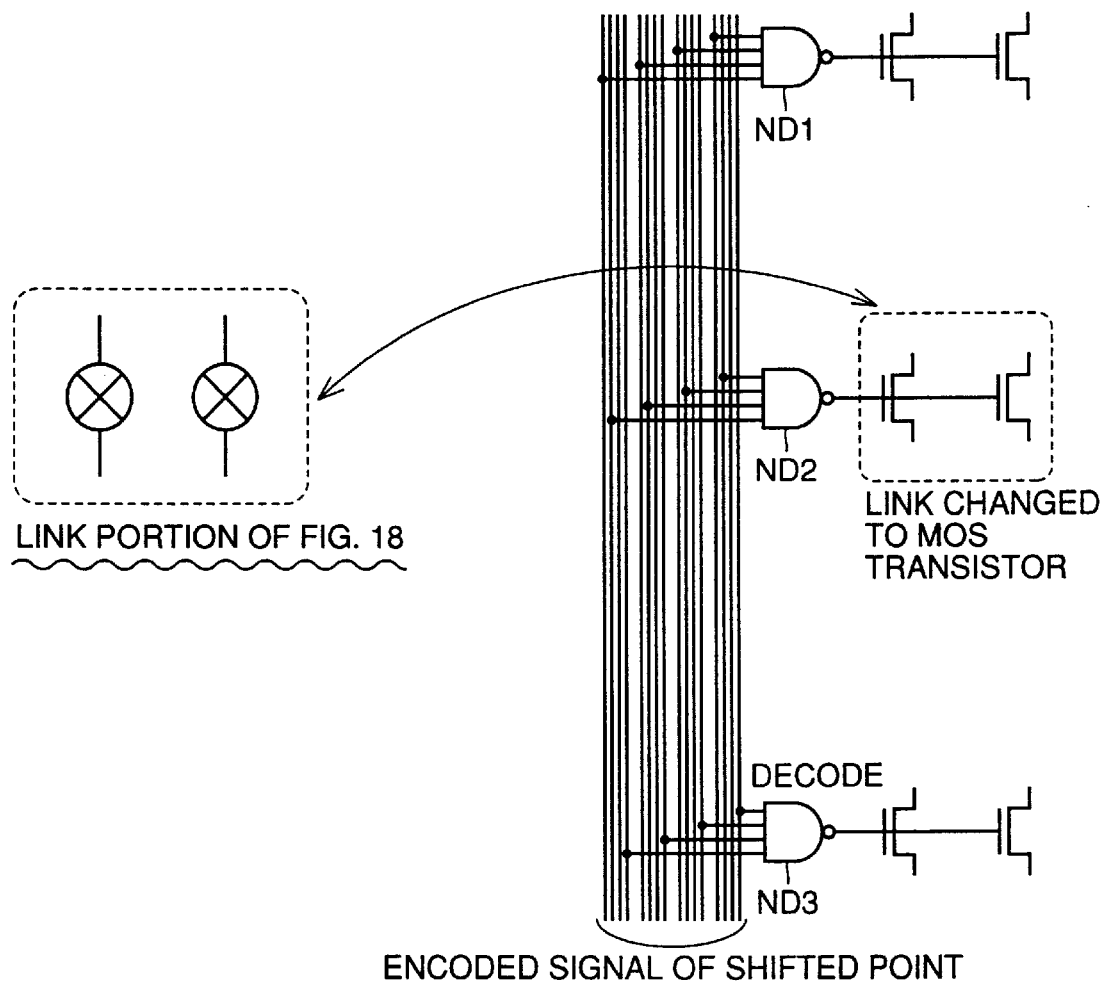

FIG. 23 shows a configuration of a decoding portion and that of a MOS transistor portion.

More specifically, while in FIG. 18 a fuse element is used to switch a connection path, FIG. 23 shows a concept that the fuse element is substituted with a MOS transistor switch.

Information on I/O line's 256 shifted locations is represented by combined, 16 signals which are decoded by a four-input NAND circuit NDi (i=1, 2, 3, . . . ) to determine a location at which the gate of a MOS transistor is turned off. Before the encoded signal is transmitted, the signals are all precharged low and the gates of all MOS transistors are held ON.

While the above description is provided with respect to the first shift portion, the same configuration is basically applied to the second shift portion. It is, however, different in that the spare I/O portion is switchable either upward or downward. To meet this, spare I/O-A remains connected to the immediately left-hand thereof or is shifted downward if encoded signals for upper shifted locations are all held low. By contrast, spare I/O-B remains connected to the immediately left-hand thereof or is shifted upward if encoded signals for lower shifted locations are all held low.

In other words, the fact that upward or downward shifting is not required results in a connection being changed based on an estimation that there is a possibility that a two-stage shift has been provided on the opposite side.

Figure 24:
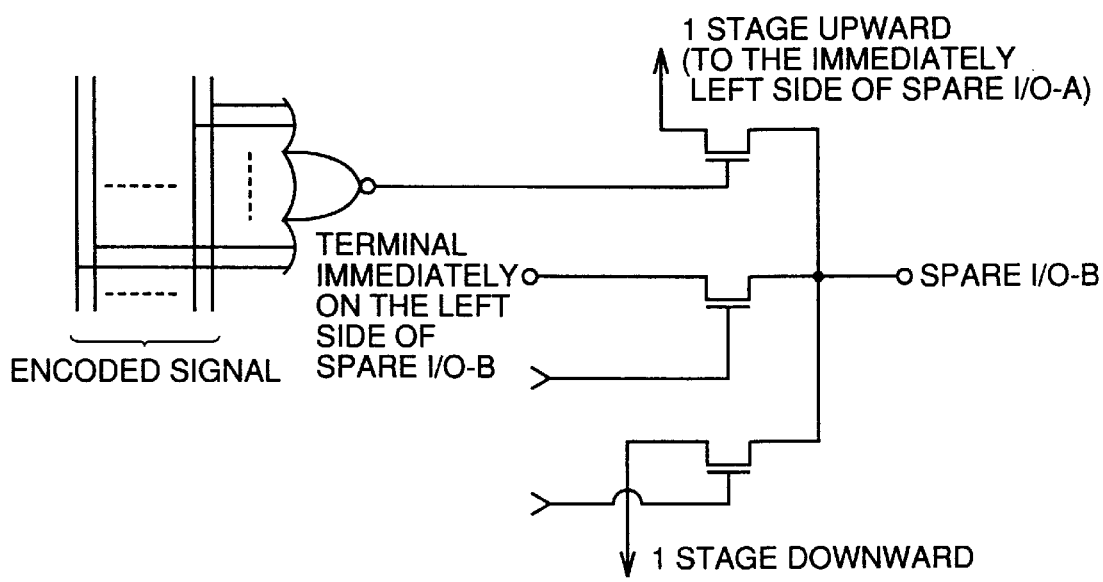
FIG. 24 is a circuit diagram for illustrating a configuration of circuitry controlling a shift redundancy circuit.

FIG. 24 is a circuit diagram showing configuration of the portion described above. When encoded signals from the lower side are processed by an NOR gate and determination is made that all of them are low, connection is made to the one stage above, i.e. a terminal immediately on the left hand of spare I/O-A.

Substitution for each I/O line can provide a redundant configuration serving as a multiple I/O output configuration. For a conventional configuration with n redundancies arranged for each block, redundancy must be arranged for each I/O. This unnecessarily increases the number of redundant portions and wastes area.

The two-stage shifting configuration can also handle a plurality of defective locations to provide efficient substitution operation. It should be noted that while the above description has been provided for two-stage shift, more stages can be applied to provide redundancy substitution of more I/O lines. Dynamically changing a form of connection also allows defective locations in a multibank configuration to be substituted bank by bank or mat by mat to further enhance the efficiency of substitution.

Fourth Embodiment

Figure 25:
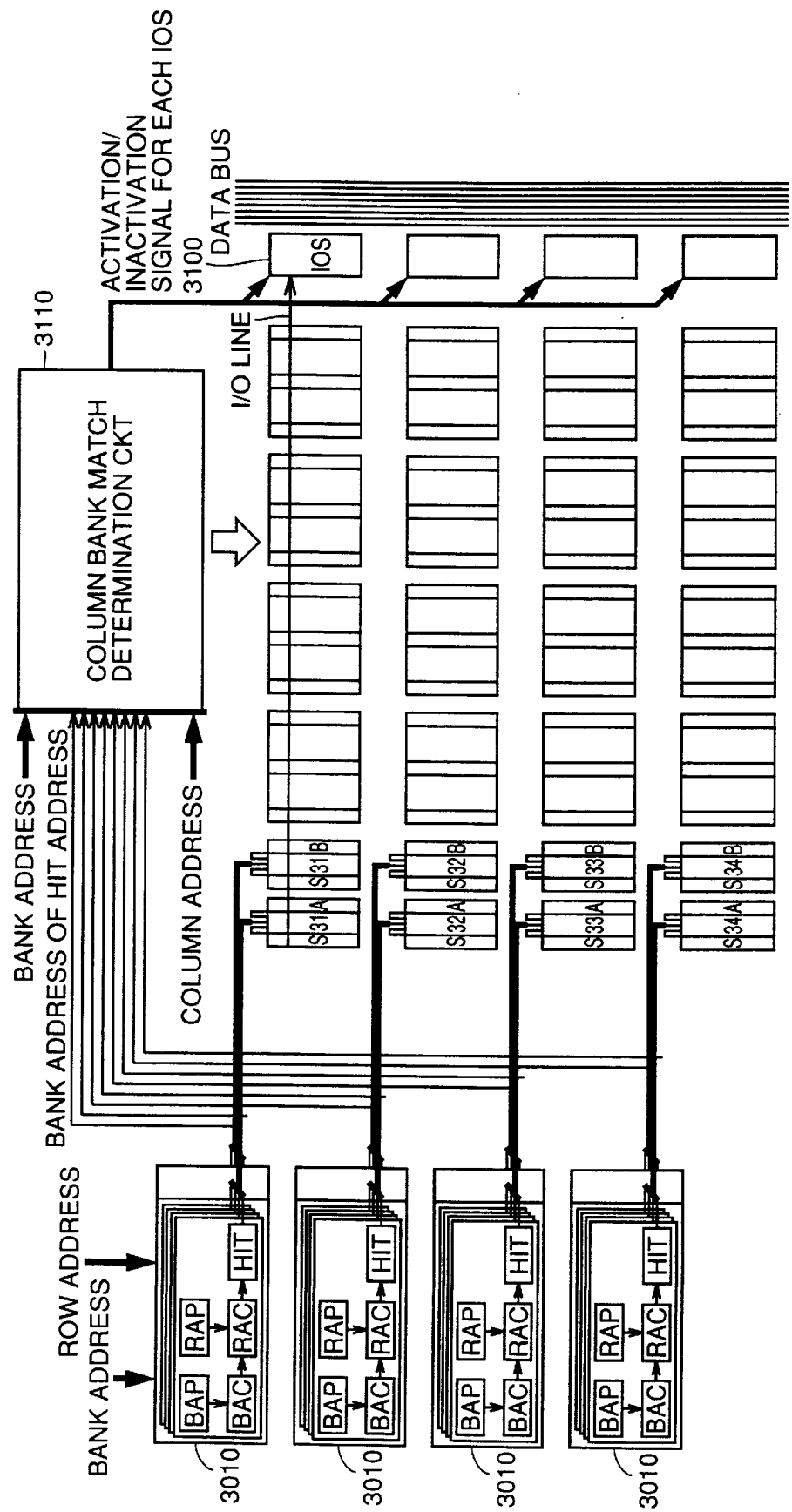
FIG. 25 is a schematic block diagram for illustrating a configuration of redundant circuit according to a fourth embodiment.

FIG. 25 is a schematic block diagram showing a configuration of a redundant memory array for substituting for a defective memory cell in a plurality of banks arranged in four rows and four columns in a semiconductor memory device according to a fourth embodiment of the present invention.

The FIG. 25 configuration is an array configuration having a plurality of spare memory blocks which can arbitrarily substitute for a configuration formed from a plurality of banks arranged in four rows and four columns. In the FIG. 25 example, 16 banks of 4×4 are shown with an I/O line pair arranged across four banks arranged in the horizontal direction. Of the data transmitted on the I/O line pair to an I/O switch portion, a block of required data is to be transmitted on a data bus via a column switch.

Eight spare blocks SB1A to SB4B each include a plurality of programmable redundant rows (spare rows). A redundant row substitutes for not only a defect of banks sharing an I/O line but a row of a bank corresponding to a different I/O line to enhance substitution efficiency.

Initially, in order to enable substitution in a different bank, a bank address to be substituted is programmed in a BAP portion and a row address to be substituted in a RAP portion.

In this condition, when bank and row addresses input at row access time match the programmed bank and row addresses a redundancy determination portion 3010 outputs a match signal indicating that redundancy substitution is performed.

In response to the match signal, a corresponding spare block's spare word line is activated. Since redundancy determination operation and the like are controlled quite independently of the address decoding process in a normal bank, row access in a normal region and the process of redundancy determination and redundancy activation and the like can simultaneously proceed in parallel. Thus access time can be reduced, as compared with the conventional, typical system of completing a redundancy determination process before resuming an access to a memory cell to be selected.

Then, in activating column select line CSL of a spare region through column access an I/O line different from that for a normal region must sometimes be used. Accordingly, a bank address for column access need be compared to a bank address used in row access.

Accordingly, initially, a bank address of a bank subjected to redundancy substitution at row access time is held in a latch circuit as a subject to be compared at column access time.

A bank address input at column access time is compared to the bank address held in the latch circuit. When the addresses match, column select signal CSL in a spare block associated with redundancy determination portion 3010 outputting a result indicating the match is activated while column select signal CSL in the normal region is inactivated simultaneously.

Also, in controlling IO switch portion 3100 for connecting data on an I/O line to a data bus, when a bank address input at column access time is compared to a bank address held in the latch circuit and the addresses match, an IO switch portion receiving data on an I/O line associated with redundancy determination portion 3010 outputting a result indicating the match is activated while an IO switch portion receiving data on an I/O line of the normal region is inactivated.

In other words, when a bank address of an address hitting a defective address at row access time matches a bank address of a column command input at column access time, column bank match determination circuit 3100 inactivates a block to which the original memory cell column belongs and circuit 3110 indicates that a memory cell column belonging to a spare block with a spare word line activated is selected.

When a bank address of an address hitting a defective address at row access time matches a bank address of a column command input at column access time, column bank match determination circuit 3110 also inactivates a block to which the original I/O line pair belongs and circuit 3100 indicates that an I/O line belonging to a spare block with a spare word line activated is selected.

For each of 4×2 redundant rows contained in each of associated, two spare blocks, redundancy determination portion 3010 includes a BAP portion for programming a bank address and a BAC portion for comparing an input bank address to a programmed bank address, a RAP portion for programming a row address and a RAC portion for comparing an input row address and a programmed row address, and a HIT portion outputting a signal HIT indicative of redundancy-determination result. That is, (4×2)×4 sets of the BAP portions and the like are provided in total.

Figure 26:
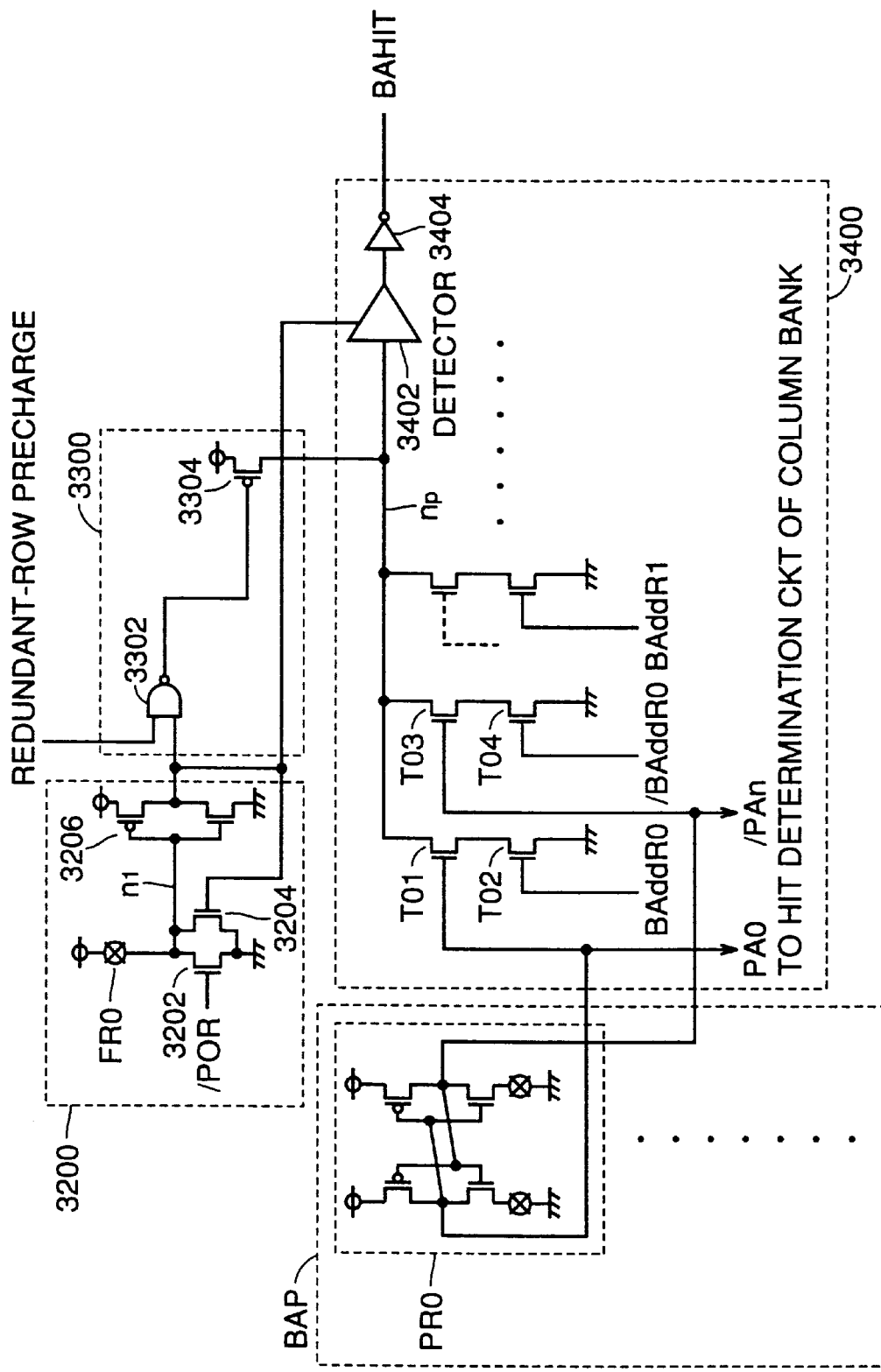
FIG. 26 is a circuit diagram for illustrating a configuration of BAP and BAC portions in a redundancy determination portion 3010.

FIG. 26 is a circuit diagram for illustrating a configuration of the BAP portion for programming a bank address and the BAC portion for comparing an input bank address to a programmed bank address in the FIG. 25 redundancy determination portion 3010.

The BAP portion includes program devices PR0 to PRn each outputting a complementary signal of a predetermined level when either a fuse element F10 or F11 is cut. It should be noted that a bank address is of (n+1) bits and there are provided (n+1) program devices, wherein n represents a natural number.

The BAC portion includes an activation program portion 3200 for designating whether the BAC portion is to be used, a precharge portion 3300 for precharging an internal node np, and a comparison portion 3400 performing an operation comparing data stored in the BAP portion and a bank address input.

The activation program portion includes a fuse element FR0 provided between power supply potential Vcc and node n1, an n-channel transistor 3202 provided between node n1 and ground potential GND and having a gate potential controlled by a power-on-reset signal /POR, an inverter 3206 receiving the level of node n1 as an input, and an n-channel transistor 3204 connected in parallel with transistor 3202 and having a gate potential controlled by an output from inverter 3206.

When fuse element FR0 is cut, transistor 3202 is turned on in response to activated power-on-reset signal /POR at power-on and inverter 3206 provides a high-level output. Responsively, transistor 3204 is turned on and the high level of the output from inverter 3206 is held.

Precharge portion 3300 includes an NAND circuit 3302 receiving a redundant-row precharge signal and an output from inverter 3206, and a p-channel transistor 3304 having a gate potential controlled by an output of NAND circuit 3302 for charging node np in comparison portion 3400.

Comparison portion 3400 includes transistors T01 and T02 provided in series between node np and ground potential GND. The transistor T01 gate receives an output PA0 from program device PR0 and the transistor T02 gate receives an internal bank address signal BAddR0.

Comparison portion 3400 also includes transistors T03 and T04 provided in series between node np and ground potential GND. The transistor T03 gate receives an output /PA0 from program device PR0 and the transistor T04 gate receives an internal bank address signal /BAddR0.

Other programming devices PR1 to PRn are each provided with a similar configuration between internal node np and ground potential GND.

Comparison portion 3400 also includes a detector 3402 activated depending on a level of a signal output from inverter 3206 and receiving the level of input node np as an input, and an inverter 3404 receiving and inverting an output from detector 3402 and outputting a bank hit signal BAHIT.

Signals PA0 and /PA0 to PAn and /PAn output from program devices PR0 to PRn are also output to column bank match determination circuit 3110.

Figure 27:
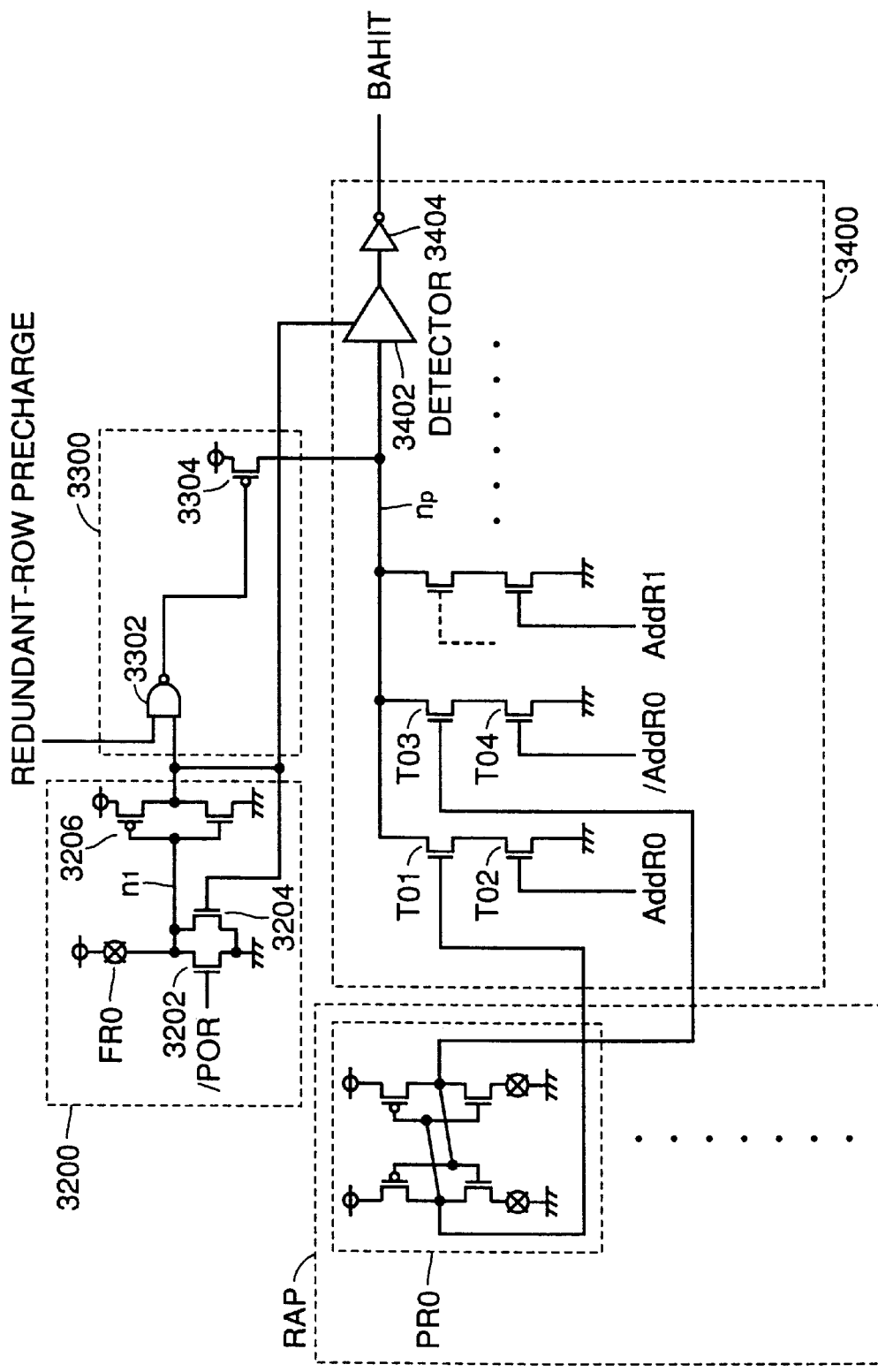
FIG. 27 is a circuit diagram for illustrating a configuration of RAP and RAC portions in redundancy determination portion 3010.

FIG. 27 is a circuit diagram for illustrating a configuration of the RAP portion for programming a row address and the RAC portion for comparing an input row address and a programmed row address in the FIG. 25 redundancy determination portion 3010.

The configuration of the RAP and RAG portions is basically similar to that of the BAP and BAC portions shown in FIG. 26, except that programmed and compared addresses are row addresses and that a programmed address is not output to column bank match determination circuit 3110. Thus the identical portions are denoted by the same reference characters and the description thereof will not be repeated.

Figure 28:
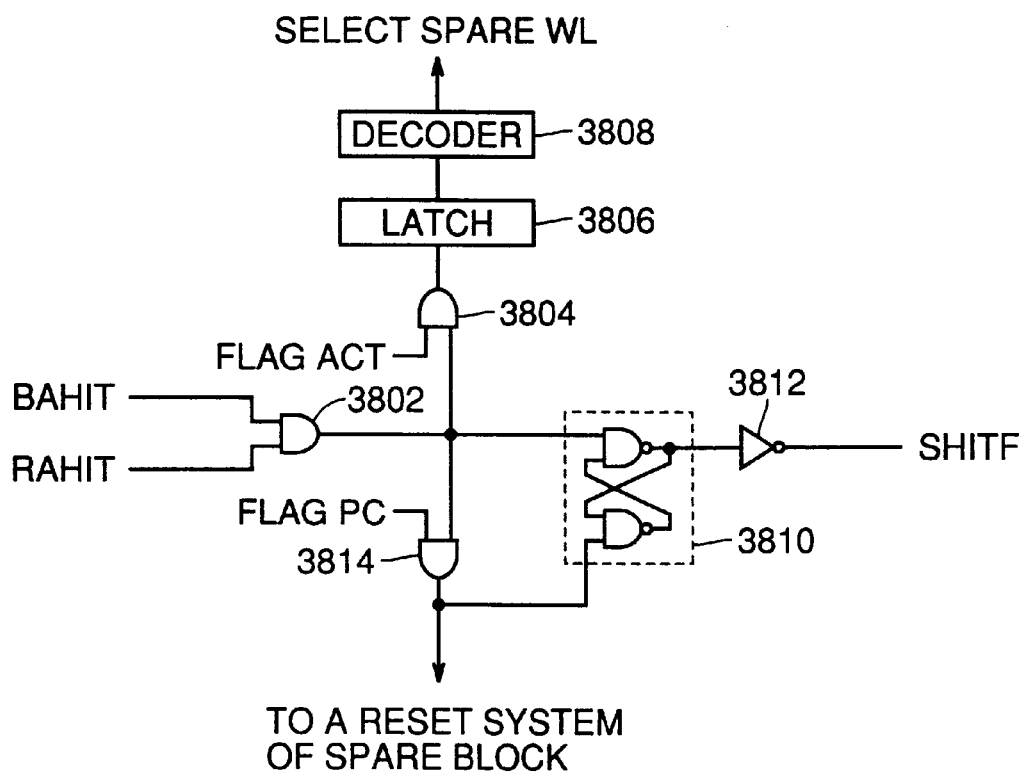
FIG. 28 is a schematic block diagram for illustrating a configuration of an HIG portion in redundancy determination portion 3010.

FIG. 28 is a schematic block diagram showing a configuration of the FIG. 25 HIT portion.

The HIT portion includes an AND circuit 3802 receiving bank hit signal BAHIT indicating that an input bank address signal matches a programmed bank address signal and a row hit signal RAHIT indicating that an input row address signal matches a programmed row address signal, and AND circuit 3804 receiving an output from AND circuit 3802 and a flag ACT activated by a command ACT.

An output level of AND circuit 3804 is transmitted to a latch circuit 3806, and in response to an output from latch circuit 3806 a decoder 3808 performs operation to select a spare word line.

The HIT portion also includes a flip-flop circuit 3810 set in response to the output from AND circuit 3802, an inverter 3812 inverting an output of flip-flop circuit 3810 to output a spare match flag SHITF, and an AND circuit 3814 receiving the output from AND circuit 3802 and a flag PC activated in response to a precharge command to output a signal instructing spare-block resetting operation.

The output level of flip-flop circuit 3810 is reset in response to the output from AND circuit 3814.

Figure 29:
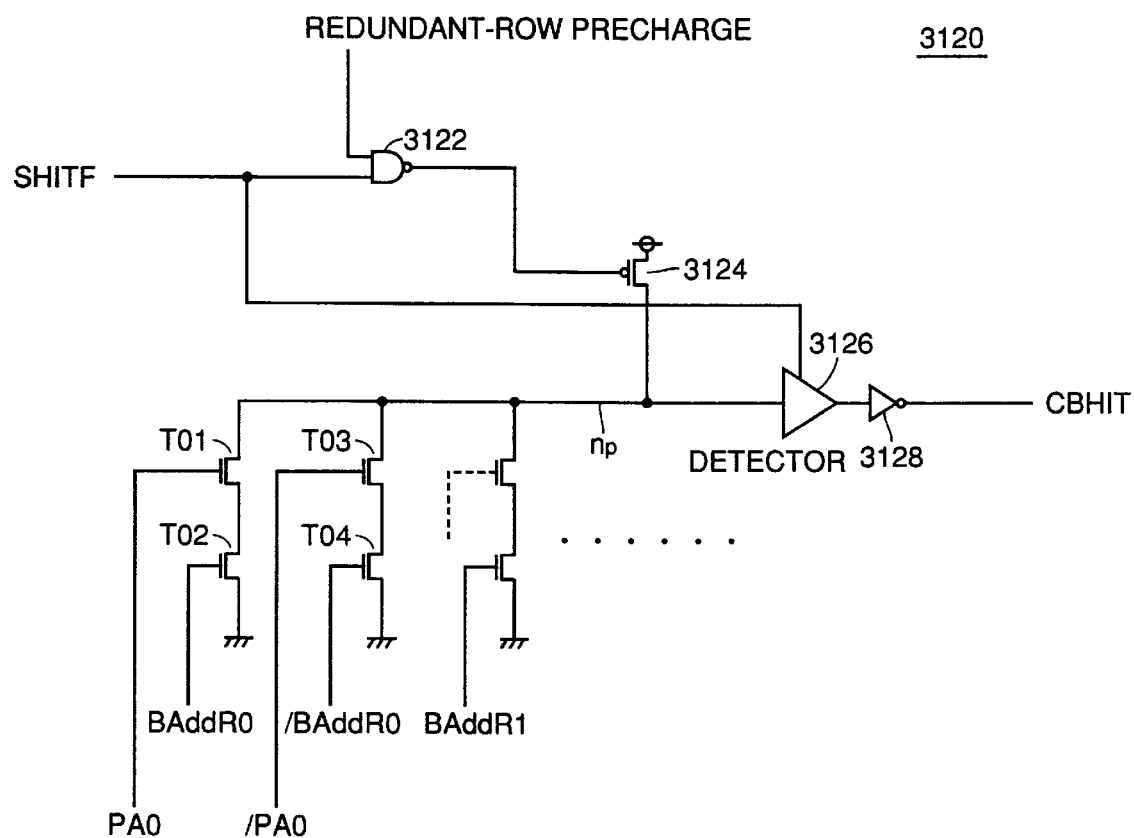
FIG. 29 is a first circuit diagram for illustrating a configuration of a column bank match determination circuit 3110.

FIG. 29 is a circuit diagram for illustrating a configuration of comparison circuit 3120 of the FIG. 25 column bank match determination circuit 3110.

Comparison circuit 3120 determines whether a bank address designated when a column address is input matches a bank address stored in program devices PR0 to PRn in the BAP portion.

More specifically, comparison circuit 3120 includes an NAND circuit 3122 receiving a redundant-row precharge signal and signal SHITF, and a p-channel transistor 3124 having a gate potential controlled by an output from NAND circuit 3122 to charge node np.

Comparison circuit 3120 also includes transistors T01 and T02 provided in series between node np and ground potential GND. The transistor T01 gate receives output PA0 from program device PR0 and the transistor T02 gate receives internal bank address signal BAddR0 when a column address is input.

Comparison circuit 3120 also includes transistors T03 and T04 provided in series between node np and ground potential GND. The transistor T03 gate receives output /PA0 from program device PR0, and the transistor T04 gate receives internal bank address signal/BAddR0 when a column address is input.

Other programming devices PR1 to PRn are each provided with a similar configuration between input node np and ground potential GND.

Comparison circuit 3120 also includes a detector 3126 activated in response to a level of a signal output from inverter 3206 and receiving the internal node np level as an input, and an inverter 3128 receiving and inverting an output from detector 3126 and outputting a column bank hit signal CBHIT.

Figure 30:
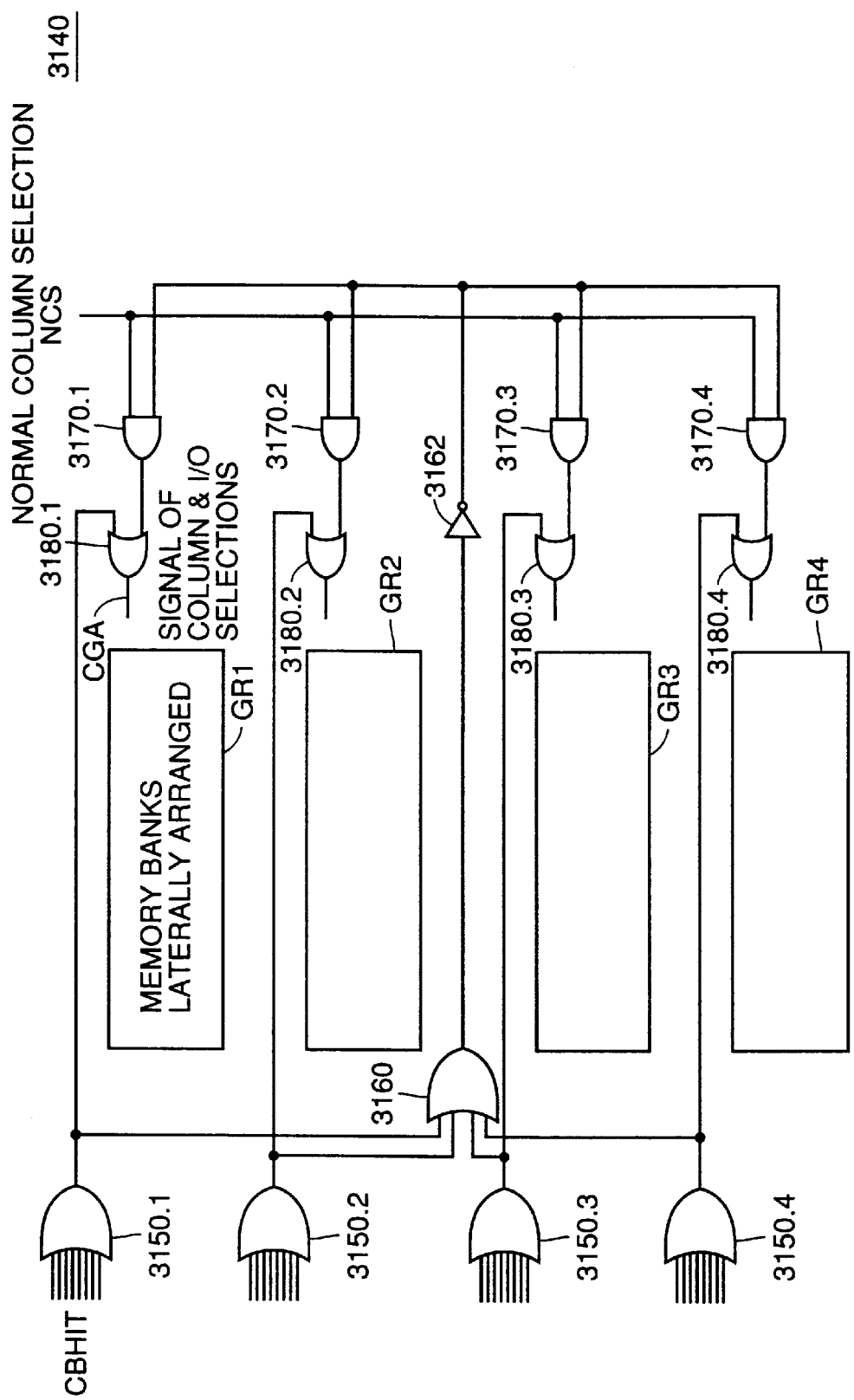
FIG. 30 is a second circuit diagram for illustrating a configuration of column bank match determination circuit 3110.

FIG. 30 is a schematic block diagram for illustrating a configuration of a selection indicating circuit 3140 responsive to a comparison result from comparison circuit 3120 for indicating in which one of four groups, each including four banks laterally arranged, of the 4×4 banks shown in FIG. 25 column select operation and IO switch 3100 operation are to be performed.

Referring to FIG. 30, selection indicating circuit 3140 includes OR circuits 3150.1 to 3150.4 respectively provided for groups GR1 to GR4 each formed from four banks arranged laterally in FIG. 25, each OR circuit 1receiving eight signals CBHITs in the associated, two spare blocks.

For example, OR circuit 3150.1 receives as an input eight signals CBHITs corresponding to spare blocks SB1A and SB1B (corresponding to eight spare rows.)

Selection indicating circuit 3140 includes a four-input OR circuit 3160 receiving outputs from OR circuits 3150.1 to 3150.4, an inverter 3162 inverting an output from OR circuit 3160, AND circuits 3170.1 to 3170.4 each receiving at one input node a signal NCS indicative of normal column select operation and at the other input node an output from inverter 3162, and OR circuits 3180.1 to 3180.4 receiving the outputs from OR circuits 3150.1 to 3150.4, respectively, at one input node and the output from inverter 3162 at the other input node to output a signal CGA instructing their respective groups GR1 to GR4 to select a column and also instructing associated 10 switch 3100 to perform I/O line pair select operation.

If an address signal does not HIT any spare addresses, column selection according to a normal column address is activated. If an address signal hits any spare address, selection is activated according to a spare column address.

With the configuration described above, one of spare blocks SB1A to SB4B can be substituted for any defective memory cell row or column in any of the banks arranged in four rows by four columns so as to enhance conversion efficiency.

Figure 31:
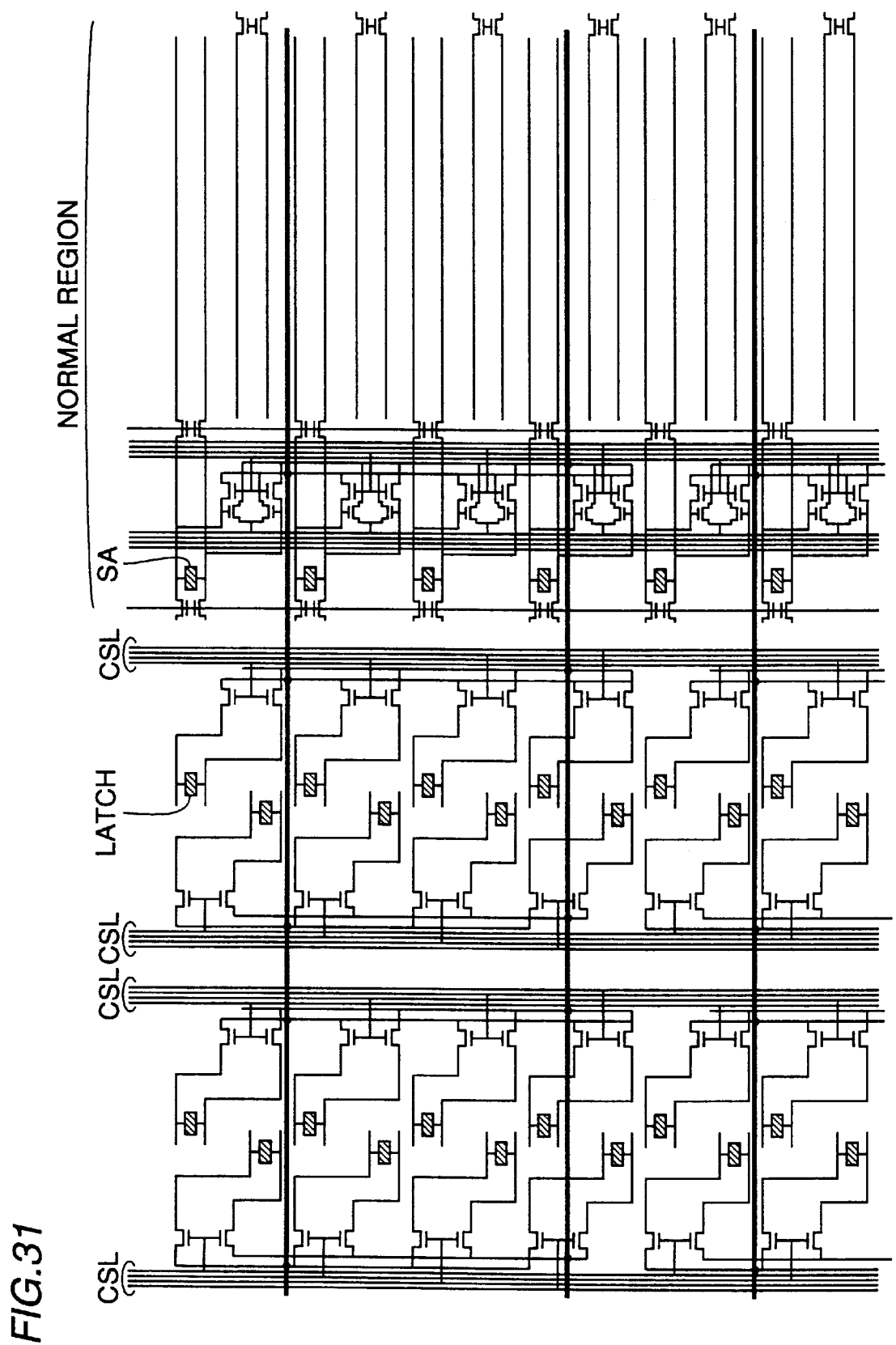
FIG. 31 is a schematic block diagram for illustrating a configuration of a redundant row.

FIG. 31 is a schematic block diagram showing another example of the redundant configuration provided in a unit of a memory cell array. In the FIG. 31 configuration, a latch circuit is provided as a redundant element at an end of the unit of the memory cell array. A bank address and a row address are compared to each other at a redundancy comparison and determination portion. When the addresses match, the latch circuit is accessed. The redundancy determination operation may be provided in parallel with an access operation to a memory cell in a normal region, as has been described above, so that access time can be shorter than when a redundancy-determination result is obtained before starting an access operation to a memory cell in a normal region.

In the FIG. 31 configuration, the latch circuit holding data eliminates the necessity of activating a word line in access.

In both of read and write operations, when a programmed address and an input address match, corresponding column select signal CSL activated allows data to be read and written.

Configuring a redundant circuit from a latch circuit such as a sense amplifier is dissimilar to configuring a DRAM from memory cells, eliminating the necessity of word line activation. Thus, access operation may simply be performed for the regular memory cell region at row access time, whether a location accessed is normal or defective. In other words, redundancy determination operation is not required at row access time, so that row access time can be reduced.

Furthermore, determining at column access time whether a regular bank (or memory cell mat) is to be accessed or a redundant portion configured from a latch circuit is to be accessed only requires determining a bank address of a defective address or a mat address. Thus, access time is not increased.

The redundant portion configured from a latch circuit can also be used for different purposes other than defect substitution.

For example, the redundant portion can be used as a register for temporarily saving data, a temporary saving register in refresh operation, and the like. The address of data temporarily saved can be programmed in a redundancy determination portion and an accessed address and the programmed address can be compared to each other, as in the redundancy determination, so that when the both addresses match, the temporarily saved data may be accessed.

Figure 32:
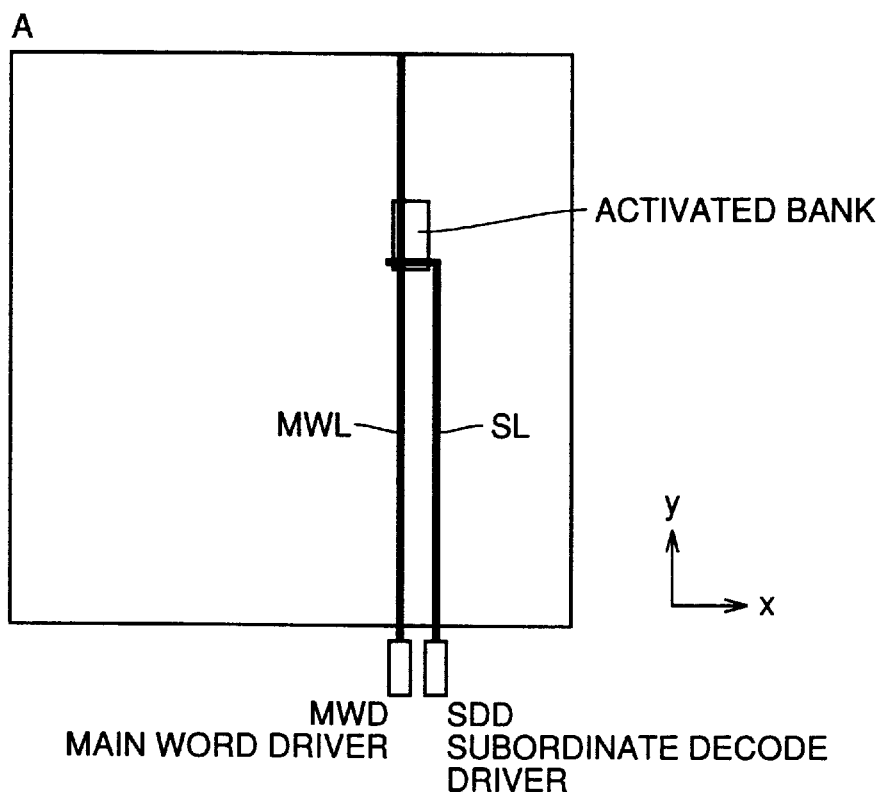
FIGS. 32 and 33 are first and second schematic block diagrams for illustrating configurations of a word line drive circuit, respectively.
Figure 33:
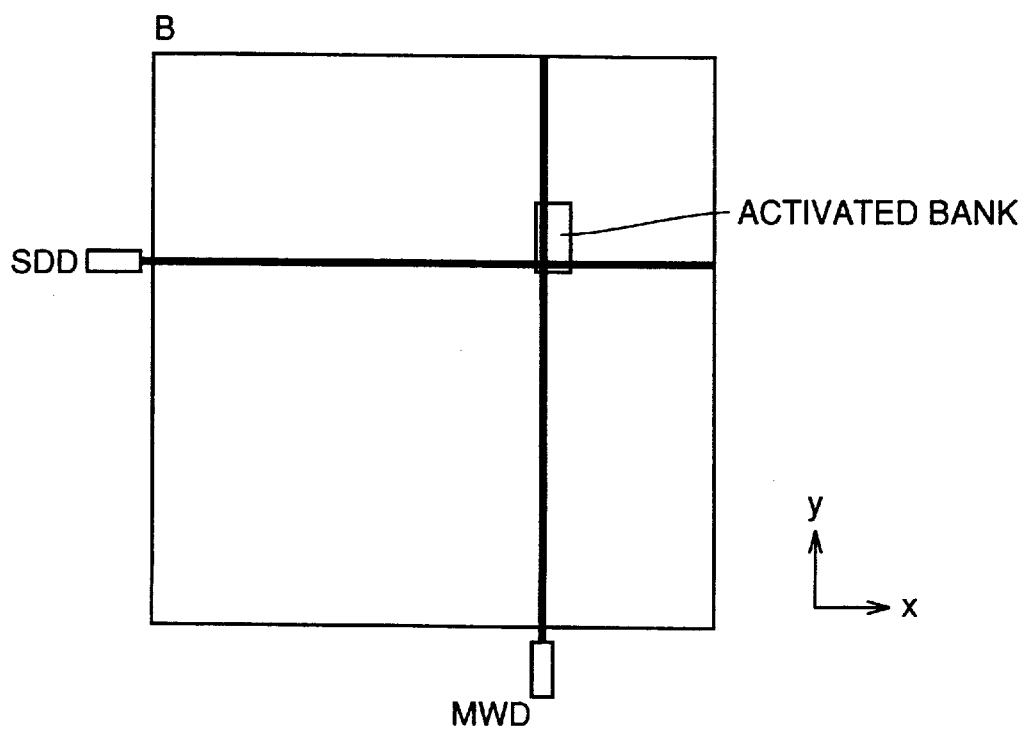

Configuration of Word Line Select Circuit and Column Select Circuit for Multibank FIGS. 32 and 33 are schematic block diagrams for illustrating arranging a main word driver and subordinate decode driver for selecting a word line when banks are arranged in rows and columns.

It should be noted that a subordinate decode driver corresponds to a driver circuit for driving select line SL in the FIGS. 2 and 3.

In FIG. 32, main word driver MWD and subordinate decode driver SDD are arranged in the x direction while a main word line and select line SL extend in the y direction to transmit a signal to an activated bank.

In FIG. 33, a main word driver is arranged along a line extending in the x direction while a subordinate decode driver is arranged along a side extending in the y direction.

In both FIGS. 32 and 33 configurations, functionally a bank is selected depending on a logical product of main word line MWL and select line SL. It should be noted, however, that which wiring layer's metal wiring configures a signal line for memory selection is determined based on selection speed depending on wiring delay. Since the top-layer's metal wiring does not necessarily have minimum signal delay, the metal wiring layers used to implement a wiring for transmitting a word line select signal, a wiring for transmitting a column select signal, and a data line are determined depending on the configuration, design rule process conditions and the like of the device of interest.

FIGS. 34–38 are schematic block diagrams for illustrating arranging a column select line driver circuit CSD and column decode circuit CDD when banks are arranged in rows and columns.

Figure 34:
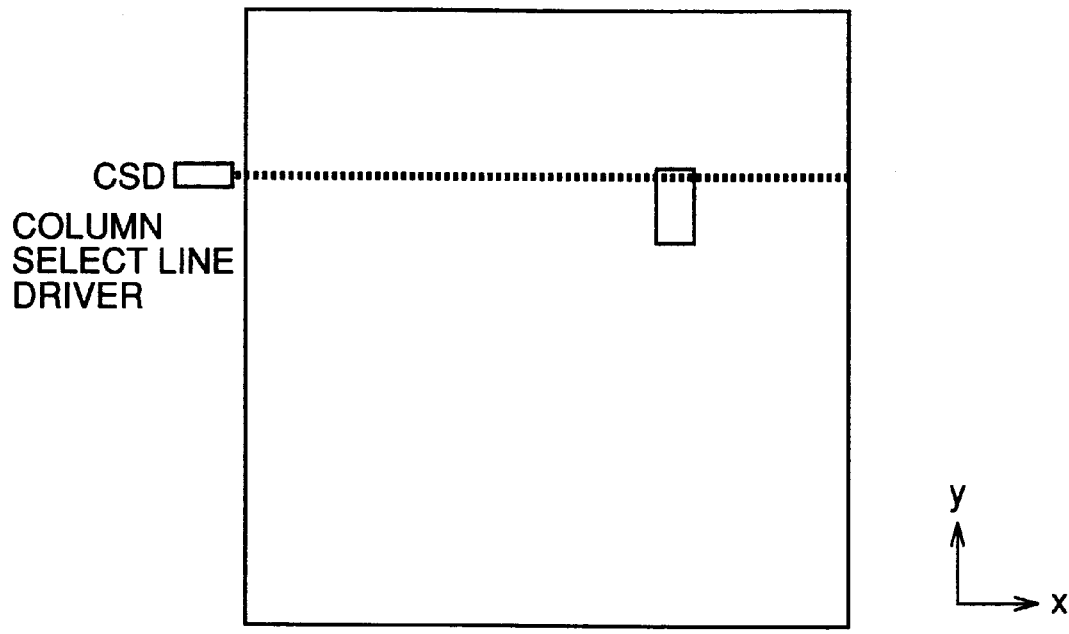
FIGS. 34 to 38 are first to fifth schematic block diagrams, respectively, for illustrating configurations of a column select circuit.

In FIG. 34, a column select line extends in the x direction and a plurality of banks arranged in the x direction receive a signal from column select line driver CSD in common.

Thus, to provide simultaneous, multiple data outputs from a plurality of banks in the FIG. 34 configuration, it is necessary to activate a plurality of column select line drivers to simultaneously activate a plurality of banks arranged in the x direction.

When a plurality of banks are arranged in the direction of a column select line with the column select line shared by a plurality of banks, a column selection is provided in the plurality of banks simultaneously. Thus, simultaneous output of multiple data requires contriving I/O line arrangement or using a select gate connecting an I/O line and a bit line pair together depending on a logical product of a bank select signal and a column select signal to prevent collision of data.

Figure 35:
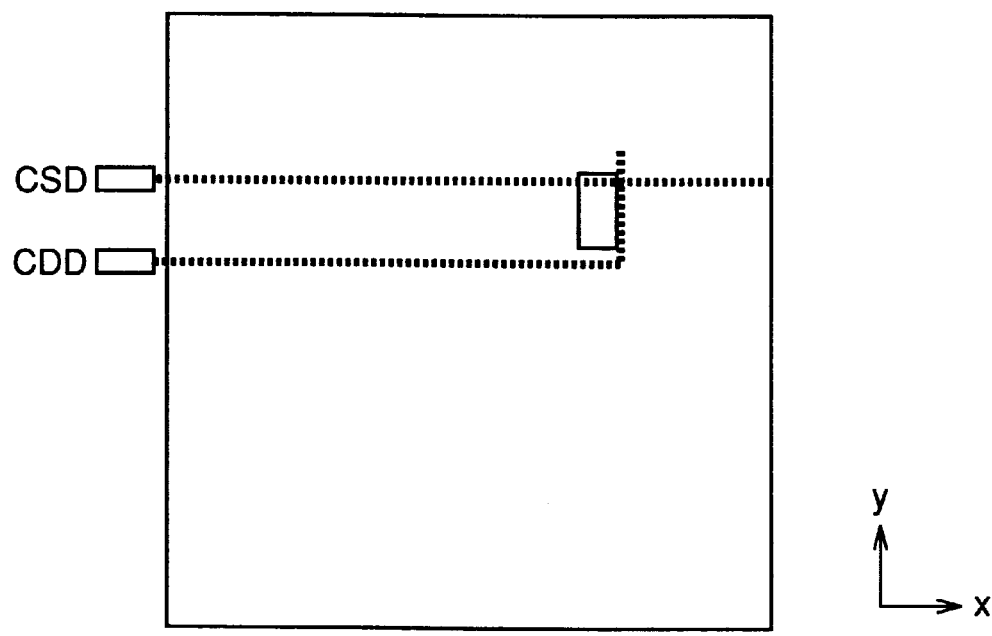

The FIG. 35 configuration is basically similar to the FIG. 34 configuration, although each bank is selected in response to a signal output from a column decode driver to individually select from a plurality of banks arranged in the x direction.

Figure 36:
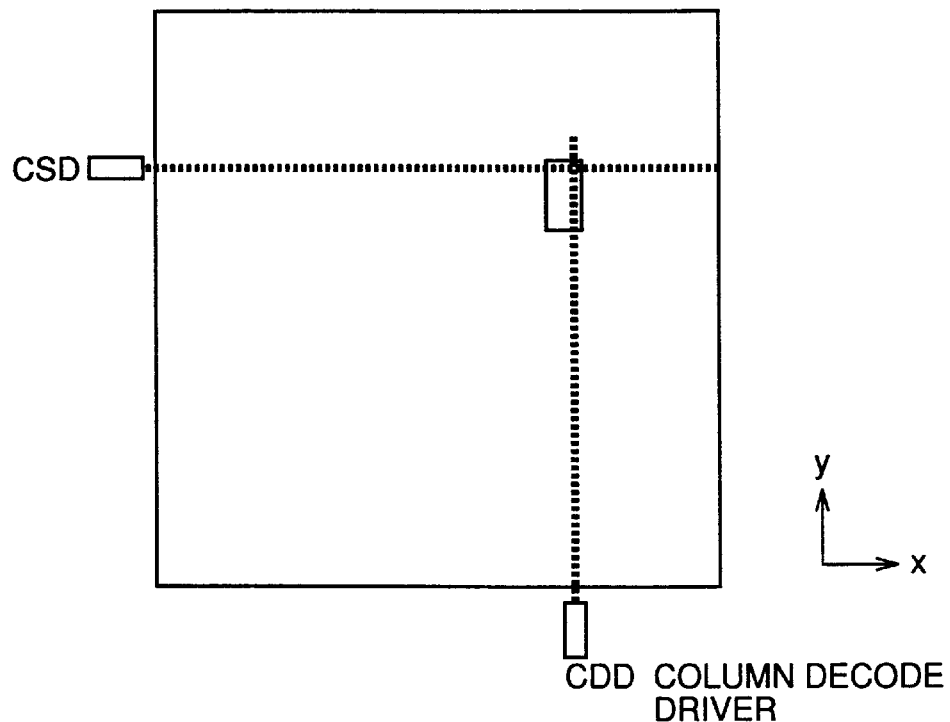

In the FIG. 36 configuration, a column decode driver is arranged along a side in the x direction in the FIG. 35 configuration.

Figure 37:
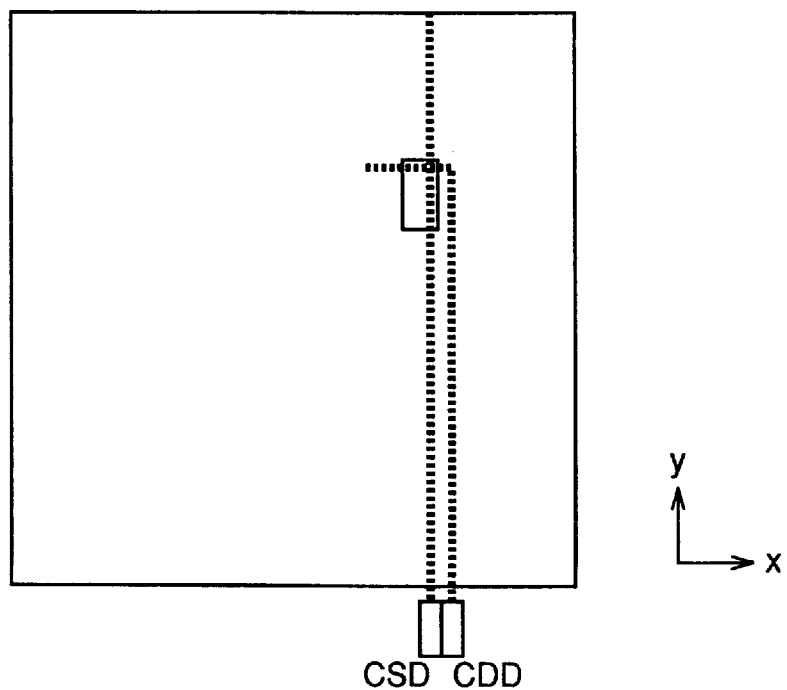
Figure 38:
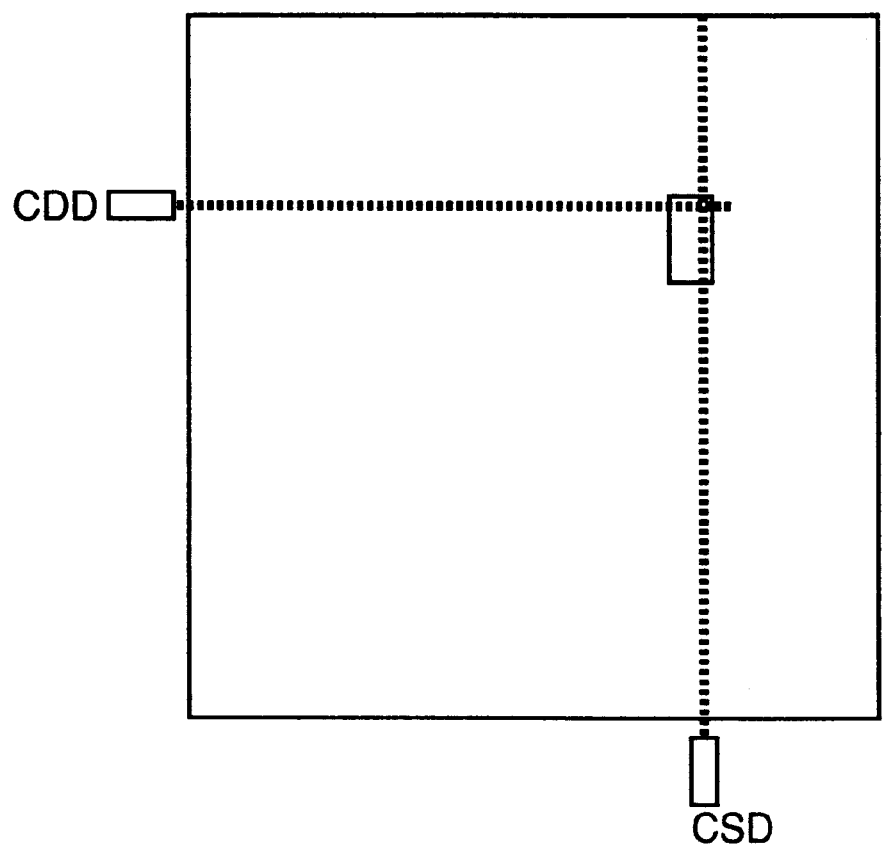

In FIG. 37, column select line driver CSD and column decode driver CDD are both arranged along a line in the X direction. In FIG. 38, a column select line driver is arranged along a side in the x direction and a column decode driver along a side in the y direction.

Figure 39:
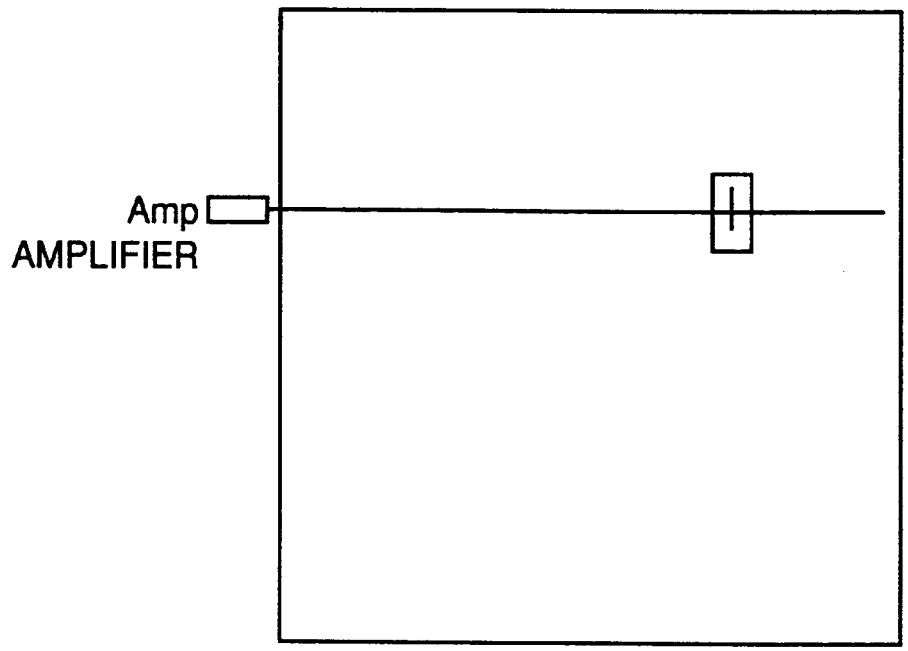
FIGS. 39 to 42 are first to fourth schematic block diagrams, respectively, for illustrating data line arrangements.

FIGS. 39–2 are schematic block diagrams for illustrating various arrangements of a data line in a memory cell array having bank arranged in rows and columns.

In the FIG. 39 configuration, an I/O line is shared by a relatively short sense amplifier band within a single bank. With this configuration, data is output in a direction orthogonal to a word line. The arrangement of an I/O line for each relatively short unit allows multiple data to be output simultaneously.

In the FIG. 39 configuration, a data line is arranged in the x direction.

Figure 40:
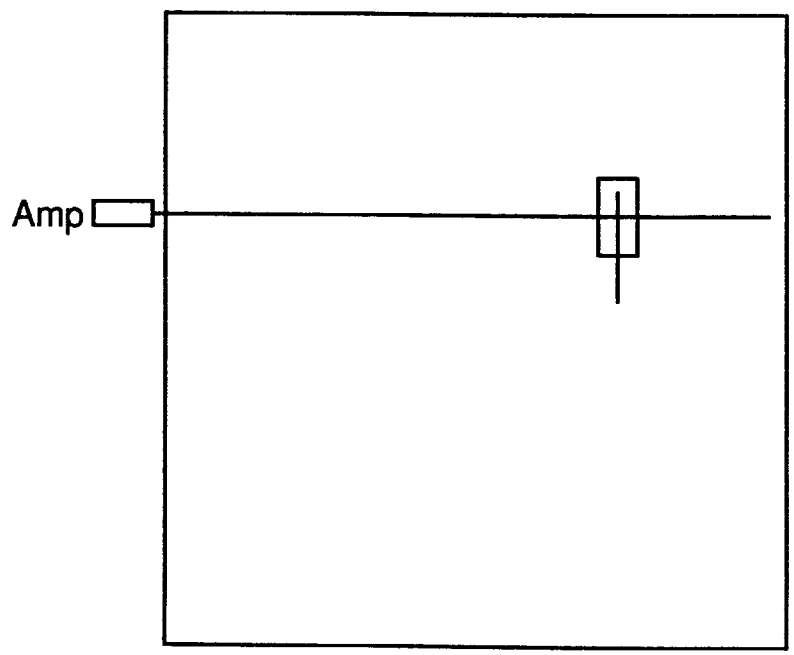

In the FIG. 40 configuration, a data line is arranged in the x direction, as shown in FIG. 39, and the data is also shared by two banks adjacent mutually in the y direction.

Figure 41:
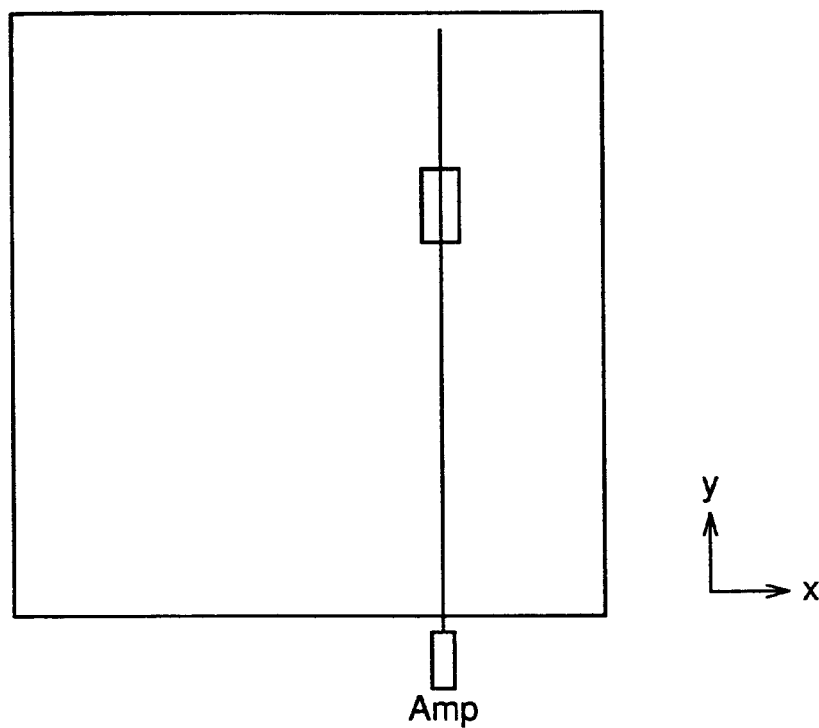

In the FIG. 41 configuration, a data line is arranged in the y direction. That is, an I/O line is arranged in the direction of a word line for each sense amplifier band.

Figure 42:
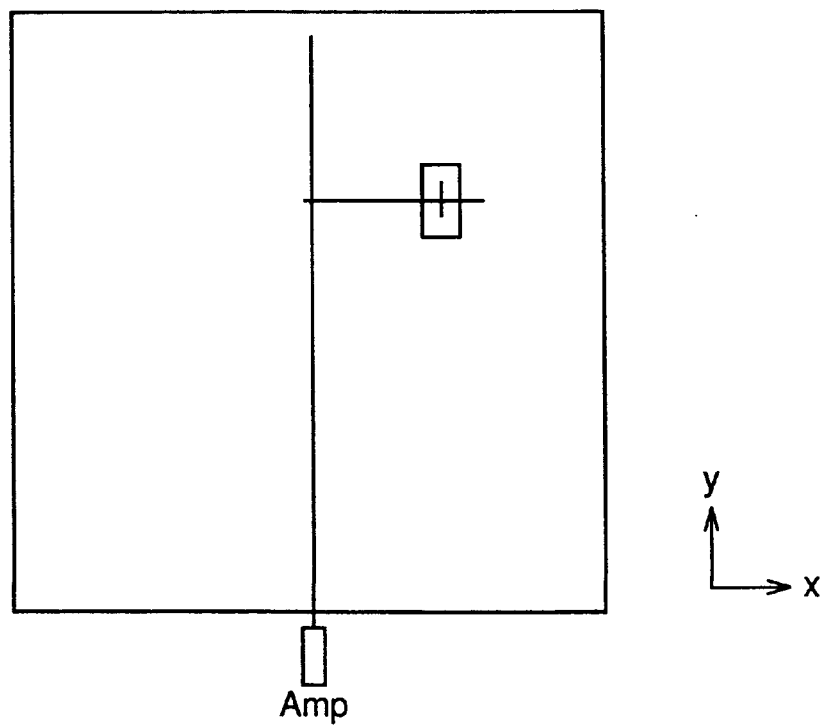

In the FIG. 42 configuration, an I/O line pair is shared by a relatively short sense amplifier band, as is similar to FIG. 39, before data is transmitted in a direction orthogonal to a word line (i.e. in the x direction) on a second I/O line and then also in the direction of the word line (i.e. in the y direction).

Hereinafter, exemplary wiring arrangements capable of reading multibit data simultaneously will now be described based on combinations of the arrangements of a word line select circuit, a column select line and a data line as described above.

FIGS. 43–60 are conceptual views each showing a combination of an arrangement of a word line select circuit, that of a column select line and that of a data line.

Figure 43:
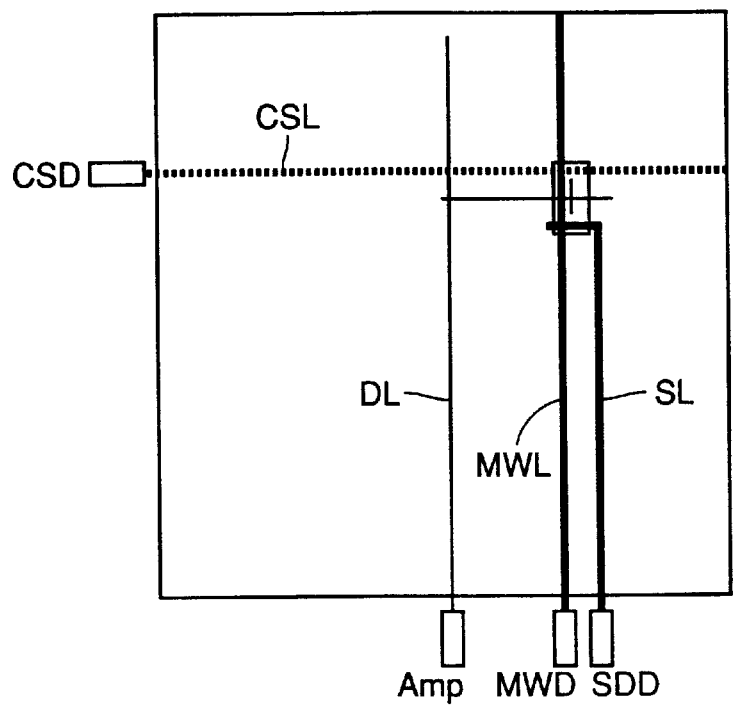
FIGS. 43 to 60 are schematic block diagrams for illustrating first to eighteenth examples, respectively, of a row-selection-related circuit, a column-selection-related circuit and a data-input/output-related circuit when banks are arranged in rows and columns.

In the FIG. 43 example, main word line MWL, select line SL and a data line are arranged in the y direction and column select line CSL in the x direction. The configuration of the data line is similar to that shown in FIG. 42.

This configuration requires data line DL to be independent between sense amplifiers to avoid data collision between banks in the direction of column select line CSL.

In this example, multibit data output is provided for by increasing the number of column select lines CSLs.

Figure 44:
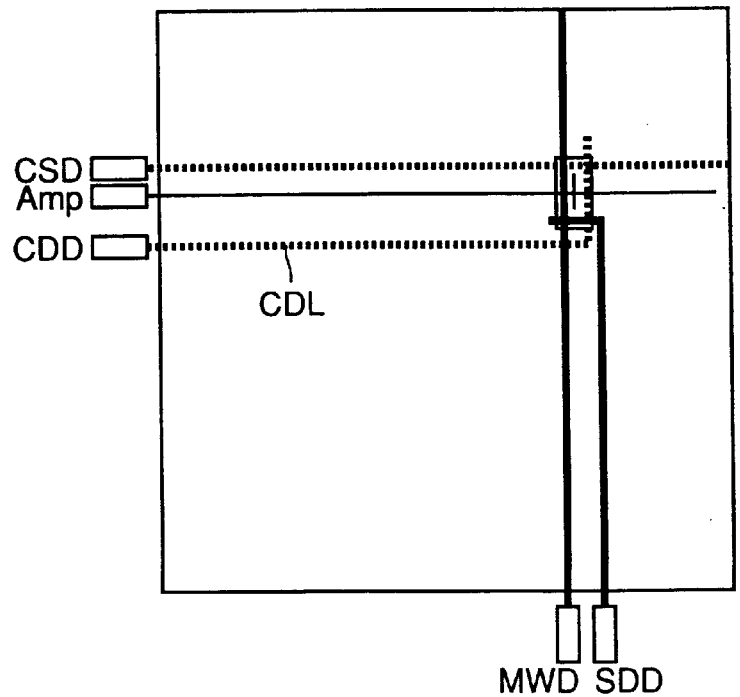

In FIG. 44, column decode line CDL allows banks arranged in the x direction to be individually selected to prevent such data collision between banks as described in FIG. 43. Data line DL is arranged in the x direction.

Figure 45:
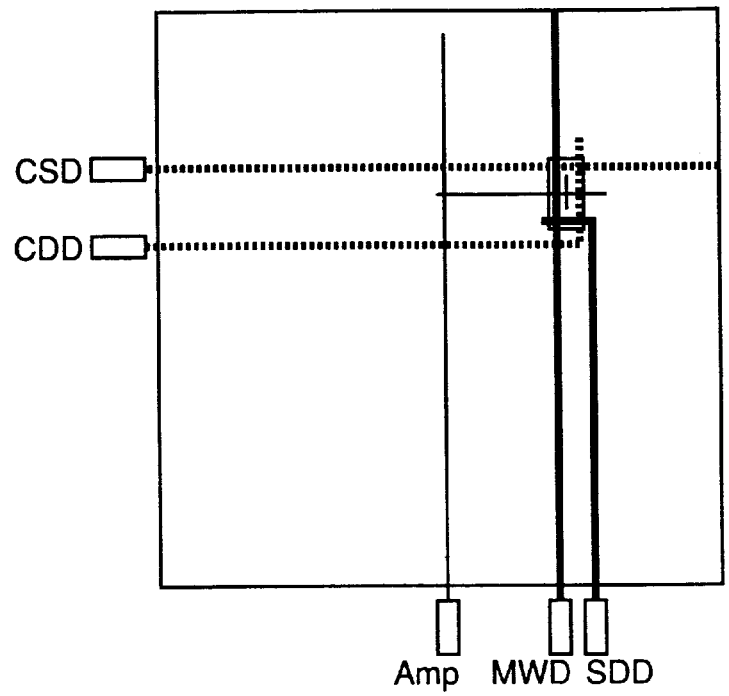

In the FIG. 45 example, column select line CSL and column decode line CDL are arranged in the x direction, and main word line MWL, select line SL and data line DL are arranged in the y direction.

In this example, as is similar to FIG. 43, the number of column select lines CSLs should be increased to output multibit data.

Figure 46:
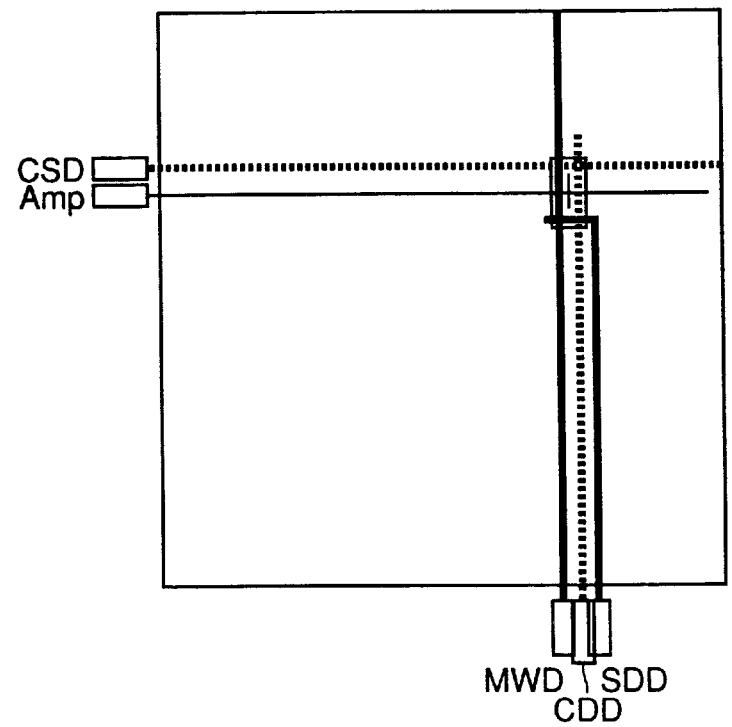

In the FIG. 46 configuration, column select line CSL and data line DL are arranged in the x direction and main word line MWL, select line SL and column decode line CDL are arranged in the y direction.

Figure 47:
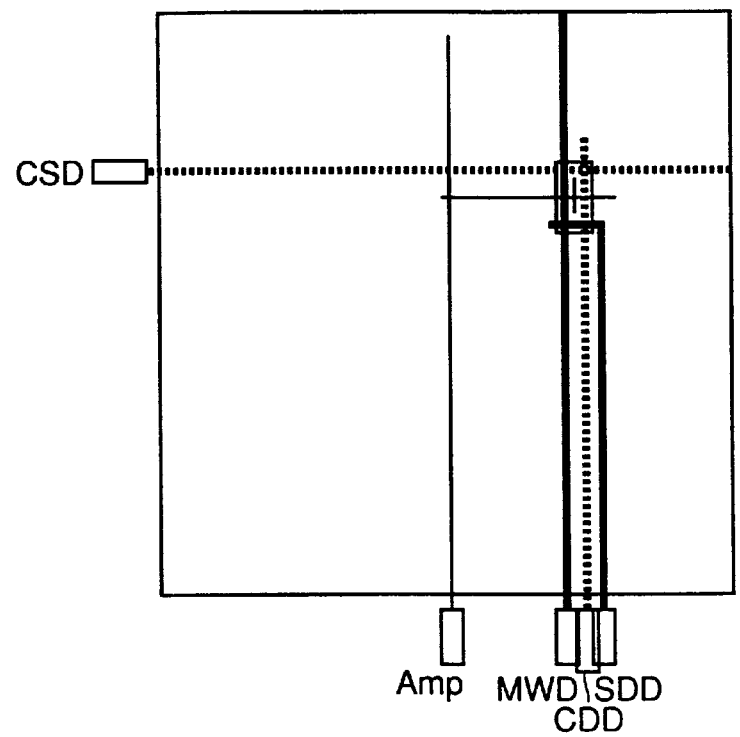

In the FIG. 47 example, column select line CSL is arranged in the x direction while main word line MWL, select line SL and column decode line CDL, and data line DL are arranged in the y direction.

Figure 48:
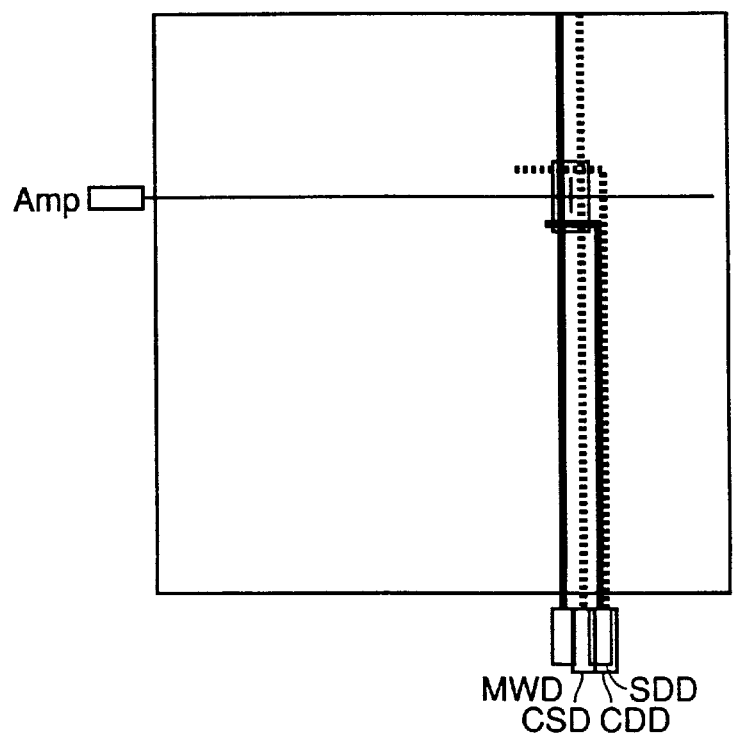

In the FIG. 48 configuration, a data line is arranged in the x direction, while main word line MWL, select line SL, column select line CSL and column decode line CDL are arranged in the y direction.

With this configuration, banks adjacent mutually in the y direction can be simultaneously selected to facilitate outputting multibit data.

Figure 49:
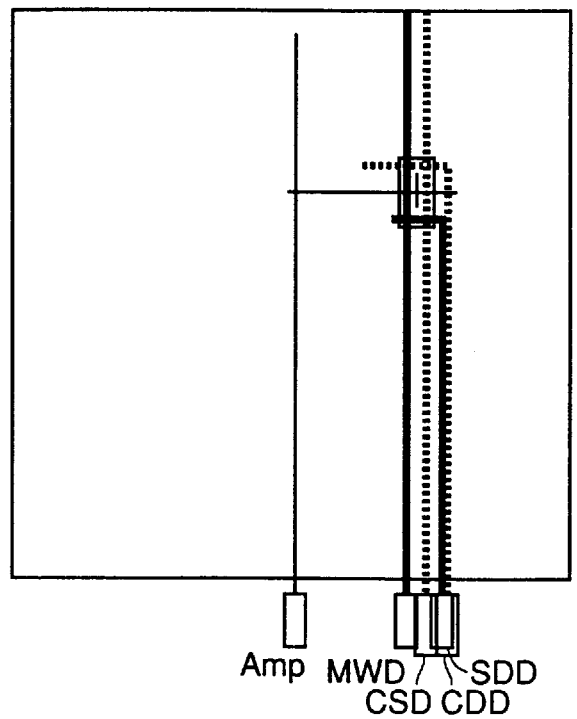

In the FIG. 49 configuration, main word line MWL, select line SL, column select line CSL and column decode line CDL, and data line DL are arranged in the y direction.

In this configuration, outputting multibit data requires the data line to be independent for each sense amplifier band unit.

With this configuration, all control signals and data can be advantageously input from a single direction to facilitate connection to peripheral circuitry.

Figure 50:
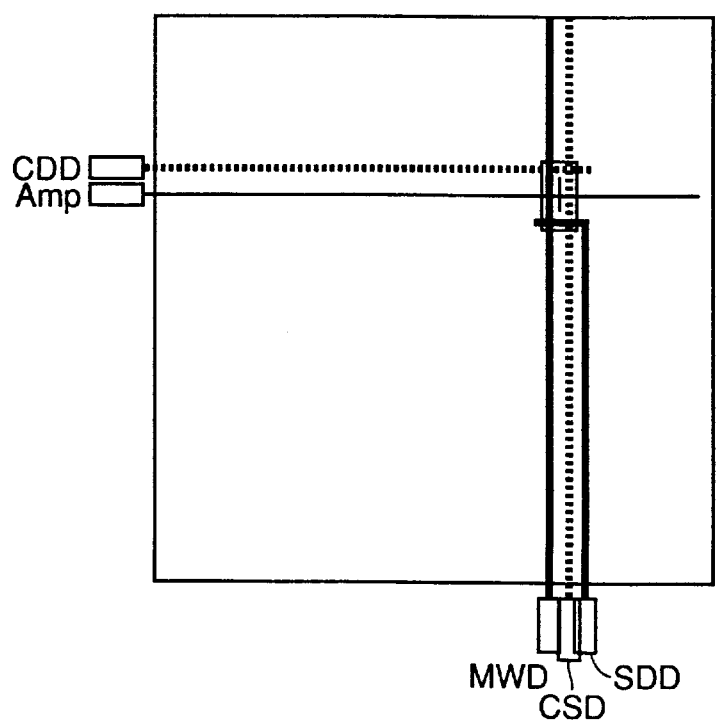

In the FIG. 50 configuration, main word line MWL, select line SL and column select line CSL are arranged in the y direction, and column decode line CDL and data line DL in the x direction.

This configuration is suitable for outputting multibit data, since data can readily be read simultaneously from a plurality of bank adjacent mutually in the y direction.

Figure 51:
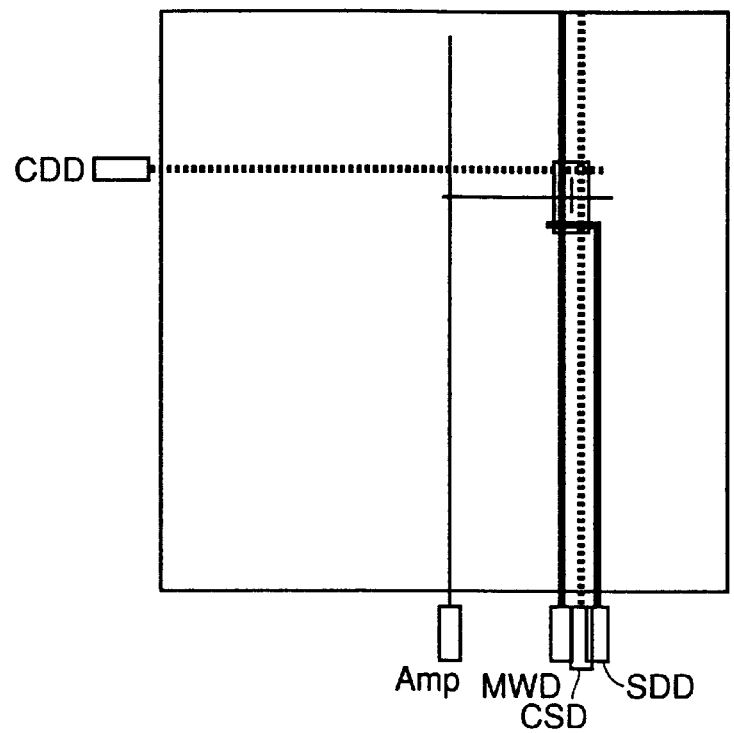

In the FIG. 51 configuration, only column decode line CDL is arranged in the x direction and the other lines in the y direction.

Figure 52:
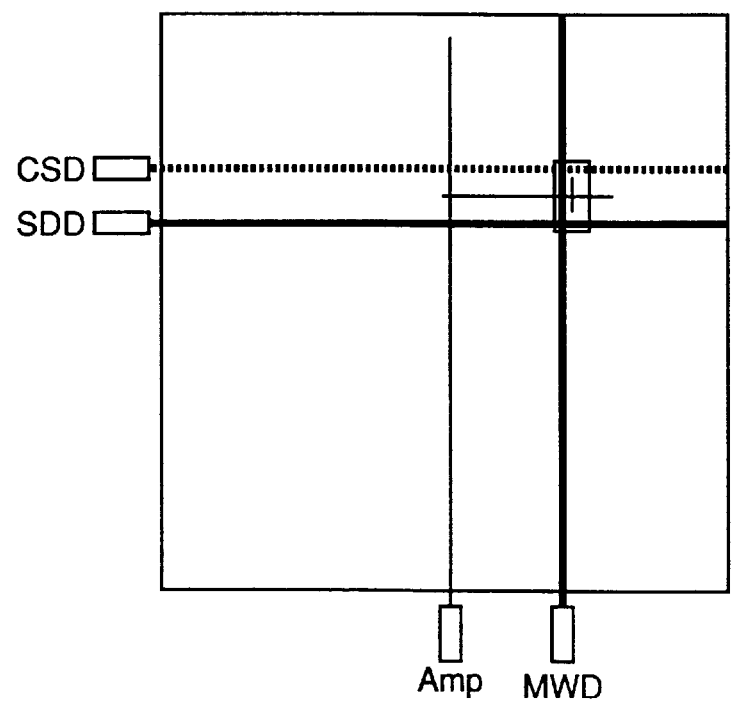

In FIG. 52, main word line MWL and data line DL are arranged in the y direction, and column select line CSL and select line SL in the x direction.

Figure 53:
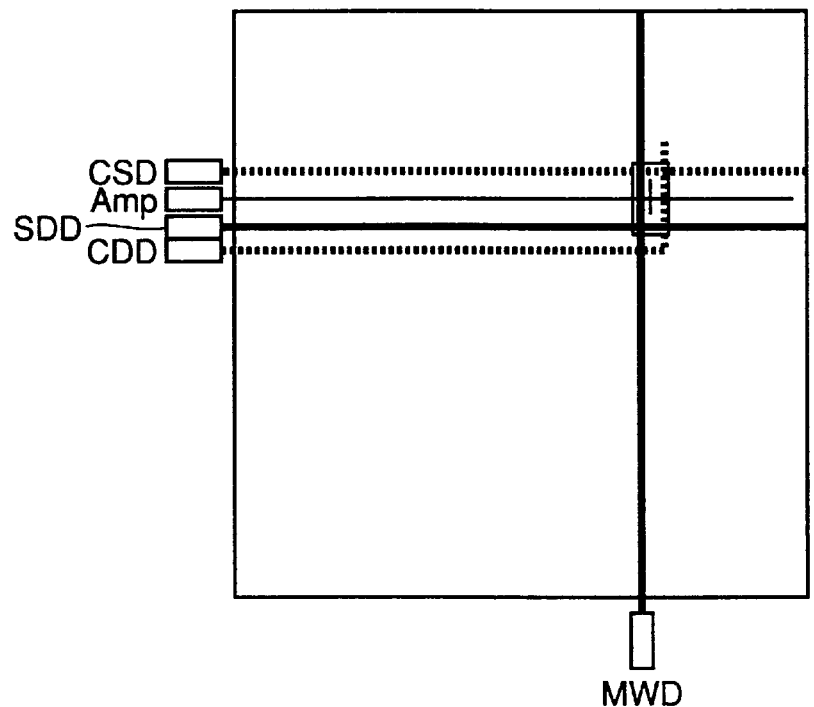
Figure 54:
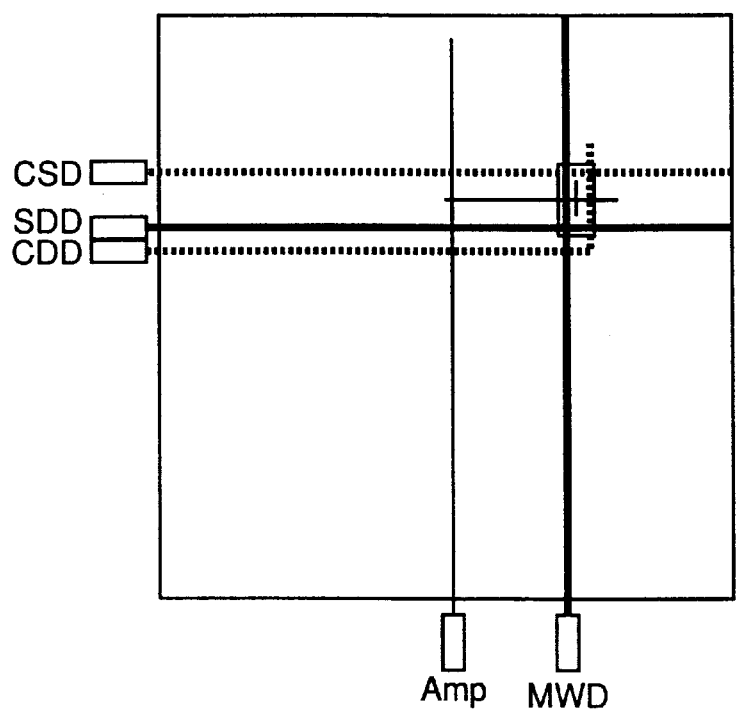

In the FIG. 53 configuration, only main word line MWL is arranged in the y direction, and select line SL, column select line CSL, column decode line CDL and data line DL in the x direction. In the FIG. 54 configuration, main word line MWL and data line DL are arranged in the y direction, and select line SL, column select line CSL and column decode line CDL in the x direction.

Figure 55:
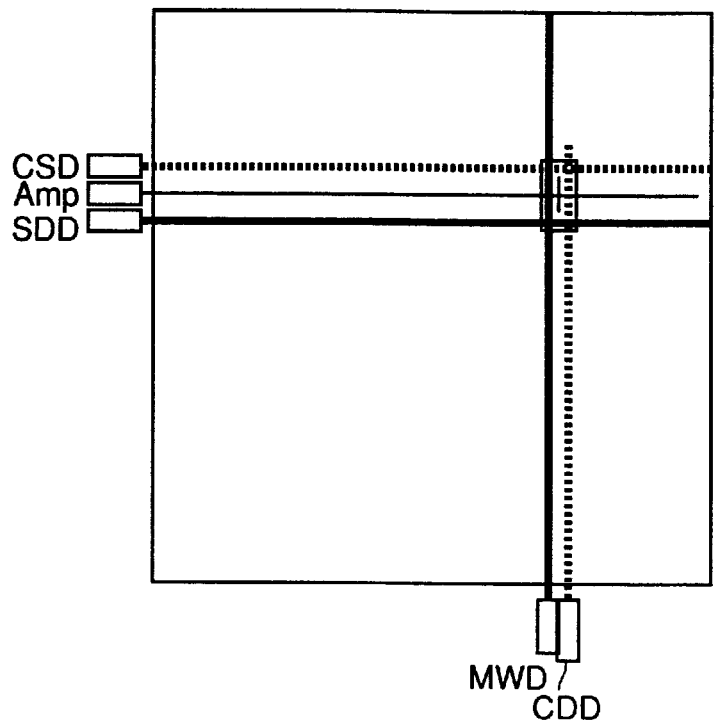

In the FIG. 55 configuration, main word line MWL and column decode line CDL are arranged in the y direction, and column select line CSL, select line SL and data line DL in the x direction.

Figure 56:
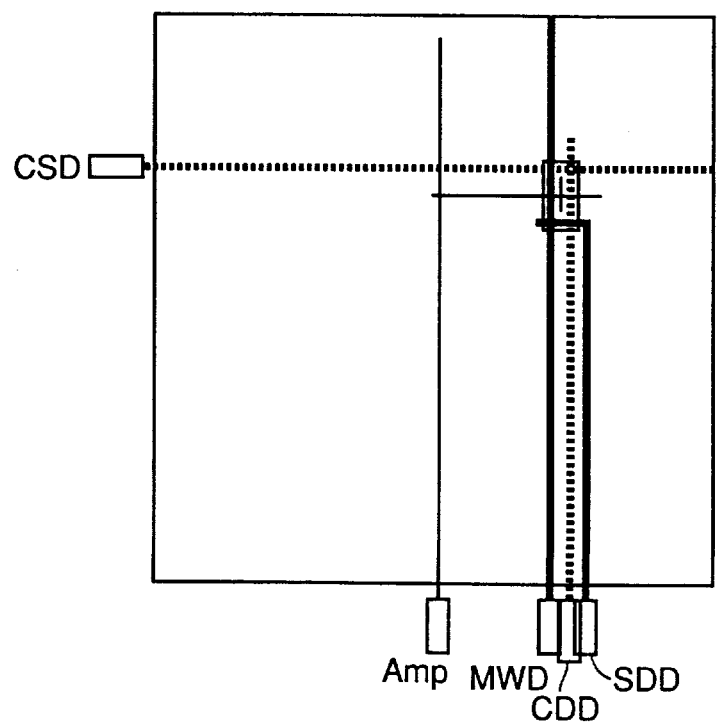

In the FIG. 56 configuration, main word line MWL, select line SL and column decode line CDL, data line DL are arranged in the y direction, and column select line CSL in the x direction.

Figure 57:
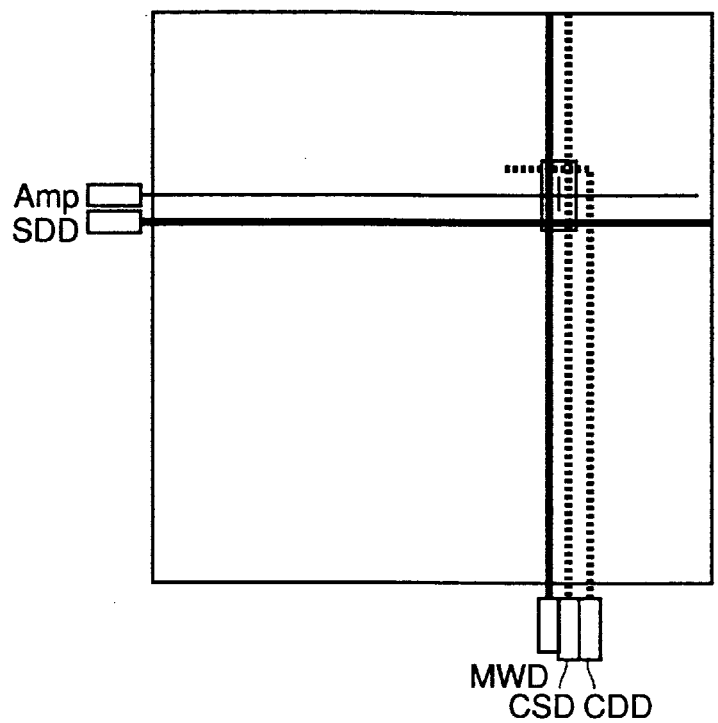

In the FIG. 57 configuration, main word line MWL, column select line CSL and column decode line CDL are arranged in the y direction, and select line SL and data line DL in the x direction.

Figure 58:
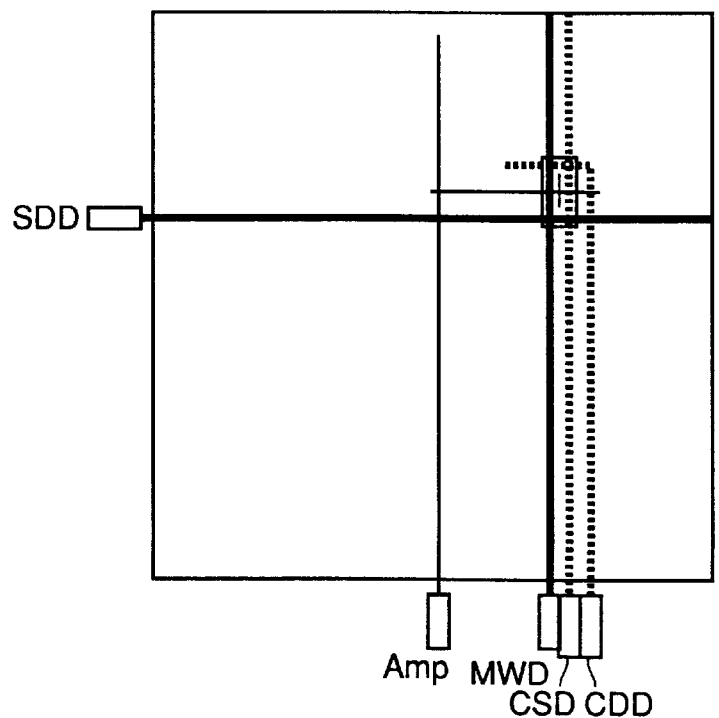

In the FIG. 58 configuration, main word line MWL, column select line CSL, column decode line CDL and data line DL are arranged in the y direction, and only select line SL in the x direction.

Figure 59:
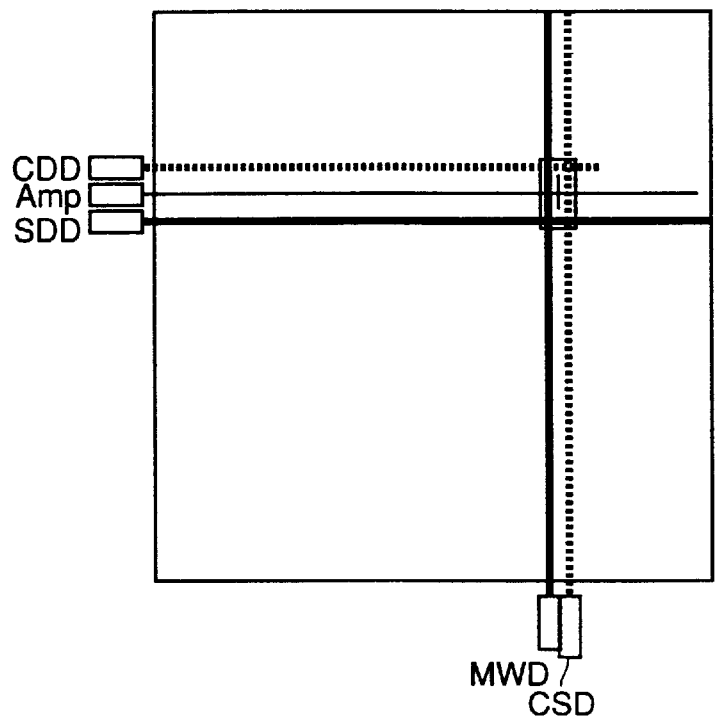

In the FIG. 59 configuration, main word line MWL and column select line CSL are arranged in the y direction, and select line SL, column decode line CDL and data line DL in the x direction.

Figure 60:
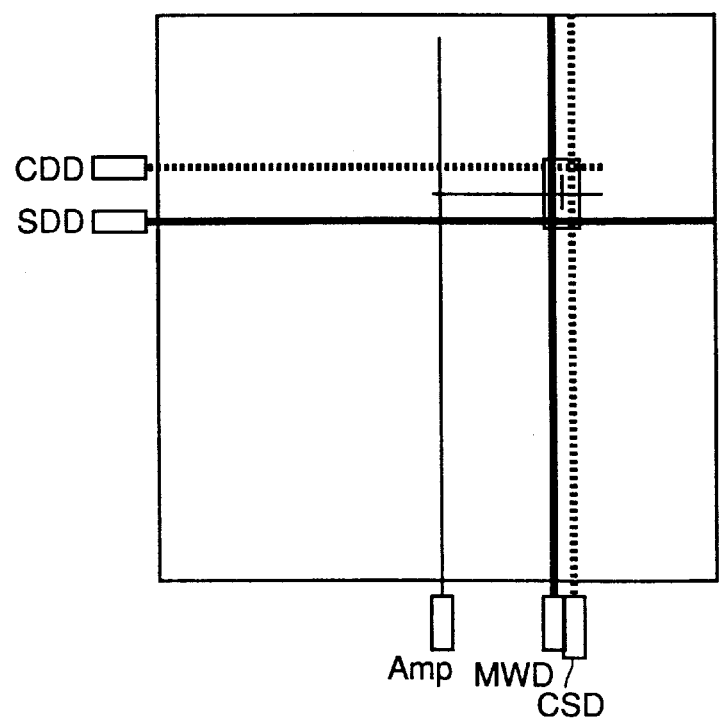

In the FIG. 60 configuration, main word line MWL, column select line CSL and data line DL are arranged in the y direction, and select line SL and column decode line CDL in the x direction.

Any of the signal-line arrangements described above allows multibit data to be output simultaneously.

It should be noted that any particular limitations are imposed on which ones of multi-layered wirings used in any specific configuration of a semiconductor memory device are respectively used as signal lines (MWL, SL, CSL, CDL, DL) required for these accesses. Depending on the process for manufacturing a semiconductor memory device, the resistance (a sheet resistance) per unit length of a wiling layer and the capacitance per unit length of the wiring layer and the wiring length and tolerance in signal delay of the wiring are referred to to allot a signal to the wiring layer.

For example, for a metal wiring layer of four levels with the bottom-level layer of tungsten (W) wire and the upper three layers of copper (Cu)-based metal wire, if the lowest one of the three layers of copper (Cu)-based metal wire has a small wiring thickness and a resistance value set higher than those of the other two layers, the wires of the lower two of the four layers are higher in resistance than those of the upper two layers. Thus, the wires of the lower two layers are not suitable for long-distance wiling and thus often applied to relatively short-distance wiring in the FIGS. 32–60 configurations described above.

For example, in the FIG. 39 data line configuration, data in activated bank are initially collected on a short-distance data line and ultimately output to a long-distance data line laid out in a direction orthogonal to the short-distance data line. Thus in this configuration, the portion of the short-distance data line described above may be relatively high in resistance is thus more likely to be implemented using a wiring of a lower layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a memory cell array having a plurality of memory cells arranged in rows and columns, and divided into a plurality of memory cell blocks in rows and columns;
    a plurality of main word lines in a row direction of said memory cell array, shared by a plurality of said memory cell blocks arranged in the row direction;
    a plurality of subordinate word lines corresponding to memory cell rows in said memory cell blocks, having a first plurality of subordinate word lines provided for each said main word line;
    a main row select circuit provided for said memory cell array, selectively activating said main word line in response to an address signal;
    a subordinate row select circuit provided for said memory cell array, indicating a selected subordinate word line of said first plurality of subordinate word lines in response to said address signal;
    a block select circuit indicating a selected memory cell block in response to said address signal;
    a plurality of block select lines activated in response to a selection indication from said block select circuit; and
    a plurality of drive circuits each provided for said subordinate word line, each driving a potential of an associated subordinate word line in response to an indication from said subordinate row select circuit and to activation of an associated said block select line and said main word line, each said drive circuit including
        a first switch circuit transmitting a potential level from said main word line in response to activation of said block select line, and
        a hold circuit activated in response to an output level from said first switch circuit and to an indication from said subordinate row select circuit to hold selection indicating information for said associated subordinate word line and drive a potential of said associated subordinate word line; wherein
            said main row select circuit and said block select circuit reset a level of said main word line and a level of said block select line after said selection indicating information is transmitted to said hold circuit.

2. The semiconductor memory device according to claim 1, wherein each said memory cell block is a bank independently capable of reading and writing data therein.

3. The semiconductor memory device according to claim 2, further comprising a plurality of select lines transmitting the indication from said subordinate row select circuit to said drive circuits, wherein:
    said first switch circuit includes a first MOS transistor provided between said main word line and an information holding node and having a gate potential controlled by said block select line; and
    said hold circuit includes
        a second MOS transistor provided between said select line and said associated subordinate word line and having a gate potential controlled by a potential of said information holding node, and
        a third MOS transistor provided between said associated subordinate word line and said information holding node and having a gate potential controlled by said select line.

4. The semiconductor memory device according to claim 3, wherein with an activation level of said main word line and said block select line corresponding to a first potential level, said select line is boosted to a second potential level after said block select line is reset in level, said second potential level being higher than said first potential level.

5. The semiconductor memory device according to claim 1, further comprising:
    a plurality of bit line pairs corresponding to memory cell columns of said memory cell block;
    a plurality of data line pairs each provided for every second plurality of memory cell columns of said memory cell array, communicating data with a selected memory cell; and
    a plurality of select circuits capable of selective data communication between said data line pair and an associated said second plurality of bit line pairs.

6. The semiconductor memory device according to claim 5, wherein said select circuit includes
    a second plurality of second switch circuits provided for said second plurality of bit line pairs, respectively, selectively rendered conductive, and
    a data transmission gate receiving an output from said second plurality of second switch circuits, responsive to a potential level of a selected bit line pair for driving a potential of an associated said data line pair, said data transmission gate having
        a fourth MOS transistor coupled between one line of said data line pair and a predetermined power supply potential and having a gate potential driven by one line of said selected bit line pair, and
        a fifth MOS transistor coupled between the other line of said data line pair and said predetermined power supply potential and having a gate potential driven by the other line of said selected bit line pair.

7. The semiconductor memory device according to claim 6, further comprising:

a plurality of segment data line pairs coupling said second switch circuits and said data transmission gate together;

a first precharging circuit precharging said segment data line pair to a first precharged level in standby state; and a second precharging circuit precharging said bit line pair to a second precharged level in standby state.

8. The semiconductor memory device according to claim 5, further comprising a redundant memory cell row provided at an end of said memory cell array.

9. The semiconductor memory device according to claim 5, further comprising:

a plurality of redundant memory cell columns provided for said memory cell array;

a plurality of redundant data line pairs provided for redundant memory cell columns, for communicating data with a selected redundant memory cell;

a data bus shared by a plurality of said memory cell blocks, for communicating data with said memory cell block; and a data-transmission switching circuit switching connection between said data line pair and said redundant data line pair, and said data bus depending on whether said redundant memory cell column has substituted for said memory cell column.

* * * * *